(12) United States Patent
Higashi et al.

(10) Patent No.: US 10,254,315 B2
(45) Date of Patent: Apr. 9, 2019

(54) CURRENT SENSOR, CURRENT MEASURING MODULE, AND SMART METER

(71) Applicant: KABUSHIKI KAISHA TOSHIBA, Tokyo (JP)

(72) Inventors: Yoshihiro Higashi, Ishikawa (JP);
Yoshihiko Fuji, Kanagawa (JP);
Hideaki Fukuzawa, Kanagawa (JP);
Tetsuro Wamura, Kanagawa (JP);
Motomichi Shibano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 657 days.

(21) Appl. No.: 14/580,984

(22) Filed: Dec. 23, 2014

(65) Prior Publication Data

US 2015/0177285 A1 Jun. 25, 2015

(30) Foreign Application Priority Data

Dec. 25, 2013 (JP) .................................. 2013-268067

(51) Int. Cl.
*G01R 19/00* (2006.01)
*G01R 33/09* (2006.01)
(Continued)

(52) U.S. Cl.
CPC ......... *G01R 19/0092* (2013.01); *G01R 15/09* (2013.01); *G01R 15/205* (2013.01); *G01R 33/09* (2013.01)

(58) Field of Classification Search
CPC .... G01R 19/0092; G01R 19/00; G01R 15/09; G01R 15/08; G01R 15/205; G01R 15/20;
(Continued)

(56) References Cited

U.S. PATENT DOCUMENTS 8,754,642 B2 6/2014 Ide et al.
8,872,528 B2 10/2014 Itou et al.
(Continued)

FOREIGN PATENT DOCUMENTS

JP H 11-27146 A 1/1999
JP 2004-132790 4/2004
(Continued)

OTHER PUBLICATIONS

English machine translation of Otake et al. JP 4710626.*
(Continued)

*Primary Examiner* — Lee E Rodak
(74) *Attorney, Agent, or Firm* — Finnegan, Henderson, Farabow, Garrett & Dunner, L.L.P.

(57) ABSTRACT

A current sensor comprises: a plurality of magnetoresistance elements whose resistance value changes by application of an current-induced magnetic field from a current-to-be-measured; and a selection circuit that selects one magnetoresistance element from these plurality of magnetoresistance elements and outputs a signal of a selected magnetoresistance element. In the plurality of magnetoresistance elements, relationships between a magnitude of the applied current-induced magnetic field and the resistance value are different from each other.

12 Claims, 36 Drawing Sheets

(51) Int. Cl.
*G01R 15/09* (2006.01)
*G01R 15/20* (2006.01)

(58) Field of Classification Search
CPC .... G01R 33/09; G01R 33/091; G01R 33/093; G01R 33/095; G01R 33/096; G01R 33/098; G01R 33/0011; G01R 33/0005; G01R 17/10; G01R 31/006; G01R 31/3658; G01R 21/08; G01R 22/06; G01R 31/025; G01N 27/9046; G01N 27/16; G01N 27/83; G01N 27/84
USPC ........................................ 324/144, 252, 263
See application file for complete search history.

(56) References Cited

U.S. PATENT DOCUMENTS

| | | | | |
|---|---|---|---|---|
| 2002/0074504 | A1* | 6/2002 | Moses | H04N 3/155 |
| | | | | 250/370.09 |
| 2011/0172938 | A1 | 7/2011 | Gu et al. | |
| 2011/0221429 | A1* | 9/2011 | Tamura | G01R 15/207 |
| | | | | 324/244 |
| 2013/0082698 | A1 | 4/2013 | Fukui | |
| 2013/0106412 | A1* | 5/2013 | Nomura | G01R 15/205 |
| | | | | 324/252 |
| 2013/0187645 | A1* | 7/2013 | Pannetier-Lecoeur | |
| | | | | G01R 15/205 |
| | | | | 324/252 |
| 2016/0313413 | A1* | 10/2016 | Mohan | G01R 33/098 |
| 2017/0108536 | A1* | 4/2017 | Hebiguchi | G01R 15/08 |

FOREIGN PATENT DOCUMENTS

| | | | |
|---|---|---|---|
| JP | 2006-214855 A | | 8/2006 |
| JP | 2007-187528 | | 7/2007 |
| JP | 2010-145241 | | 7/2010 |
| JP | 4710626 | * | 6/2011 |
| JP | 2012-052980 A | | 3/2012 |
| JP | 2012-78337 A | | 4/2012 |
| JP | 2012-113425 A | | 6/2012 |
| JP | 5250109 | | 4/2013 |
| JP | 2013-113799 | | 6/2013 |
| WO | WO 2012/053296 A1 | | 4/2012 |

OTHER PUBLICATIONS

U.S. Appl. No. 14/582,769, filed Dec. 24, 2014, titled "Current Sensor, Current Measuring Module, and Smart Meter". 171 pages.
Extended European Search Report issued by the European Patent Office dated Jun. 1, 2015, for European Patent Application No. 14198210.8.

* cited by examiner

| Magnetic Field Value | Control Signal Sc | | | | | | Magnetic Resistance Element |
|---|---|---|---|---|---|---|---|
| | $V_1$ | $V_2$ | ... | $V_{n-1}$ | $V_n$ | $V_{max}$ | |
| $0 < H < H_1$ | 0 | 0 | ... | 0 | 0 | 0 | 610-1 |
| $H_1 \leqq H < H_2$ | 1 | 0 | ... | 0 | 0 | 0 | 610-2 |
| $H_2 \leqq H < H_3$ | 1 | 1 | ... | 0 | 0 | 0 | 610-3 |
| ⋮ | ⋮ | ⋮ | ⋮ | ⋮ | ⋮ | ⋮ | ⋮ |
| $H_{n-1} \leqq H < H_n$ | 1 | 1 | ... | 1 | 0 | 0 | 610-n |
| $H_n \leqq H < H_r$ | 1 | 1 | ... | 1 | 1 | 0 | 620 |
| $H_r < H$ | 1 | 1 | ... | 1 | 1 | 1 | Outside Measurement Range |

FIG. 31

| Magnetic Field Value | Control Signal Sc | | | | | | | | | | | | Magnetic Resistance Element |
|---|---|---|---|---|---|---|---|---|---|---|---|---|---|
| | Magnetic Field − Side | | | | | | Magnetic Field + Side | | | | | | |
| | $V_{min}$ | $V_1$ | $V_2$ | ... | $V_{n-1}$ | $V_n$ | $V_{n+1}$ | ... | $V_{2n-1}$ | $V_{2n}$ | $V_{max}$ | | |
| $H < -H_r$ | 0 | 0 | 0 | ... | 0 | 0 | 0 | ... | 0 | 0 | 0 | Outside Measurement Range |
| $-H_r \leqq H < -H_n$ | 1 | 0 | 0 | ... | 0 | 0 | 0 | ... | 0 | 0 | 0 | 620 |
| $-H_n \leqq H < -H_{n-1}$ | 1 | 1 | 0 | ... | 0 | 0 | 0 | ... | 0 | 0 | 0 | 610-n |
| ... | ... | ... | ... | ... | ... | ... | ... | ... | ... | ... | ... | ... |
| $-H_2 \leqq H < -H_1$ | 1 | 1 | 1 | ... | 1 | 0 | 0 | ... | 0 | 0 | 0 | 610-2 |
| $-H_1 \leqq H < H_1$ | 1 | 1 | 1 | ... | 1 | 1 | 0 | ... | 0 | 0 | 0 | 610-1 |
| $H_1 \leqq H < H_2$ | 1 | 1 | 1 | ... | 1 | 1 | 1 | ... | 0 | 0 | 0 | 610-2 |
| ... | ... | ... | ... | ... | ... | ... | ... | ... | ... | ... | ... | ... |
| $H_{n-1} \leqq H < H_n$ | 1 | 1 | 1 | ... | 1 | 1 | 1 | ... | 1 | 0 | 0 | 610-n |
| $H_n \leqq H < H_r$ | 1 | 1 | 1 | ... | 1 | 1 | 1 | ... | 1 | 1 | 0 | 620 |
| $H \geqq H_r$ | 1 | 1 | 1 | ... | 1 | 1 | 1 | ... | 1 | 1 | 1 | Outside Measurement Range |

CURRENT SENSOR, CURRENT MEASURING MODULE, AND SMART METER

CROSS-REFERENCE TO RELATED APPLICATIONS

This application is based upon and claims the benefit of Japanese Patent Application No. 2013-268067, filed on Dec. 25, 2013, the entire contents of which are incorporated herein by reference.

FIELD

The present embodiments relate to a current sensor, a current measuring module, and a smart meter in which these are installed.

BACKGROUND

In recent years, the introduction of smart meters which are next-generation watt-hour meters that measure electric power digitally and are provided with a communication function within the meter, has continued to be promoted with the object of stability, efficiency, and so on, of electric power supply and demand. There is a need for a current sensor that achieves the broad dynamic range and high resolution that are required in a smart meter, with low power consumption.

In order to achieve a high resolution current sensor, it is effective to employ a magnetoresistance element having high sensitivity to a magnetic field. Moreover, in order to obtain both high resolution and broad dynamic range, a magnetic balance system current sensor employing a magnetoresistance element has been proposed. However, in the magnetic balance system, when a current-to-be-measured becomes large, it is necessary to generate in a coil a cancelling magnetic field having the same magnitude as a large current-induced magnetic field generated by the current-to-be-measured. In this case, a current passed through the coil to generate the cancelling magnetic field increases proportionately to a magnitude of the current-to-be-measured, hence there is a problem that in the case of a large current-to-be-measured, power consumption of the current sensor itself ends up increasing.

The current sensor, current measuring module, and smart meter according to the present embodiments provide a current sensor, current measuring module, and smart meter that enable high-precision measurement over a wide measurement range with low power consumption.

BRIEF DESCRIPTION OF THE DRAWINGS

FIG. 31 is a truth table of control signals of the current sensor according to the same embodiment.

DETAILED DESCRIPTION

A current sensor according to an embodiment of the present invention comprises: a plurality of magnetoresistance elements each of whose resistance value changes by application of an current-induced magnetic field from a current-to-be-measured; and a selection circuit that selects one magnetoresistance element from the plurality of magnetoresistance elements and outputs a signal of the selected magnetoresistance element. The plurality of magnetoresistance elements differ from each other in a relationship between a magnitude of the applied current-induced magnetic field and the resistance value. Moreover, a smart meter according to an embodiment of the present invention has, for example, the current sensor according to the present embodiment installed therein.

1. First Embodiment

[1-1. Overall Configuration]

Figure 1:
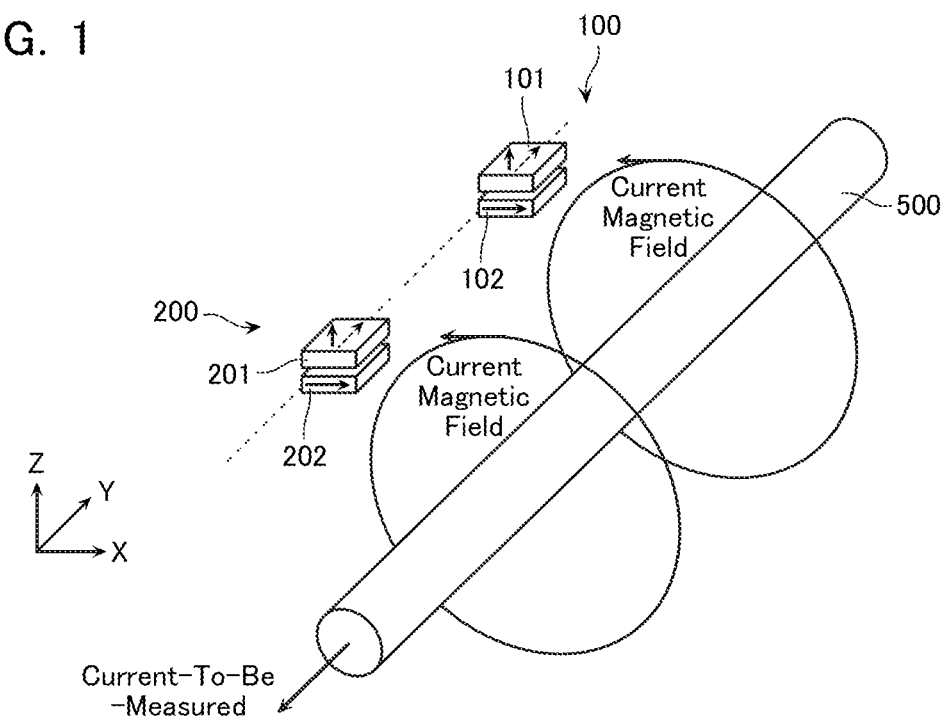
FIG. 1 is a schematic view showing an example of configuration of a current sensor according to a first embodiment.

FIG. 1 is a schematic view showing an example of configuration of a current sensor according to a first embodiment. The current sensor according to the first embodiment includes a first magnetoresistance element 100 and a second magnetoresistance element 200 that are disposed close to a wiring line 500 and that have a resistance value of that changes by application of an current-induced magnetic field from a measurement current flowing in this wiring line 500. The first magnetoresistance element 100 and the second magnetoresistance element 200 respectively include: first magnetic layers 101 and 201 acting as magnetization free layers; and magnetization fixed layers 102 and 202. In addition, the first magnetoresistance element 100 and the second magnetoresistance element 200 differ from each other in a relationship between a magnitude of the applied current-induced magnetic field and the resistance value. Moreover, the first magnetoresistance element 100 and the second magnetoresistance element 200 according to the present embodiment differ from each other in an amount of increase or an amount of decrease of the resistance value with respect to a certain amount of increase of the current-induced magnetic field. Employing such a form of current sensor makes it possible to achieve high-precision measurement of a wide range of current values, with low power consumption.

The amount of increase or amount of decrease of the resistance value with respect to a certain amount of increase of the current-induced magnetic field will be referred to below as magnetic field sensitivity. If an amount of change of the resistance value of the magnetoresistance element is assumed to be dR, a usual resistance value of the magnetoresistance element is assumed to be R, and a saturation magnetic field of the magnetoresistance element is assumed to be Hs, then magnetic field sensitivity may be expressed by $(dR/R)/2Hs$. Note that the saturation magnetic field is a magnitude of the magnetic field when the resistance value has ceased changing with respect to a change in the current-induced magnetic field.

Note that in the current sensor shown in FIG. 1, two magnetoresistance elements 100 and 200 having different magnetism-resistance characteristics were illustrated, but three or more magnetoresistance elements having different magnetism-resistance characteristics may be employed. The number of magnetoresistance elements having different magnetism-resistance characteristics may be appropriately adjusted according to a range of current and required measurement resolution of a measurement target.

[1-2. Operating Principle]

Figure 2:
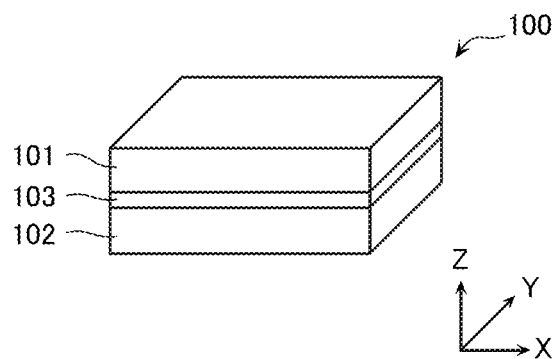
FIG. 2 is a schematic perspective view illustrating a schematic configuration of a magnetoresistance element according to the same embodiment.

FIG. 2 is a schematic perspective view illustrating a schematic configuration of the magnetoresistance element employed in the current sensor according to the present embodiment. For example, the first magnetoresistance element 100 includes: the first magnetic layer 101; the second magnetic layer 102; an intermediate layer 103 provided between the first magnetic layer 101 and the second magnetic layer 102; and an electrode layer not illustrated. Note that the second magnetoresistance element 200 is configured substantially similarly to the first magnetoresistance element 100.

The intermediate layer 103 is, for example, a non-magnetic layer. The first magnetic layer 101 is, for example, a magnetization free layer whose magnetization freely changes. The second magnetic layer 102 is, for example, a magnetization fixed layer whose magnetization is fixed.

The first magnetoresistance element 100 is a GMR (Giant Magneto Resistance) element when the intermediate layer 103 is formed by a conductive material, and is a TMR (Tunneling Magneto Resistance) element when the intermediate layer 103 is formed by an insulating material. In the case of being a GMR element, the first magnetoresistance element 100 may be a CPP-GMR (Current-Perpendicularto-Plane Giant Magneto Resistance) element where current flows in a direction perpendicular to a film plane, and may be a CIP-GMR (Current-In-Plane Giant Magneto Resistance) element where current flows in a direction along a film plane. In the case that the first magnetoresistance element 100 is a TMR element, current flows in a direction perpendicular to a film surface. Moreover, the first magnetoresistance element 100 may be an AMR (Anisotropic Magneto Resistance) element.

FIGS. 3A, 3B, 3C and 3D are schematic views explaining a function of the magnetoresistance element detecting a magnetic field used in the present embodiment. Description hereafter exemplifies the case where the first magnetic layer 101 is a magnetization free layer, and the second magnetic layer 102 is a magnetization fixed layer.

The function of the magnetoresistance element detecting a magnetic field is based on the "MR effect". The "MR effect" appears in a stacked film of the first magnetic layer 101, the intermediate layer 103, and the second magnetic layer 102. The "MR effect" is a phenomenon that when an external magnetic field is applied in a stacked film including a magnetic material, a value of electrical resistance of the stacked film changes due to a change in magnetization of the magnetic material.

Figure 3A:
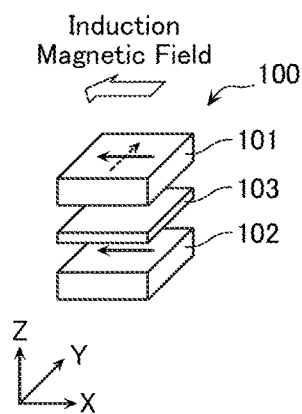
FIGS. 3A, 3B, 3C and 3D are schematic views for explaining a function of the magnetoresistance element according to the same embodiment.
Figure 3B:
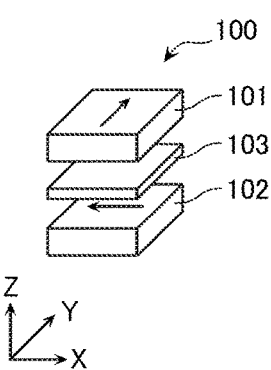

As shown in FIG. 3B, in an initial state when the current-induced magnetic field is not applied to the first magnetoresistance element 100, magnetization directions of the first magnetic layer 101 and the second magnetic layer 102 have certain angles. The magnetization direction of the second magnetic layer 102 is fixed by the likes of an antiferromagnetic layer adjacent in a stacking direction as will be described later, and the magnetization direction of the first magnetic layer 101 is set to a certain direction by the likes of a first linear response magnetic body 160 or a direction of a magnetic field during annealing, and so on.

Figure 3C:
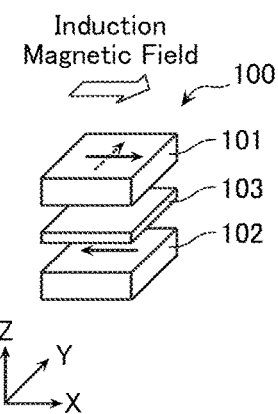

As shown in FIGS. 3A and 3C, the magnetization direction of the first magnetic layer 101 changes by the current-induced magnetic field being applied to the first magnetoresistance element 100. As a result, a relative angle of the magnetization directions of the first magnetic layer 101 and the second magnetic layer 102 changes.

When a current is passed through the first magnetoresistance element 100, the change in the relative angle of the magnetization directions appears as a resistance change. When resistance of a low-resistance state is assumed to be R, and an amount of change in electrical resistance changing by the MR effect is assumed to be ΔR, then ΔR/R is referred to as "MR ratio". When a positive magnetoresistance effect occurs due to the combination of materials of the first magnetic layer 101, the intermediate layer 103, and the second magnetic layer 102, the electrical resistance decreases with decrease in the relative angle of the magnetization directions of the first magnetic layer 101 and the second magnetic layer 102. On the other hand, when a negative magnetoresistance effect occurs due to the combination of materials of the first magnetic layer 101, the intermediate layer 103, and the second magnetic layer 102, the electrical resistance increases with decrease in the relative angle of the magnetization directions of the first magnetic layer 101 and the second magnetic layer 102.

Figure 3D:
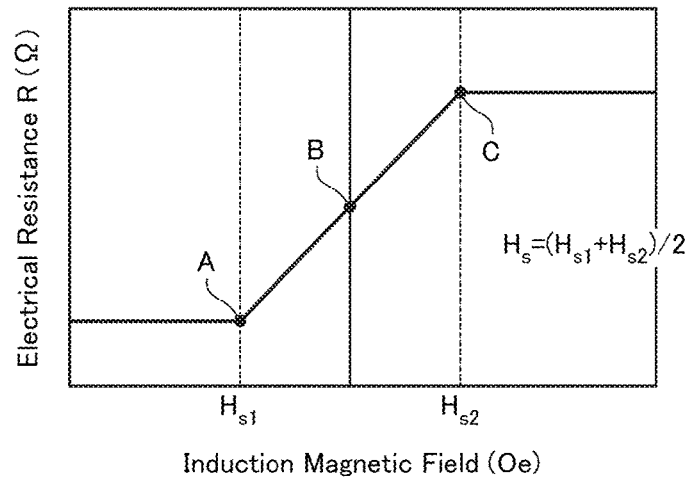

In the example shown in FIG. 3D, a positive magnetoresistance effect is exemplified. In a magnetoresistance element such as a GMR element or a TMR element, the "MR ratio" is extremely large, hence sensitivity to a magnetic field is high compared to in a Hall element. Moreover, as illustrated in FIG. 3D, the magnetoresistance element has a dynamic range of electrical resistance change with respect to the magnetic field in which resistance becomes a minimum value when the magnetization free layer and magnetization fixed layer are parallel and becomes a maximum value when the magnetization free layer and magnetization fixed layer are antiparallel. As shown in FIG. 3D, the dynamic range of the magnetoresistance element is defined by 2Hs.

[1-3. Examples of Configuration of Magnetoresistance Element]

Examples of configuration of the magnetoresistance element according to the present embodiment will be described below. FIGS. 4A to 4D are schematic perspective views illustrating the magnetoresistance elements employed in the current sensor according to the present embodiment. Note that below, a description of "material A/material B" indicates a state where a layer of material B is provided on a layer of material A. Note that in the description below, the first magnetoresistance element 100 will be taken as an example, but the second magnetoresistance element 200 may also be similarly configured, and when magnetoresistance elements are further provided, these may also be similarly configured.

Figure 4A:
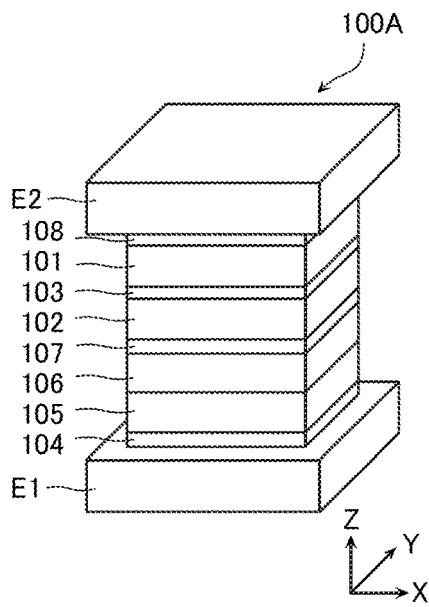
FIGS. 4A, 4B, 4C and 4D are schematic perspective views illustrating the magnetoresistance element according to the same embodiment.

FIG. 4A is a schematic perspective view illustrating a first magnetoresistance element 100A employed in a certain embodiment. As indicated in FIG. 4A, the first magnetoresistance element 100A includes, aligned sequentially therein: a lower electrode E1; a under layer 104; a pinning layer 105; a second magnetization fixed layer 106; a magnetic coupling layer 107; the second magnetic layer 102; the intermediate layer 103; the first magnetic layer 101; a cap layer 108; and an upper electrode E2.

In this example, the first magnetic layer 101 functions as a magnetization free layer, and the second magnetic layer 102 functions as a first magnetization fixed layer. The first magnetoresistance element 100A of FIG. 4A is called a bottom spin valve type.

Employed in the under layer 104 is, for example, Ta/Ru. A thickness (length in a Z axis direction) of a Ta layer thereof is, for example, 3 nm. A thickness of a Ru layer thereof is, for example, 2 nm. Employed in the pinning layer 105 is, for example, an IrMn layer having a thickness of 7 nm. Employed in the second magnetization fixed layer 106 is, for example, a $Co_{75}Fe_{25}$ layer having a thickness of 2.5 nm. Employed in the magnetic coupling layer 107 is, for example, a Ru layer having a thickness of 0.9 nm. Employed in the first magnetization fixed layer 102 is, for example, a $Co_{40}Fe_{40}B_{20}$ layer having a thickness of 3 nm. Employed in the intermediate layer 103 is, for example, a MgO layer having a thickness of 1.6 nm. Employed in the first magnetic layer 101 is, for example, $Co_{40}Fe_{40}B_{20}/Ni_{80}Fe_{20}$. A stacked body of $Co_{40}Fe_{40}B_{20}$ having a thickness of 2 nm and $Ni_{80}Fe_{20}$ having a thickness of 8 nm is employed. Employed in the cap layer 108 is, for example, Ta/Ru. A thickness of a Ta layer thereof is, for example, 1 nm. A thickness of a Ru layer thereof is, for example, 5 nm.

Included in the lower electrode E1 and the upper electrode E2 is, for example, at least one of aluminum (Al), an aluminum copper alloy (Al—Cu), copper (Cu), silver (Ag), and gold (Au). Employing such materials having a comparatively small electrical resistance as the lower electrode E1 and the upper electrode E2 makes it possible to pass a current efficiently through the first magnetoresistance element 100A.

The lower electrode E1 may have a structure in which a layer of at least one of Al, Al—Cu, Cu, Ag, and Au is provided between a lower electrode E1-dedicated under layer (not illustrated) and cap layer (not illustrated). For example, employed in the lower electrode E1 is the likes of tantalum (Ta)/copper (Cu)/tantalum (Ta). Employing Ta as the lower electrode E1-dedicated under layer makes it possible to improve adhesion between layers configuring the lower electrode E1, for example. Titanium (Ti) or titanium nitride (TiN), and so on, may be employed as the lower electrode E1-dedicated under layer. Employing tantalum Ta as the lower electrode E1-dedicated cap layer makes it possible to prevent oxidation of the likes of copper (Cu) below that cap layer. Titanium (Ti) or titanium nitride (TiN), and so on, may be employed as the lower electrode E1-dedicated cap layer.

A stacked structure of a buffer layer (not illustrated) and a seed layer (not illustrated) may be employed in the under layer 104. This buffer layer eases surface roughness of the lower electrode E1 and improves crystallinity of a layer stacked on the buffer layer, for example. Employed as the buffer layer is, for example, at least one selected from the group configured from tantalum (Ta), titanium (Ti), vanadium (V), tungsten (W), zirconium (Zr), hafnium (Hf), and chrome (Cr). An alloy including at least one material selected from these materials may be employed as the buffer layer.

A thickness of the buffer layer is preferably not less than 1 nm and not more than 10 nm. The thickness of the buffer layer is more preferably not less than 1 nm and not more than 5 nm. If the buffer layer is too thin, a buffer effect is lost. If the buffer layer is too thick, the first magnetoresistance element 100A becomes excessively thick. The seed layer is formed on the buffer layer, and that seed layer may have a buffer effect. The buffer layer may be omitted. Employed in the buffer layer is, for example, a Ta layer having a thickness of 3 nm.

The seed layer not illustrated controls crystalline orientation of a layer stacked on the seed layer. The seed layer controls grain size of the layer stacked on the seed layer. Employed as the seed layer are the likes of a metal of fcc structure (Face-Centered Cubic Structure), hcp structure (Hexagonal Close-Packed Structure), or bcc structure (Body-Centered Cubic Structure).

Employing ruthenium (Ru) of hcp structure, or NiFe of fcc structure, or Cu of fcc structure as the seed layer makes it possible to set the crystalline orientation of a spin valve film on the seed layer to an fcc (111) orientation, for example. Employed in the seed layer is, for example, a Cu layer having a thickness of 2 nm, or a Ru layer having a thickness of 2 nm. When raising crystalline orientation of the layer formed on the seed layer, a thickness of the seed layer is preferably not less than 1 nm and not more than 5 nm. The thickness of the seed layer is more preferably not less than 1 nm and not more than 3 nm. As a result, a function as a seed layer of improving crystalline orientation is sufficiently displayed. On the other hand, when, for example, there is no need to cause crystalline orientation of the layer formed on the seed layer (when, for example, forming an amorphous magnetization free layer, and so on), the seed layer may be omitted. Employed as the seed layer is, for example, a Ru layer having a thickness of 2 nm.

The pinning layer 105 gives unidirectional anisotropy to a ferromagnetic layer formed on the pinning layer 105, and thereby fixes magnetization of said ferromagnetic layer. In the example shown in FIG. 4A, the pinning layer 105 gives unidirectional anisotropy to a ferromagnetic layer of the second magnetization fixed layer 106 formed on the pinning layer 105, and thereby fixes magnetization of said ferromagnetic layer. Employed in the pinning layer 105 is, for example, an antiferromagnetic layer. Employed in the pinning layer 105 is, for example, at least one selected from the group configured from Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. It is also possible to employ an alloy having an additional element further added to the Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. A thickness of the pinning layer 105 is appropriately set to give sufficiently strong unidirectional anisotropy.

In order to perform fixing of magnetization of the ferromagnetic layer contacting the pinning layer 105, heat treatment (annealing) during magnetic field application is performed. Magnetization of the ferromagnetic layer contacting the pinning layer 105 is fixed in a direction of the magnetic field applied during the heat treatment. Annealing temperature is set to, for example, a temperature higher than a magnetization fixing temperature of an antiferromagnetic material employed in the pinning layer 105. Moreover, when an antiferromagnetic layer including Mn is employed, Mn sometimes diffuses to a layer other than the pinning layer 105 to lower the MR ratio. Hence, the annealing temperature is desirably set to not more than a temperature at which diffusion of Mn occurs. The annealing temperature may be set to, for example, not less than 200° C. and not more than 500° C. Preferably, it may be set to, for example, not less than 260° C. and not more than 400° C.

When Pt—Mn or Pd—Pt—Mn are employed as the pinning layer 105, the thickness of the pinning layer 105 is preferably not less than 8 nm and not more than 20 nm. The thickness of the pinning layer 105 is more preferably not less than 10 nm and not more than 15 nm. When IrMn is employed as the pinning layer 105, unidirectional anisotropy may be given by a pinning layer 105 which is thinner than when PtMn is employed as the pinning layer 105. In this case, the thickness of the pinning layer 105 is preferably not less than 4 nm and not more than 18 nm. The thickness of the pinning layer 105 is more preferably not less than 5 nm and not more than 15 nm. Employed in the pinning layer 105 is, for example, an $Ir_{22}Mn_{78}$ layer having a thickness of 7 nm. When the $Ir_{22}Mn_{78}$ layer is employed, heat treatment may be performed for one hour at 320° C. while applying a magnetic field of 10 kOe, as magnetic field-accompanied heat treatment conditions. When a $Pt_{50}Mn_{50}$ layer is employed, heat treatment may be performed for 10 hours at 320° C. while applying a magnetic field of 10 kOe, as magnetic field-accompanied heat treatment conditions.

Configurable as the second magnetization fixed layer 106 is, for example, at least one of Fe, Co, and Ni, or an alloy including at least one kind thereof. Moreover, a material having an additional element added to these materials may also be configured as the second magnetization fixed layer 106.

Employed in the second magnetization fixed layer 106 is, for example, a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these alloys. Employed in the second magnetization fixed layer 106 is, for example, at least one selected from the group configured from Co, Fe, and Ni. It is also possible to employ as the second magnetization fixed layer 106 an alloy including at least one material selected from these materials.

A thickness of the second magnetization fixed layer 106 is preferably not less than 1.5 nm and not more than 5 nm, for example. As a result, for example, intensity of the unidirectional anisotropic magnetic field due to the pinning layer 105 can be more greatly strengthened. For example, intensity of an antiferromagnetic coupling magnetic field between the second magnetization fixed layer 106 and the first magnetization fixed layer 102 can be more greatly strengthened, via the magnetic coupling layer 107 formed on the second magnetization fixed layer 106. Magnetic film thickness (product (Bs·t) of saturation magnetization Bs and thickness t) of the second magnetization fixed layer 106 is preferably substantively equal to magnetic film thickness of the first magnetization fixed layer 102.

Saturation magnetization of $Co_{40}Fe_{40}B_{20}$ with a thin film is approximately 1.9 T (tesla). For example, when a $Co_{40}Fe_{40}B_{20}$ layer having a thickness of 3 nm is employed as the first magnetization fixed layer 102, the magnetic film thickness of the first magnetization fixed layer 102 is 1.9 T×3 nm, that is, 5.7 Tnm. On the other hand, saturation magnetization of $Co_{75}Fe_{25}$ is approximately 2.1 T. The thickness of the second magnetization fixed layer 106 at which a magnetic film thickness equal to that described above can be obtained is 5.7 Tnm/2.1 T, that is, 2.7 nm. In this case, $Co_{75}Fe_{25}$ having a thickness of approximately 2.7 nm is preferably employed in the second magnetization fixed layer 106. Employed as the second magnetization fixed layer 106 is, for example, a $Co_{75}Fe_{25}$ layer having a thickness of 2.5 nm.

In the first magnetoresistance element 100A shown in FIG. 4A, a synthetic pin structure of the second magnetization fixed layer 106, the magnetic coupling layer 107, and the first magnetization fixed layer 102 is employed. Instead, a single pin structure configured from a single-layer magnetization fixed layer may be employed. When the single pin structure is employed, a $Co_{40}Fe_{40}B_{20}$ layer having a thickness of 3 nm, for example, is employed as the magnetization fixed layer. The same material as that of the later-described first magnetization fixed layer 102 may be employed as the ferromagnetic layer employed in the single pin structure magnetization fixed layer.

The magnetic coupling layer 107 generates antiferromagnetic coupling between the second magnetization fixed layer 106 and the first magnetization fixed layer 102. The magnetic coupling layer 107 forms a synthetic pin structure. Employed as the magnetic coupling layer 107 is, for example, Ru. A thickness of the magnetic coupling layer 107 is preferably not less than 0.8 nm and not more than 1 nm. A material other than Ru may be employed as the magnetic coupling layer 107, provided it is a material generating sufficient antiferromagnetic coupling between the second magnetization fixed layer 106 and the first magnetization fixed layer 102. The thickness of the magnetic coupling layer 107 may be set to a thickness of not less than 0.8 nm and not more than 1 nm corresponding to a second peak of RKKY (Ruderman-Kittel-Kasuya-Yosida) coupling. Furthermore, the thickness of the magnetic coupling layer 107 may be set to a thickness of not less than 0.3 nm and not more than 0.6 nm corresponding to a first peak of RKKY coupling. Employed as the magnetic coupling layer 107 is, for example, Ru having a thickness of 0.9 nm. As a result, highly reliable coupling can be more stably obtained.

Configurable as the first magnetization fixed layer is, for example, at least one of Fe, Co, and Ni, or an alloy including at least one kind thereof. Moreover, a material having an additional element added to these materials may also be configured as the first magnetization fixed layer.

A magnetic layer employed in the first magnetization fixed layer 102 contributes directly to the MR effect. Employed as the first magnetization fixed layer 102 is, for example, a Co—Fe—B alloy. Specifically, a $(Co_xFe_{100-x})_{100-y}B_y$ alloy (where x is not less than 0 at. % and not more than 100 at. %, and y is not less than 0 at. % and not more than 30 at. %) may be employed as the first magnetic fixed layer 102. When an amorphous alloy of $(Co_xFe_{100-x})_{100-y}B_y$ is employed as the first magnetization fixed layer 102, variation between elements due to crystal grains can be suppressed even when size of the magnetoresistance element is small. When an amorphous alloy is employed as the first magnetization fixed layer 102, a layer formed on the first magnetization fixed layer 102 (for example, a tunnel insulating layer) can be planarized. Planarization of the tunnel insulating layer makes it possible to reduce defect density of the tunnel insulating layer. For example, when MgO is employed as a material of the tunnel insulating layer, employing an amorphous alloy of $(Co_xFe_{100-x})_{100-y}B_y$ makes it possible to strengthen (100) orientation of an MgO layer formed on the tunnel insulating layer. More greatly raising the (100) orientation of the MgO layer enables an even larger MR ratio to be obtained. The $(Co_xFe_{100-x})_{100-y}B_y$ alloy crystallizes adopting a (100) surface of the MgO layer as a template during annealing. Therefore, good crystal conformity can be obtained between the MgO and the $(Co_xFe_{100-x})_{100-y}B_y$ alloy. Obtaining good crystal conformity enables an even larger MR ratio to be obtained. An Fe—Co alloy, for example, may be employed as the first magnetization fixed layer 102, besides the Co—Fe—B alloy.

If the first magnetization fixed layer 102 is thicker, a larger MR ratio is obtained. In order to obtain a larger fixed magnetic field, it is more preferable for the first magnetization fixed layer 102 to be thin. There is a tradeoff relationship in the thickness of the first magnetization fixed layer 102 between the MR ratio and the fixed magnetic field. When a Co—Fe—B alloy is employed as the first magnetization fixed layer 102, the thickness of the first magnetization fixed layer 102 is preferably not less than 1.5 nm and not more than 5 nm. The thickness of the first magnetization fixed layer 102 is more preferably not less than 2.0 nm and not more than 4 nm.

Employed in the first magnetization fixed layer 102 (second magnetic layer), besides the above-mentioned materials, is a $Co_{90}Fe_{10}$ alloy of fcc structure, or Co of hcp structure, or a Co alloy of hcp structure. Employed as the first magnetization fixed layer 102 is at least one selected from the group configured by Co, Fe, and Ni. Employed as the first magnetization fixed layer 102 is an alloy including at least one material selected from these materials. Employing a bcc structure FeCo alloy material, a Co alloy including a cobalt composition of 50 at. % or more, or a material having a Ni composition of 50 at. % or more as the first magnetization fixed layer 102 results in, for example, a larger MR ratio being obtained. It is also possible to employ as the first magnetization fixed layer 102 a Heusler magnetic alloy layer of the likes of $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, and $Co_2FeGa_{0.5}Ge_{0.5}$. For example, employed as the first magnetization fixed layer 102 is a $Co_{40}Fe_{40}B_{20}$ layer having a thickness of 3 nm.

The intermediate layer 103 decouples magnetic coupling between the first magnetization fixed layer 102 and the first magnetic layer 101. Employed in the intermediate layer 103 is, for example, a metal or an insulator or a semiconductor. When a metal is employed as the intermediate layer 103, the likes of Cu, Au, or Ag are employed, for example. In this case, a thickness of the intermediate layer 103 is, for example, about not less than 1 nm and not more than 7 nm. When an insulator or semiconductor is employed as the intermediate layer 103, the likes of a magnesium oxide (Mg—O, and so on), an aluminum oxide ($Al_2O_3$, and so on), a titanium oxide (Ti—O, and so on), a zinc oxide (Zn—O, and so on), or gallium oxide (Ga—O) are employed. In this case, the thickness of the intermediate layer 103 is, for example, about not less than 0.6 nm and not more than 5 nm.

Configurable as a material of the first magnetic layer 101 is, for example, at least one of Fe, Co and Ni, or an alloy including at least one kind thereof. Moreover, a material having an additional element added to these materials may also be configured as the material of the first magnetic layer 101. The first magnetic layer is a layer including a ferromagnetic body whose magnetization direction changes due to an external magnetic field. Moreover, B, Al, Si, Mg, C, Ti, V, Cr, Mn, Cu, Zn, Ga, Zr, Hf, and so on, can be added to these metals and alloys as an additional element or ultra-thin layer. In addition, it is also possible to employ an amorphous magnetic layer, not only a crystalline magnetic layer.

Moreover, it is also possible to employ a magnetic layer of an oxide or nitride. For example, it is possible to employ a two-layer configuration of $Co_{90}Fe_{10}$ [1 nm]/$Ni_{80}Fe_{20}$ [3.5 nm] that employs NiFe, forming CoFe at a boundary thereof. Note that when a NiFe layer is not employed, a $Co_{90}Fe_{10}$ [4 nm] single layer can be employed. Moreover, a three-layer configuration such as CoFe/NiFe/CoFe may also be adopted as the first magnetic layer 101.

$Co_{90}Fe_{10}$ is preferable in the first magnetic layer 101, since among CoFe alloys, $Co_{90}Fe_{10}$ has stable soft magnetic characteristics. When employing a CoFe alloy close to $Co_{90}Fe_{10}$, a film thickness of the first magnetic layer 101 is preferably set to not less than 0.5 nm and not more than 4 nm. In addition, $Co_xFe_{100-x}$ (where x=70 at. % to 90 at. %) may also be employed.

Moreover, in a TMR element employing MgO in the intermediate layer, it is preferable to employ a $(Co_xFe_{100-x})_{100-y}B_y$ alloy (where x=0 at. % to 100 at. %, and y=0 at. % to 30 at. %) as a material of the first magnetic layer. The $(Co_xFe_{100-x})_{100-y}B_y$ alloy crystallizes adopting an MgO (100) surface as a template during annealing, hence good crystal conformity of the MgO and the $(Co_xFe_{100-x})_{100-y}B_y$ alloy can be obtained. Such good crystal conformity is important in terms of obtaining a high MR ratio. On the other hand, when a Co—Fe—B alloy is employed in the first magnetic layer, it is preferable to configure a stacked body with a Ni—Fe alloy in terms of improving soft magnetic characteristics. For example, $Co_{40}Fe_{40}B_{20}$ [2 nm]/$Ni_{80}Fe_{20}$ [8 nm], and so on, can be employed. Now, the Co—Fe—B layer is preferably disposed on an intermediate layer 103 side in terms of obtaining a high MR ratio. In addition, when crystal conformity between the $Co_{40}Fe_{40}B_{20}$ layer and the $Ni_{80}Fe_{20}$ layer is cut, the $Co_{40}Fe_{40}B_{20}$ layer can obtain good orientation adopting the MgO intermediate layer as a template, hence a non-magnetic metal of the likes of Ta or Ti may be inserted between the $Co_{40}Fe_{40}B_{20}$ and $Ni_{80}Fe_{20}$ layers. Moreover, a stacked body of a Co—Fe—B layer and a Ni—Fe—B layer may be configured.

The cap layer 108 protects a layer provided below the cap layer 108. Employed in the cap layer 108 are, for example, a plurality of metal layers. A non-magnetic metal may be employed in the cap layer 108, for example. Employed in the cap layer 108 is, for example, a two-layer structure (Ta/Ru) of a Ta layer and a Ru layer. A thickness of this Ta layer is, for example, 1 nm, and a thickness of this Ru layer is, for example, 5 nm. Another metal layer may be provided instead of the Ta layer or Ru layer, as the cap layer 108. There may be any configuration of the cap layer 108. For example, a non-magnetic material may be employed in the cap layer 108. Another material may be employed as the cap layer 108, provided said material is capable of protecting the layer provided below the cap layer 108.

Figure 4B:
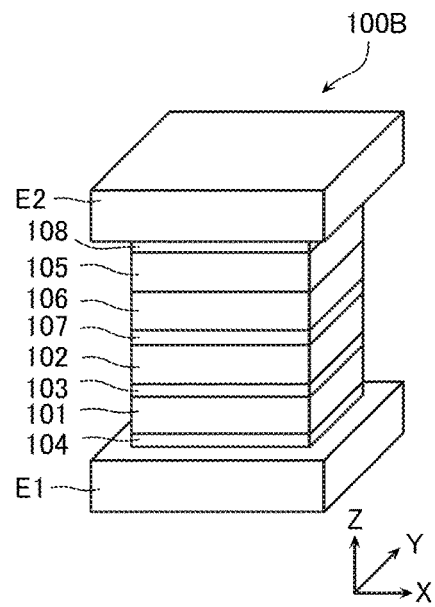

FIG. 4B is a schematic perspective view illustrating a first magnetoresistance element 100B used in another embodiment. As indicated in FIG. 4B, the first magnetoresistance element 100B includes, aligned sequentially therein: the lower electrode E1; the under layer 104; the first magnetic layer 101; the intermediate layer 103; the second magnetic layer 102; the magnetic coupling layer 107; the second magnetization fixed layer 106; the pinning layer 105; the cap layer 108; and the upper electrode E2.

In this example, the first magnetic layer 101 functions as a magnetization free layer, and the second magnetic layer 102 functions as a first magnetization fixed layer. The first magnetoresistance element 100B of FIG. 4B is called a top spin valve type. The materials described for the magnetoresistance element shown in FIG. 4A, for example, may be employed in each of the layers included in the first magnetoresistance element 100B.

Figure 4C:
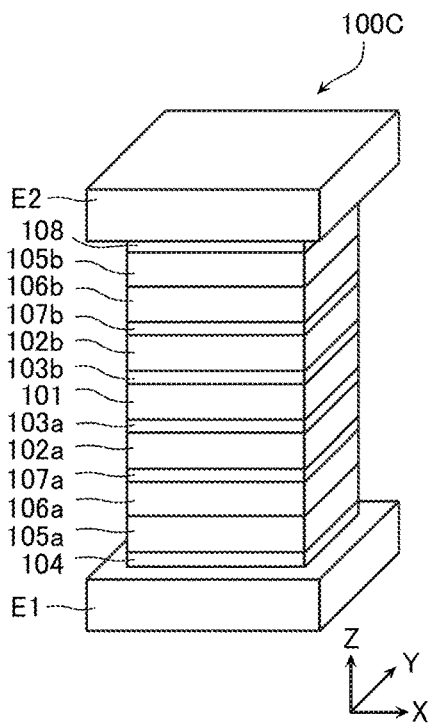

FIG. 4C is a schematic perspective view illustrating a first magnetoresistance element 100C used in another embodiment. As indicated in FIG. 4C, the first magnetoresistance element 100C includes, aligned sequentially therein: the lower electrode E1; the under layer 104; a lower pinning layer 105a; a lower second magnetization fixed layer 106a; a lower magnetic coupling layer 107a; a lower second magnetic layer 102a; a lower intermediate layer 103a; the first magnetic layer 101; an upper intermediate layer 103b; an upper second magnetic layer 102b; an upper magnetic coupling layer 107b; an upper second magnetization fixed layer 106b; an upper pinning layer 105b; the cap layer 108; and the upper electrode E2.

In this example, the first magnetic layer 101 functions as a magnetization free layer, the lower second magnetic layer 102a functions as a lower first magnetization fixed layer, and the upper second magnetic layer 102b functions as an upper first magnetization fixed layer. In the first magnetoresistance element 100A shown in FIG. 4A and the first magnetoresistance element 100B shown in FIG. 4B already described, the second magnetic layer 102 which is a magnetization fixed layer is disposed on a side of one surface of the first magnetic layer 101 which is a magnetization free layer. On the other hand, in the magnetoresistance element 100C shown in FIG. 4C, a magnetization free layer is disposed between two magnetization fixed layers. The first magnetoresistance element 100C shown in FIG. 4C is called a dual spin valve type. The materials described for the first magnetoresistance element 100A shown in FIG. 4A, for example, may be employed in each of the layers included in the first magnetoresistance element 100C shown in FIG. 4C.

Figure 4D:
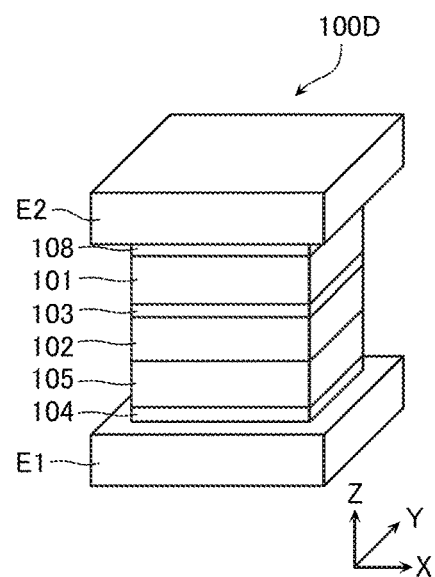

FIG. 4D is a schematic perspective view illustrating a first magnetoresistance element 100D used in another embodiment. As indicated in FIG. 4D, the first magnetoresistance element 100D includes, aligned sequentially therein: the lower electrode E1; the under layer 104; the pinning layer 105; the second magnetic layer 102; the intermediate layer 103; the first magnetic layer 101; the cap layer 108; and the upper electrode E2.

In this example, the first magnetic layer 101 functions as a magnetization free layer, and the second magnetic layer 102 functions as a magnetization fixed layer. The first magnetoresistance element 100A shown in FIG. 4A and the first magnetoresistance element 100B shown in FIG. 4B already described adopt a structure employing the second magnetization fixed layer 106, the magnetic coupling layer 107, and the second magnetic layer 102 functioning as the first magnetization fixed layer. On the other hand, the first magnetoresistance element 100D shown in FIG. 4D adopts a single pin structure employing a single magnetization fixed layer. The materials described for the first magnetoresistance element 100A shown in FIG. 4A, for example, may be employed in each of the layers included in the first magnetoresistance element 100D shown in FIG. 4D.

Figure 5:
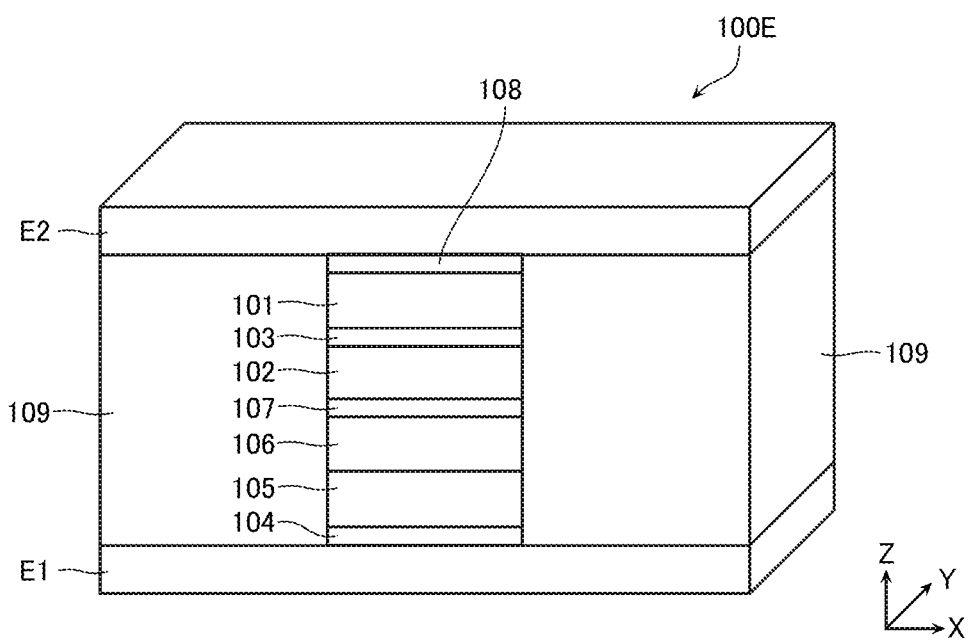
FIG. 5 is a schematic perspective view illustrating a first magnetoresistance element 100E according to another configuration of the same embodiment.

FIG. 5 is a schematic perspective view illustrating a first magnetoresistance element 100E according to another configuration. As indicated in FIG. 5, an insulating layer 109 is provided in the first magnetoresistance element 100E. That is, provided between the lower electrode E1 and the upper electrode E2 are two insulating layers (insulating portions) 109 that are separated from each other, and provided between these two insulating layers 109 is a stacked body configured from the under layer 104, the pinning layer 105, the second magnetization fixed layer 106, the magnetic coupling layer 107, the second magnetic layer 102, the intermediate layer 103, the magnetization free layer 101, and the cap layer 108.

In this example, the first magnetic layer 101 functions as a magnetization free layer, and the second magnetic layer 102 functions as a first magnetization fixed layer. The materials described for the magnetoresistance element shown in FIG. 4A, for example, may be employed in each of the layers included in the first magnetoresistance element 100E. Moreover, employable in the insulating layer 109 is, for example, an aluminum oxide (for example, $Al_2O_3$) or a silicon oxide (for example, $SiO_2$), and so on. Leak current in a periphery of the above-described stacked body can be suppressed by the insulating layer 109. The above-described insulating layer 109 may be applied also to any of the magnetoresistance elements shown in FIGS. 4A to 4D.

[1-4. Other Example of Configuration of Magnetoresistance Element]

Figure 6A:
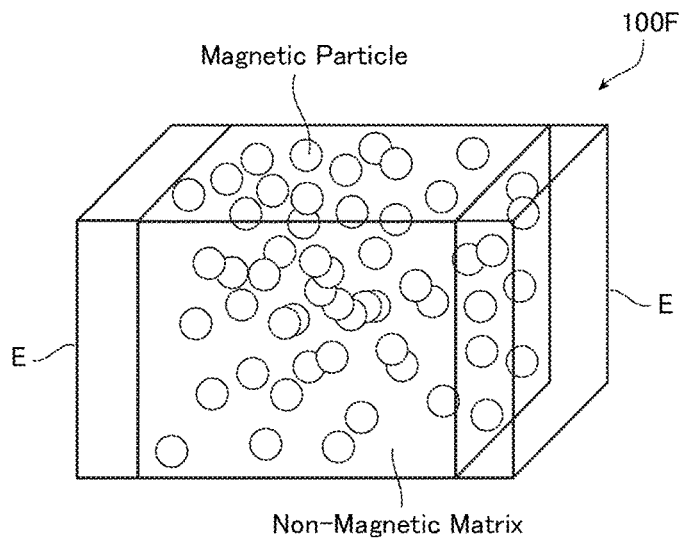
FIGS. 6A, 6B, 6C, 6D and 6E are schematic views showing a first magnetoresistance element 100F according to another configuration of the same embodiment.

FIG. 6A is a schematic perspective view showing a first magnetoresistance element 100F according to another configuration. The first magnetoresistance element 100F shown in FIG. 6A is called a granular type magnetoresistance element, and includes: a structure in which fine particles of a magnetic material are three-dimensionally dispersed in a matrix layer; and a pair of electrodes E disposed at side portions of this structure. The first magnetoresistance element 100F is called a granular type GMR element when the matrix layer is a conductor, and is called a granular type TMR element when the matrix layer is an insulator.

Figure 6B:
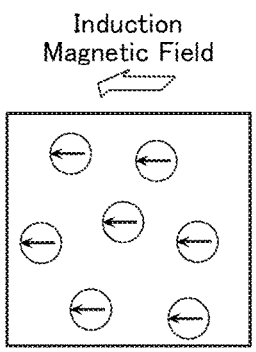
Figure 6C:
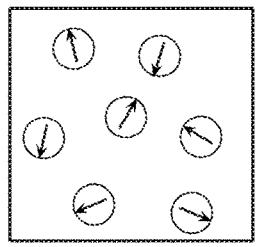
Figure 6D:
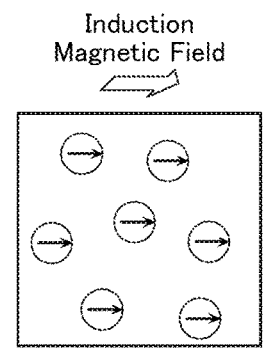
Figure 6E:
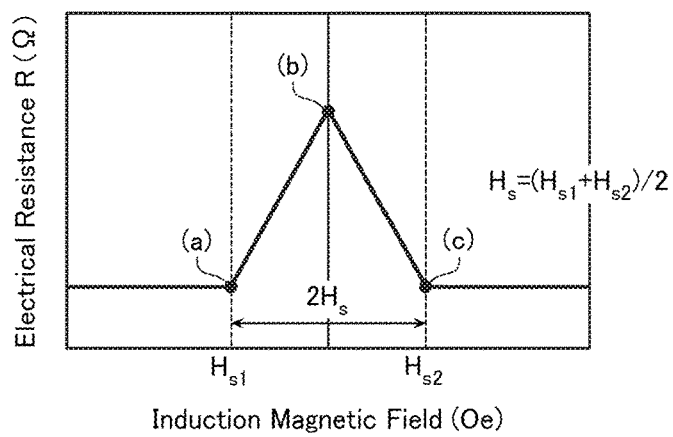

As shown in FIG. 6C, magnetization directions of the three-dimensionally dispersed magnetic particles is three-dimensionally random in a state where there is no external magnetic field, and, as shown in FIGS. 6B and 6D, is aligned in one direction when an external magnetic field is applied. As shown in FIG. 6E, electrical resistance changes according to relative angle of the dispersed magnetic particles. This MR phenomenon is based on the same principle as for the previously mentioned stacked type GMR element or TMR element. The first magnetoresistance element 100F has an advantage that production is easier compared to a stacked type, and so on.

The magnetic particles employed in the first magnetoresistance element 100F correspond to the magnetization free layer in the previously mentioned stacked type magnetoresistance element. Configurable as a material employed in the magnetic particles is, for example, at least one of Fe, Co, and Ni, or an alloy including at least one kind thereof. Moreover, it is also possible to add to these metals and alloys, as additional elements, the likes of B, Al, Si, Mg, C, Ti, V, Cr, Mn, Cu, Zn, Ga, Zr, and Hf. For example, magnetic particles configured from $Co_{90}Fe_{10}$ may be employed.

Employed as an insulating material or semiconductor material of the matrix of the first magnetoresistance element 100F in the case of a granular type TMR element are the likes of a magnesium oxide (Mg—O, and so on), an aluminum oxide ($Al_2O_3$, and so on), a titanium oxide (Ti—O, and so on), a zinc oxide (Zn—O, and so on), or gallium oxide (Ga—O). On the other hand, employable as a conductor material in the case of a granular type GMR element are metals such as Cu, Ag, Au, Al, Cr, and Ru.

Note that the first magnetoresistance element 100F is formed as a CIP element having the electrodes E provided on its sidewalls and passing a current in a direction within a film surface, but may also be configured as a CPP element that passes a current in a direction perpendicular to a film surface via the lower electrode E1 and the upper electrode E2.

[1-5. Adjustment of Magnetic Field Sensitivity of Magnetoresistance Element]

Next, adjustment of magnetic field sensitivity of the magnetoresistance element will be described. In order to adjust magnetic field sensitivity of the magnetoresistance element, it is possible to apply a method employing a linear response magnetic body, a method employing a magnetic flux guide, a method depending on arrangement of the magnetoresistance element, and other methods. A linear response magnetic body applies a magnetic field to the magnetoresistance element from a direction substantially perpendicular to the direction of the current-induced magnetic field due to the current-to-be-measured. In the current sensor according to the present embodiment, adjustment of magnetic field sensitivity is performed using this linear response magnetic body.

[1-6. Horizontally-Positioned Linear Response Magnetic Body]

Figure 7:
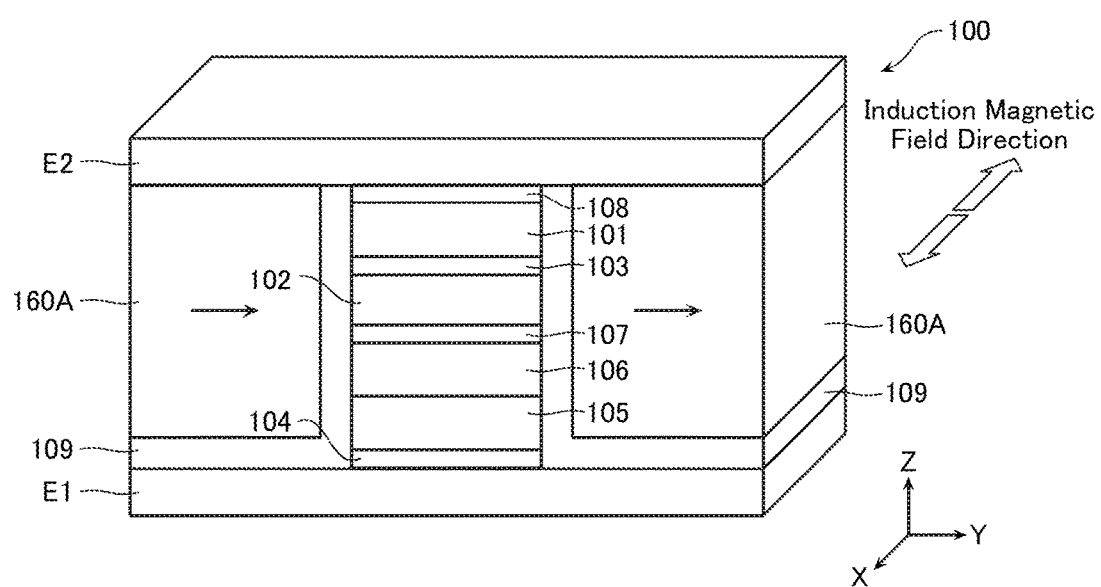
FIG. 7 is a schematic view of a first magnetoresistance element 100 and a first linear response magnetic body 160A according to the same embodiment.

A method of adjusting magnetic field sensitivity of the magnetoresistance element using the linear response magnetic body will be described. FIG. 7 is a schematic view of the first magnetoresistance element 100 and a first linear response magnetic body 160A. The first linear response magnetic body 160A is one mode of the linear response magnetic body.

The first linear response magnetic body 160A is disposed adjacently to the first magnetic layer 101, the second magnetic layer 102, and the intermediate layer 103 in the first magnetoresistance element 100, and applies a magnetic field to the first magnetic layer 101, the second magnetic layer 102, and the intermediate layer 103. In addition, the first linear response magnetic body 160A is provided between the lower electrode E1 and the upper electrode E2. Furthermore, disposed, for example, between the first linear response magnetic body 160A and the first magnetoresistance element 100 is the insulating layer 109. In this example, the insulating layer 109 extends to between the first linear response magnetic body 160A and the lower electrode E1.

In FIG. 7, a pair of first linear response magnetic bodies 160A are provided sandwiching one first magnetoresistance element 100. However, one first linear response magnetic body 160A may be provided to one first magnetoresistance element 100. The specific examples described hereafter also have a pair of first linear response magnetic bodies 160A provided, but may also have the first linear response magnetic body 160A configured on one side only.

The magnetization direction of the first magnetic layer 101 in a state where not applied with an external magnetic field can be set to a desired direction by the magnetic field of the first linear response magnetic body 160A. For example, setting the magnetization direction of the first linear response magnetic body 160A to a direction orthogonal to the magnetization direction of the second magnetic layer 102 makes it possible to orthogonalize the magnetization direction of the first magnetic layer 101 and the magnetization direction of the second magnetic layer 102, as shown in FIG. 3B. Intersecting (orthogonalizing) the magnetization direction of the first magnetic layer 101 and the magnetization direction of the second magnetic layer 102 enables linear responsiveness to positive/negative magnetic fields, as shown in FIG. 3D.

Employed in the first linear response magnetic body 160A is, for example, a hard magnetic material (hard ferromagnetic material) of comparatively high magnetic anisotropy and coercivity such as Co—Pt, Fe—Pt, Co—Pd, Fe—Pd, and so on. Moreover, an alloy having an additional element further added to Co—Pt, Fe—Pt, Co—Pd, and Fe—Pd may be employed. For example, CoPt (where a percentage of Co is not less than 50 at. % and not more than 85 at. %), $(Co_xPt_{100-x})_{100-y}Cr_y$ (where x is not less than 50 at. % and not more than 85 at. %, and y is not less than 0 at. % and not more than 40 at. %), or FePt (where a percentage of Pt is not less than 40 at. % and not more than 60 at. %), and so on, may be employed. When such materials are employed, applying the first linear response magnetic body 160A with an external magnetic field larger than the coercivity of the first linear response magnetic body 160A makes it possible to set (fix) the direction of magnetization of the first linear response magnetic body 160A to the direction in which the external magnetic field is applied. A thickness of the first linear response magnetic body 160A (for example, a length along a direction from the lower electrode E1 toward the upper electrode E2) is, for example, not less than 5 nm and not more than 50 nm.

When the insulating layer 109 is disposed between the first linear response magnetic body 160A and the lower electrode E1 as shown in FIG. 7, $SiO_x$ or $AlO_x$ may be employed as the material of the insulating layer 109. Furthermore, a magnetic body under layer (not illustrated) may be provided between the insulating layer 109 and the first linear response magnetic body 160A. When a hard ferromagnetic material of comparatively high magnetic anisotropy and coercivity such as Co—Pt, Fe—Pt, Co—Pd, Fe—Pd, and so on, is employed in the first linear response magnetic body 160A, Cr or Fe—Co and the like may be employed as a material of the magnetic body under layer. The above-described first linear response magnetic body 160A may also be applied to any of the above-described and below-described first magnetoresistance elements 100.

The first linear response magnetic body 160A may have a structure of being stacked on a linear response magnetic pinning layer not illustrated. In this case, the direction of magnetization of the first linear response magnetic body 160A can be set (fixed) by exchange coupling between the first linear response magnetic body 160A and the linear response magnetic pinning layer. In this case, employable in the first linear response magnetic body 160A is a ferromagnetic material configured from at least one of Fe, Co, and Ni, or an alloy including at least one kind thereof. In this case, employable in the first linear response magnetic body 160A is, for example, a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these. A material similar to that of the previously mentioned second magnetic layer 102 may be employed as the first linear response magnetic body 160A. Moreover, a material similar to that of the previously mentioned pinning layer 105 of the magnetoresistance layer may be employed as the linear response magnetic pinning layer. In addition, when the linear response magnetic pinning layer is provided, a under layer of the same material as described in the under layer of the magnetoresistance element may be provided below the linear response magnetic pinning layer. Moreover, the linear response magnetic pinning layer may be provided in a lower portion or an upper portion of the first linear response magnetic body 160A. A magnetization direction of the first linear response magnetic body 160A in this case can be set by heat treatment in a magnetic field, as described in the pinning layer of the magnetoresistance element.

The above-described first linear response magnetic body 160A may also be applied to any of the above-described first magnetoresistance elements 100 and the first magnetoresistance elements 100 to be described below. When employing the above-described kind of stacked structure of the first linear response magnetic body 160A and the linear response magnetic pinning layer, the direction of magnetization of the first linear response magnetic body 160A can be easily maintained even when a large current flows instantaneously as the current-to-be-measured and a large current-induced magnetic field is applied to the first linear response magnetic body 160A.

Figure 8A:
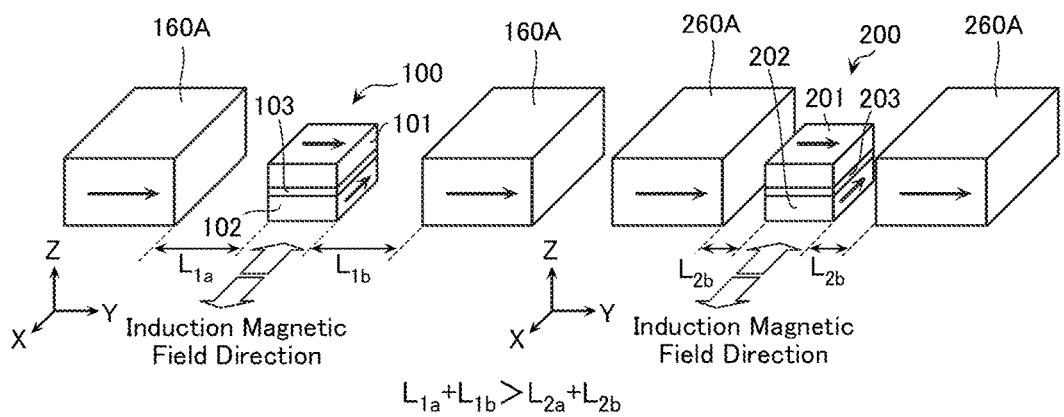
FIGS. 8A, 8B and 8C are schematic views showing examples of configuration of the current sensor according to the same embodiment.
Figure 8B:
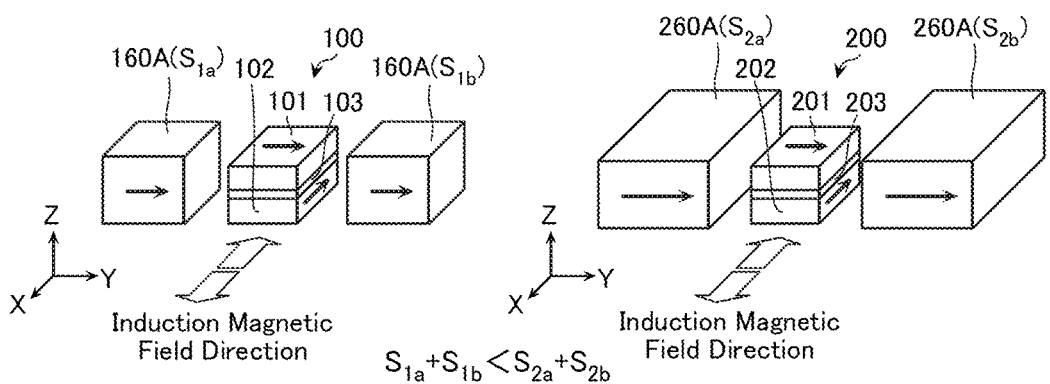
Figure 8C:
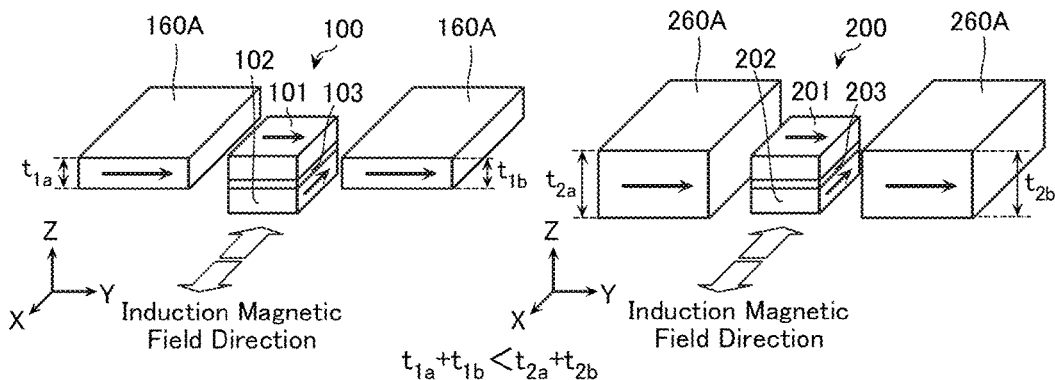

Now, magnetic field sensitivity ((dR/R)/2Hs) of the magnetoresistance element can be adjusted by configurations of the linear response magnetic body, and so on. FIGS. 8A to 8C show examples where a difference in configurations of the first linear response magnetic body 160A and a second linear response magnetic body 260A is provided to obtain different magnetic field sensitivities for two magnetoresistance elements. Note that in FIGS. 8A to 8C, examples where the current sensor comprises two magnetoresistance elements are described, but the current sensor may of course comprise three or more magnetoresistance elements. In addition, in FIGS. 8A to 8C, the case such as shown in FIG. 7 where the first or second linear response magnetic bodies 160A and 260A are provided adjacently to the side of the magnetoresistance element is described as an example, but similarly, different magnetic field sensitivities can be obtained even when the first or second linear response magnetic bodies are provided diagonally to the side of the magnetoresistance element. Note that in FIGS. 8A to 8C and drawings thereafter, 201, 202, and 203 respectively indicate the first magnetic layer (magnetization free layer), the intermediate layer, and the second magnetic layer (magnetization fixed layer) of the second magnetoresistance element 200.

As shown in FIG. 8A, it is possible to change magnetic field sensitivity by changing a distance between the magnetoresistance element and the first and second linear response magnetic bodies 160A and 260A. The sum $L_{1a}+L_{1b}$ of the distances between the first magnetoresistance element 100 and each of the pair of first linear response magnetic bodies 160A shown in FIG. 8A is set larger than the sum $L_{2a}+L_{2b}$ of the distances between the second magnetoresistance element 200 and each of the pair of second linear response magnetic bodies 260A shown in FIG. 8A. In this case, the larger the distance from the first or second linear response magnetic bodies 160A and 260A, the smaller becomes the magnetic field applied to the first or second magnetoresistance elements 100 and 200. Therefore, the saturation magnetic field Hs of the first magnetoresistance element 100 becomes smaller, and magnetic field sensitivity ((dR/R)/2Hs) of the first magnetoresistance element 100 is set higher compared to that of the second magnetoresistance element 200.

As shown in FIG. 8B, it is possible to change magnetic field sensitivity by changing area in a substrate planar surface of the first linear response magnetic body 160A and area in a substrate planar surface of the second linear response magnetic body 260A. The sum $S_{1a}+S_{1b}$ of each of areas of the pair of first linear response magnetic bodies 160A shown in FIG. 8B is set smaller than the sum $S_{2a}+S_{2b}$ of each of areas of the pair of second linear response magnetic bodies 260A shown in FIG. 8B. In this case, the larger the area of the first or second linear response magnetic bodies 160A and 260A, the larger becomes the magnetic volume of the first or second linear response magnetic bodies 160A and 260A. Therefore, the saturation magnetic field Hs of the first magnetoresistance element 100 becomes smaller, and magnetic field sensitivity ((dR/R)/2Hs) of the first magnetoresistance element 100 is set higher compared to that of the second magnetoresistance element 200.

As shown in FIG. 8C, it is possible to change magnetic field sensitivity by changing film thickness of the first and second linear response magnetic bodies 160A and 260A. The sum $t_{1a}+t_{1b}$ of each of film thicknesses of the pair of first linear response magnetic bodies 160A shown in FIG. 8C is set thinner than the sum $t_{2a}+t_{2b}$ of each of film thicknesses of the pair of second linear response magnetic bodies 260A shown in FIG. 8C. In this case, the larger the film thickness of the first and second linear response magnetic bodies 160A and 260A, the larger becomes the magnetic volume of the first and second linear response magnetic bodies 160A and 260A. Therefore, the saturation magnetic field Hs of the first magnetoresistance element 100 becomes smaller, and magnetic field sensitivity ((dR/R)/2Hs) of the first magnetoresistance element 100 is set higher compared to that of the second magnetoresistance element 200.

The above-mentioned FIGS. 8B and 8C described the case where magnetic volume is changed by changing area or film thickness of the first and second linear response magnetic bodies 160A and 260A, but magnetic volume can be changed also by changing a kind of magnetic material employed in the first and second linear response magnetic bodies 160A and 260A. For example, it is also possible to change magnetic volume and change magnetic field sensitivity of the first and second magnetoresistance elements 100 and 200 by employing magnetic materials having a different saturation magnetization in each of the first linear response magnetic body 160A and the second linear response magnetic body 260A.

Figure 9A:
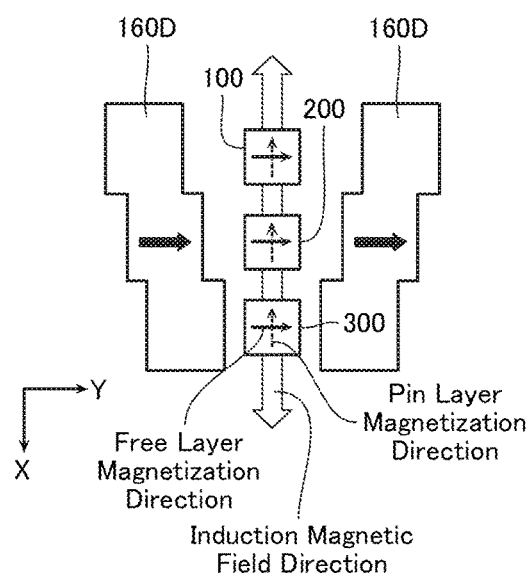
FIGS. 9A and 9B are schematic views showing other examples of configuration of the current sensor according to the same embodiment.
Figure 9B:
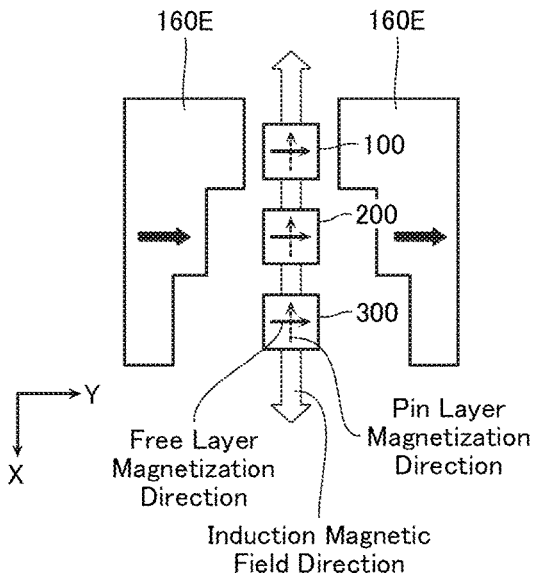

FIGS. 9A and 9B are schematic views for explaining the cases where a magnetic field from a pair of first linear response magnetic bodies 160D or 160E is applied to a plurality of magnetoresistance elements. The first linear response magnetic bodies 160D or 160E are other modes of the first linear response magnetic body 160. Such configurations also make it possible to change magnetic field sensitivity of each of the magnetoresistance elements. Note that in FIGS. 9A and 9B, examples where the current sensor comprises a third magnetoresistance element 300 in addition to the first magnetoresistance element 100 and the second magnetoresistance element 200 are described. However, the number of magnetoresistance elements may be two, or may be four or more.

As shown in FIG. 9A, it is possible to change magnetic field sensitivity of each of the magnetoresistance elements even by employing the pair of first linear response magnetic bodies 160D on the plurality of magnetoresistance elements. In FIG. 9A, widths in the magnetization direction (Y direction) of the first linear response magnetic bodies 160D are configured equally with respect to each of the magnetoresistance elements, but distances between each of the plurality of magnetoresistance elements and the pair of first linear response magnetic bodies 160D are different. By employing the first linear response magnetic body 160D of such a shape, the effective distances between the first linear response magnetic body 160D at its closest position to each of the magnetoresistance elements and each of the magnetoresistance elements are different, hence it becomes possible to change magnetic field sensitivity of each of the magnetoresistance elements as described in FIG. 8A.

As shown in FIG. 9B, it is possible to change magnetic field sensitivity of each of the magnetoresistance elements even by employing the pair of first linear response magnetic bodies 160E on the plurality of magnetoresistance elements. In FIG. 9B, widths in the magnetization direction (Y direction) of the first linear response magnetic bodies 160E are different with respect to each of the magnetoresistance elements, and distances between each of the plurality of magnetoresistance elements and the pair of first linear response magnetic bodies 160E are different. In the case of employing the first linear response magnetic body 160E of such a shape, the effective distances between the first linear response magnetic body 160E at its closest position to each of the magnetoresistance elements and each of the magnetoresistance elements and the effective areas of the first linear response magnetic body 160E at said positions are different, hence it becomes possible to change magnetic field sensitivity of each of the magnetoresistance elements as described in FIGS. 8A and 8B.

Figure 10:
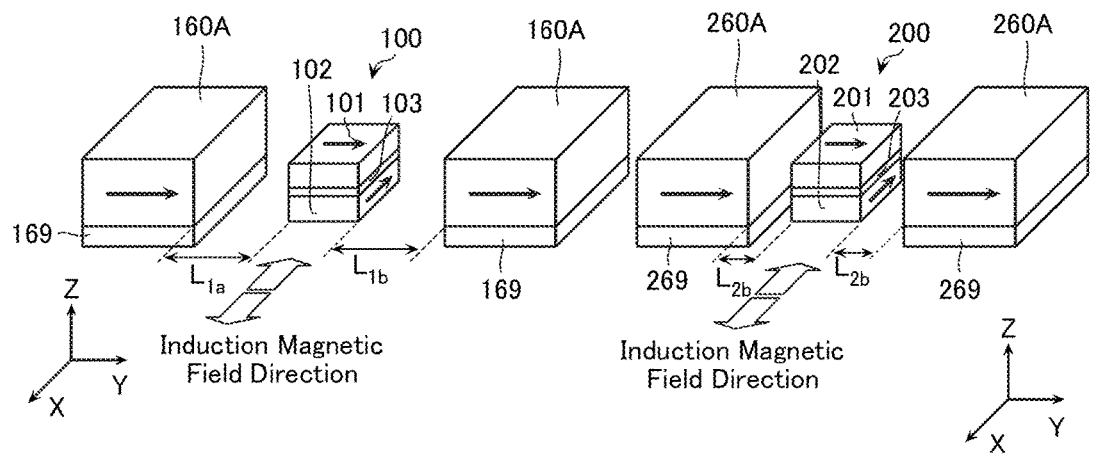
FIG. 10 is a schematic view showing another example of configuration of the current sensor according to the same embodiment.

Each of the linear response magnetic bodies 160A to 160E described heretofore may employ a hard ferromagnetic material of comparatively high magnetic anisotropy and coercivity such as Co—Pt, Fe—Pt, Co—Pd, Fe—Pd, and so on, and may employ the stacked structure of the linear response magnetic body and the linear response magnetic pinning layer. As a variation of FIG. 8A, FIG. 10 shows an example where linear response magnetic pinning layers 169 and 269 respectively contacting lower surfaces of the first linear response magnetic body 160A and the second linear response magnetic body 260A are disposed. The pinning layers 169 and 269 are examples of the linear response magnetic pinning layer. Note that FIG. 10 shows a modified example of FIG. 8A, but such a variation employing the linear response magnetic body and the linear response magnetic pinning layer may be applied also to any of the examples of FIGS. 7 to 9B. Moreover, the linear response magnetic pinning layer may be provided in a lower portion or an upper portion of the linear response magnetic body.

Figure 11A:
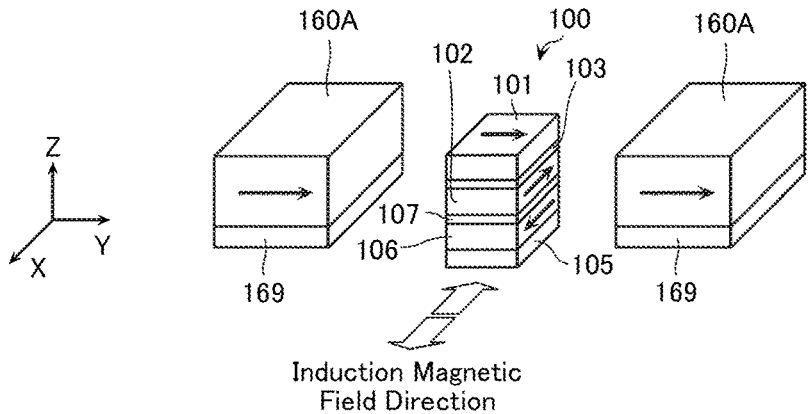
FIGS. 11A, 11B and 11C are schematic views showing other examples of configuration of the current sensor according to the same embodiment.
Figure 11B:
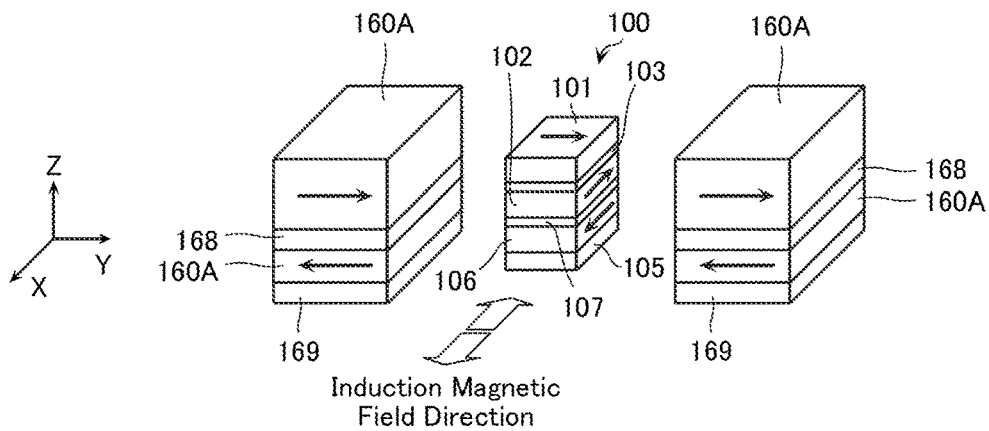
Figure 11C:
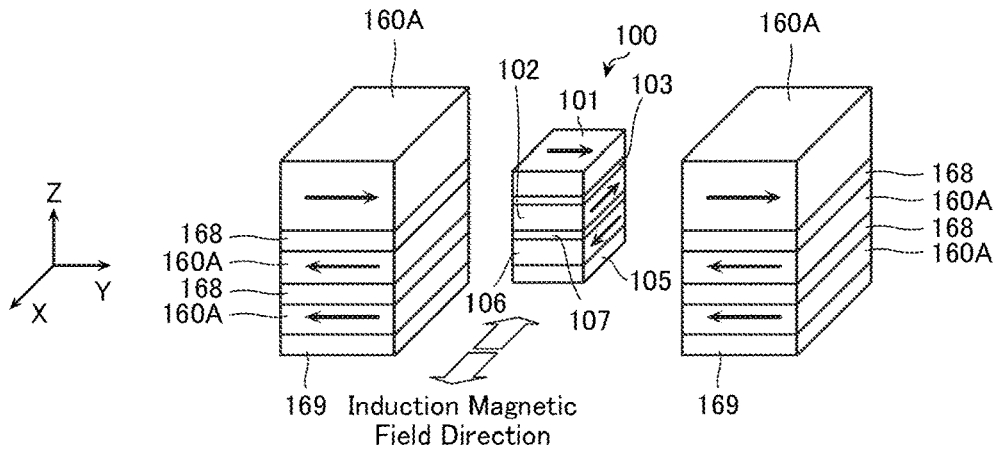

FIGS. 11A, 11B and 11C are schematic views showing examples of stacked configuration of the first linear response magnetic body 160A and the linear response magnetic pinning layer 169. When employing a stacked structure of the first linear response magnetic body 160A and the linear response magnetic pinning layer 169, it is possible to adopt not only the structure shown in FIG. 11A, but also a stacked structure of the kind of linear response magnetic pinning layer 169/linear response magnetic body 160A/linear response magnetic body-dedicated magnetic coupling layer 168/linear response magnetic body 160A as shown in FIG. 11B. Moreover, it is possible to stack three or more layers of linear response magnetic bodies 160A via linear response magnetic body-dedicated magnetic coupling layers 168, as shown in FIG. 11C. In the case of such a stacked structure, two linear response magnetic bodies 160A mediated by the linear response magnetic body-dedicated magnetic coupling layer 168 attain magnetization directions that are antiparallel to each other. In this case, magnetization of the first magnetic layer 101 is directed in a direction of magnetization of the first linear response magnetic body 160A whose distance is closest to the first magnetic layer 101 of the first magnetoresistance element 100. Moreover, when such a structure is employed, the thickness of the linear response magnetic body 160A whose distance is closest to the first magnetic layer 101 of the first magnetoresistance element 100 is preferably set larger than the thickness of another linear response magnetic body 160A included in the stacked structure.

When employing the stacked structure of the first linear response magnetic body 160A and the linear response magnetic pinning layer 169, the direction of magnetization of the first linear response magnetic body 160A can be easily maintained even when a large current flows instantaneously as the current-to-be-measured and a large current-induced magnetic field is applied to the first linear response magnetic body 160A.

[1-7. Vertically-Positioned Linear Response Magnetic Body]

Next, a relationship between the magnetoresistance element and the linear response magnetic body when the linear response magnetic body is disposed stacked on the magnetoresistance element will be described. In the description below, the first magnetoresistance element 100 and the first linear response magnetic body 160 are described as an example, but the likes of the second magnetoresistance element 200 or second linear response magnetic body 260, and so on, may also be similarly configured.

Figure 12:
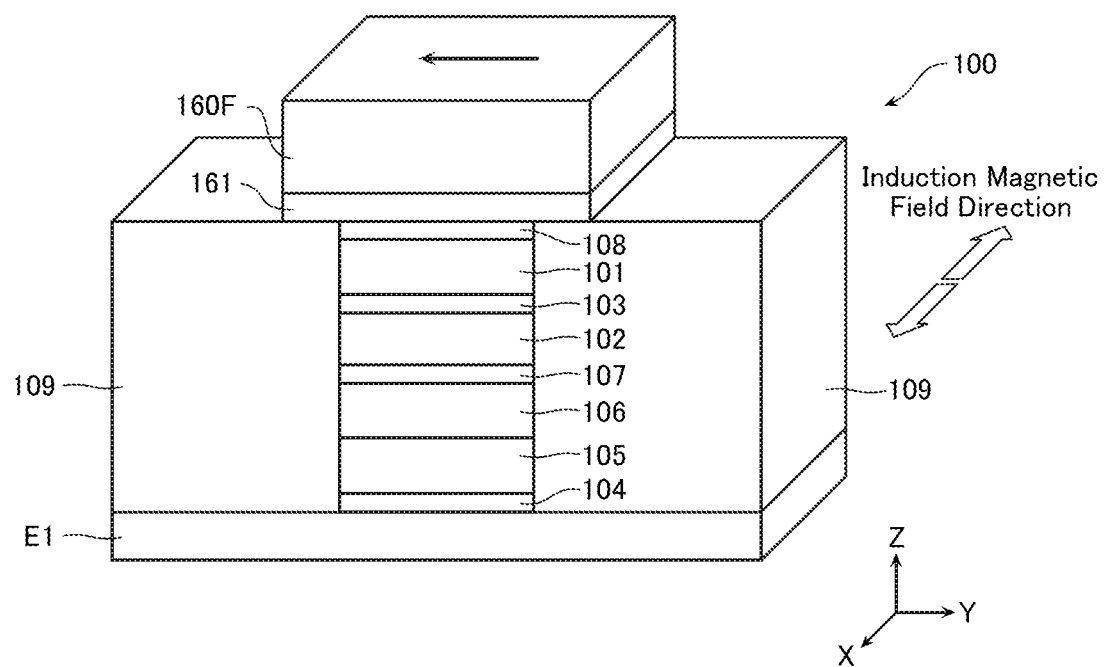
FIG. 12 is a schematic view showing another example of configuration of the current sensor according to the same embodiment.

FIG. 12 shows a schematic view of the first magnetoresistance element 100 and a first linear response magnetic body 160F that functions as the linear response magnetic body. The first linear response magnetic body 160F is another mode of the first linear response magnetic body 160. Note that in FIG. 12, the upper electrode E2 is omitted.

In the present embodiment, the first linear response magnetic body 160F is provided in a stacking direction of the first magnetoresistance element 100. For example, as shown in FIG. 12, the first linear response magnetic body 160F is provided above the cap layer 108 in the first magnetoresistance element 100. However, the first linear response magnetic body 160F may be provided below the under layer 104, for example. However, when the first magnetic layer 101 functioning as a magnetization free layer is positioned above the second magnetic layer 102 functioning as a magnetization fixed layer, the first linear response magnetic body 160F is more preferably disposed above the first magnetic layer 101, and when the first magnetic layer 101 is positioned below the second magnetic layer 102, the first linear response magnetic body 160F is more preferably disposed below the second magnetic layer 102.

In addition, as shown in FIG. 12, a under layer 161 dedicated to the first linear response magnetic body 160F may be provided between the first linear response magnetic body and the cap layer 108. In FIG. 12, by providing an upper electrode, not illustrated, on the first linear response magnetic body 160F, a current that has passed between the upper electrode and the lower electrode E1 flows in the first linear response magnetic body 160F and the magnetoresistance element. Moreover, the upper electrode may be provided between the first linear response magnetic body 160F and the cap layer 108.

Employing the first linear response magnetic body 160F makes it possible to obtain similar advantages to when employing the above-mentioned first linear response magnetic body 160A. Now, the first linear response magnetic body 160F is provided in a stacking direction of the first magnetic layer 101, and so on, hence a leakage magnetic field from the first linear response magnetic body 160F to the first magnetic layer 101 is reversely-directed to the magnetization direction of the first linear response magnetic body 160F. Note that such a first linear response magnetic body 160F may be used in combination with the previously mentioned linear response magnetic body.

Similar materials to those mentioned in the description of FIG. 7 can be used as materials employed in the first linear response magnetic body 160F or the linear response magnetic body-dedicated under layer 161. In the first linear response magnetic body disposed in the stacking direction as in FIG. 12, a leakage magnetic field is generated from an edge of the first linear response magnetic body 160F. Therefore, if area of the first linear response magnetic body 160F is made too large compared to area of the first magnetoresistance element 100, the magnetic field from the first linear response magnetic body 160F is not applied sufficiently to the first magnetoresistance element 100. Therefore, area of the first linear response magnetic body 160F must be appropriately set. For example, area of the first linear response magnetic body 160F is preferably about not less than equal to and not more than 25 times area of the first magnetoresistance element 100. Moreover, the first linear response magnetic body 160F may also employ the previously mentioned stacked structure of the linear response magnetic body and the linear response magnetic pinning layer. In this case, the direction of magnetization of the first linear response magnetic body 160F can be easily maintained even when a large current flows instantaneously as the current-to-be-measured and a large current-induced magnetic field is applied to the first linear response magnetic body 160F.

Figure 13A:
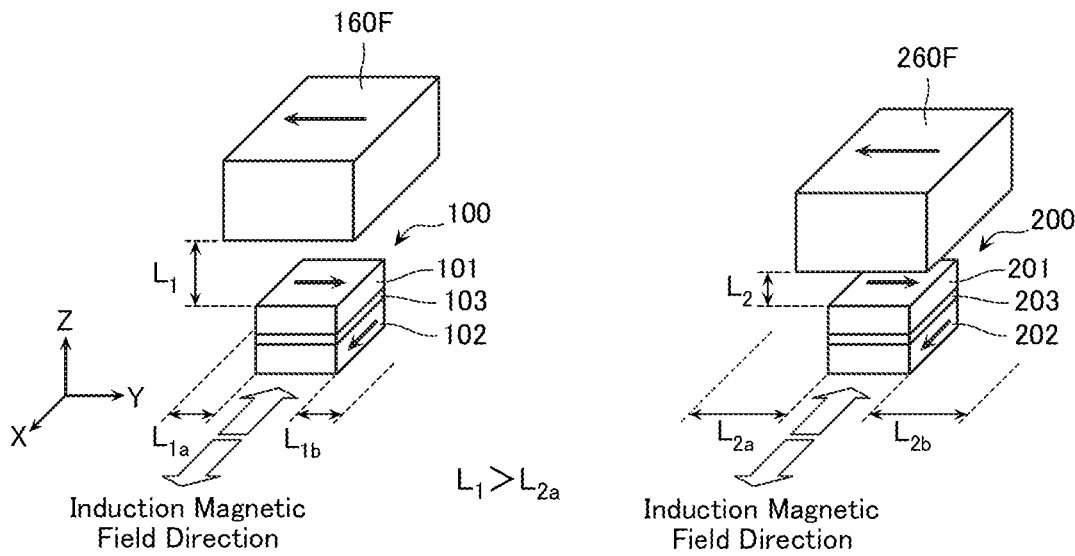
FIGS. 13A and 13B are schematic views showing examples of configuration of the current sensor according to the same embodiment.
Figure 13B:
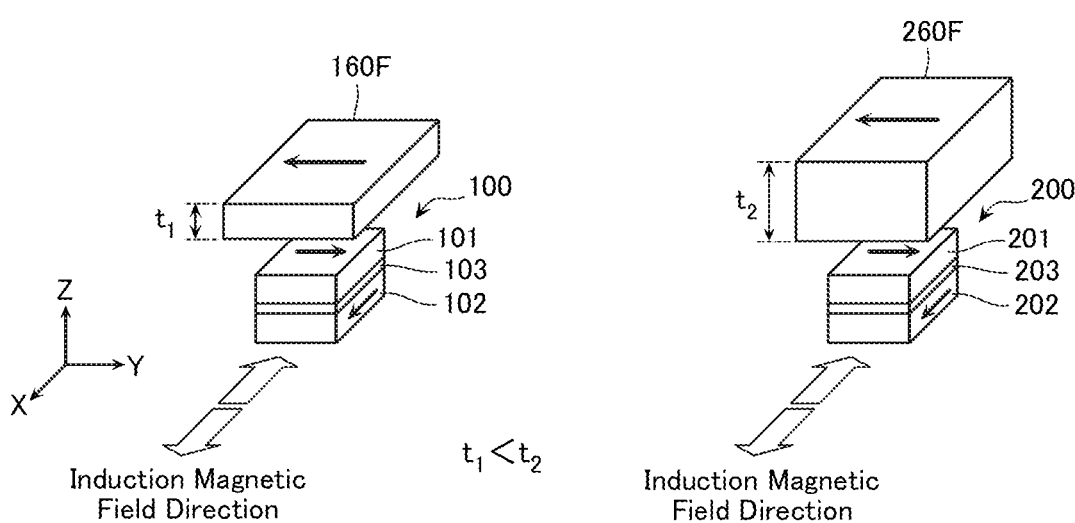

Now, magnetic field sensitivity ((dR/R)/2Hs) of the magnetoresistance element can be adjusted by configurations of the first linear response magnetic body 160F, and so on. FIGS. 13A and 13B show examples where a difference in configurations of the first linear response magnetic body 160F and a second linear response magnetic body 260F is provided to obtain different magnetic field sensitivities for two magnetoresistance elements. Note that in FIGS. 13A and 13B, two magnetoresistance elements are taken as an example, but three or more magnetoresistance elements may be adopted.

As shown in FIG. 13A, it is possible to change the magnetic field by changing a distance between the magnetoresistance element and the first and second linear response magnetic bodies 160F and 260F. A distance $L_1$ between the first magnetoresistance element 100 and the first linear response magnetic body 160F shown in FIG. 13A is set larger than a distance $L_2$ between the second magnetoresistance element 200 and the second linear response magnetic body 260F shown in FIG. 13A. In this case, the larger the distance from the first or second linear response magnetic bodies 160F and 260F, the smaller becomes the magnetic field applied to the first or second magnetoresistance elements 100 and 200. Therefore, the saturation magnetic field Hs of the first magnetoresistance element 100 becomes smaller, and magnetic field sensitivity ((dR/R)/2Hs) of the first magnetoresistance element 100 is set higher compared to that of the second magnetoresistance element 200.

As shown in FIG. 13B, it is possible to change the magnetic field by changing film thickness of the first and second linear response magnetic bodies 160F and 260F. A film thickness $t_1$ of the first linear response magnetic body 160F shown in FIG. 13B is set smaller than a film thickness $t_2$ of the second linear response magnetic body 260F shown in FIG. 13B. In this case, the larger the film thickness of the first or second linear response magnetic bodies 160F and 260F, the larger becomes the magnetic volume of the first or second linear response magnetic bodies 160F and 260F.

Therefore, the saturation magnetic field Hs of the first magnetoresistance element 100 becomes smaller, and magnetic field sensitivity ((dR/R)/2Hs) of the first magnetoresistance element 100 is set higher compared to that of the second magnetoresistance element 200.

FIG. 13B described the case where magnetic volume is changed by changing film thickness of the first and second linear response magnetic bodies 160F and 260F, but magnetic volume can be changed also by changing a kind of magnetic material employed in the first and second linear response magnetic bodies 160F and 260F. For example, it is also possible to change magnetic volume and change magnetic field sensitivity ((dR/R)/2Hs) of the first and second magnetoresistance elements 100 and 200 by employing magnetic materials having a different saturation magnetization in each of the first linear response magnetic body 160F and the second linear response magnetic body 260F.

Moreover, as previously mentioned, it is possible to change the magnetic field by changing area of the first and second linear response magnetic bodies 160F and 260F. When the first and second linear response magnetic bodies 160F and 260F are disposed in the stacking direction with respect to the first and second magnetoresistance elements 100 and 200, the greater a distance of ends of the first and second linear response magnetic bodies 160F and 260F from ends of the first and second magnetoresistance elements 100 and 200, the smaller becomes the magnetic field applied to the first and second magnetoresistance elements 100 and 200, and the higher becomes magnetic field sensitivity ((dR/R)/2Hs) of the first and second magnetoresistance elements 100 and 200.

Moreover, similarly to the case of FIGS. 8A to 8C where the first linear response magnetic body 160 is adjoined from a planar surface direction, it is also possible in the first linear response magnetic body 160 disposed in the stacking direction for sensitivity of a plurality of magnetoresistance elements to be adjusted by one first linear response magnetic body 160 of changed shape.

[1-8. In-Stack Type Linear Response Magnetic Body]

Next, a relationship between the magnetoresistance element and the linear response magnetic body when the linear response magnetic body is included in the magnetoresistance element will be described. The description below takes as an example the first magnetoresistance element 100 and the first linear response magnetic body 160, but the likes of the second magnetoresistance element 200 or second linear response magnetic body 260, and so on, may also be similarly configured.

Figure 14A:
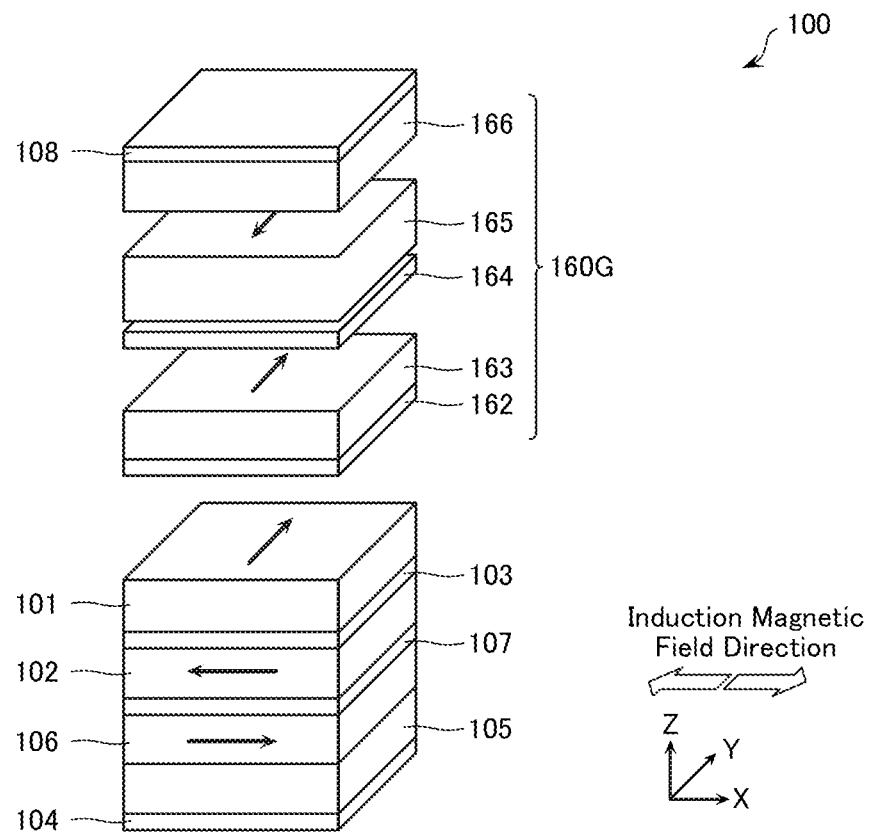
FIGS. 14A and 14B are schematic views of the first magnetoresistance element 100 and a first linear response magnetic body 160G according to the same embodiment.

FIG. 14A shows a schematic view of the first magnetoresistance element 100 and a first linear response magnetic body 160G according to the present embodiment. The first linear response magnetic body 160G is one mode of the first linear response magnetic body 160.

In the mode shown in FIG. 14A, the first magnetoresistance element 100 includes the first linear response magnetic body 160G. The first linear response magnetic body 160G is configured as an in-stack bias layer configured from a stacked structure. Therefore, the first linear response magnetic body 160G can adjust magnetic field sensitivity of the first magnetoresistance element 100, by an exchange coupling magnetic field between magnetization of a bias magnetic layer included inside the first linear response magnetic body 160G and a magnetization free layer. For example, setting a magnetization direction of the first linear response magnetic body 160G substantially perpendicularly to the current-induced magnetic field generated from the current-to-be-measured makes it possible to obtain similar advantages to when employing the above-mentioned first linear response magnetic body 160A.

In the mode indicated in FIG. 14A, the first linear response magnetic body 160G includes: an isolating layer 162; a first bias magnetic layer 163; a bias magnetic coupling layer 164; a second bias magnetic layer 165; and a bias pinning layer 166.

The first bias magnetic layer 163 and the second bias magnetic layer 165 are formed by a magnetic material, for example. Magnetization of the second bias magnetic layer 165 is fixed in one direction by the bias pinning layer 166. Magnetization of the first bias magnetic layer 163 is set oppositely to magnetization of the second bias magnetic layer 165 that neighbors the first bias magnetic layer 163 via the bias magnetic coupling layer 164. The first bias magnetic layer 163 whose magnetization is fixed in one direction applies a bias to the first magnetic layer 101 by magnetic coupling such as exchange coupling. When such a linear response magnetic body 160G configured from a stacked structure of the bias magnetic layer and the bias pinning layer is employed, the direction of magnetization of the first linear response magnetic body 160G can be easily maintained even when a large current flows instantaneously as the current-to-be-measured and a large current-induced magnetic field is applied to the first linear response magnetic body 160G.

The isolating layer 162 is formed from the likes of a non-magnetic material, for example, and by physically isolating the first bias magnetic layer 163 and the first magnetic layer 101, adjusts intensity of magnetic coupling between the first bias magnetic layer 163 and the first magnetic layer 101. Note that depending on a material of the first bias magnetic layer 163, the isolating layer 162 need not necessarily be provided. Setting magnetization of a plurality of bias magnetic layers to be antiparallel (180°) as in FIG. 14A makes it possible to suppress a leakage magnetic field from the bias magnetic layer to external and suppress magnetic interference other than bias application due to exchange coupling to the magnetization free layer.

As shown in FIG. 14A, the first linear response magnetic body 160G includes first bias magnetic layer 163/bias magnetic coupling layer 164/second bias magnetic layer 165, but may be configured by providing only a single-layer first bias magnetic layer 163 between the isolating layer 162 and the bias pinning layer 166. Moreover, three or more layers of bias magnetic layers may be adopted, as in first bias magnetic layer/first magnetic coupling layer/second bias magnetic layer/second magnetic coupling layer/third bias magnetic layer.

Employed in the isolating layer 162 is, for example, Cu of 5 nm. Employed in the first bias magnetic layer 163 is, for example, $Fe_{50}Co_{50}$ of 3 nm. Employed in the bias magnetic coupling layer 164 is, for example, Ru of 0.9 nm. Employed in the second bias magnetic layer 165 is, for example, $Fe_{50}Co_{50}$ of 3 nm. Employed in the bias pinning layer 166 is, for example, IrMn of 7 nm.

Employable in the first bias magnetic layer 163 and the second bias magnetic layer 165 is, for example, at least one selected from the group configured by Co, Fe, and Ni. Also employable as the first bias magnetic layer 163 is an alloy including at least one material selected from the group configured by Co, Fe, and Ni. For example, employed in the first bias magnetic layer 163 is a $Co_xFe_{100-x}$ alloy (where x is not less than 0 at. % and not more than 100 at. %), a $Ni_xFe_{100-x}$ alloy (where x is not less than 0 at. % and not more than 100 at. %), or a material having a non-magnetic element added to these alloys. Employable as the first bias magnetic layer 163 is a $(Co_xFe_{100-x})_{100-y}B_y$ alloy (where x is not less than 0 at. % and not more than 100 at. %, and y is not less than 0 at. % and not more than 30 at. %).

Employed in the isolating layer 162 is, for example, a non-magnetic material. Employable in the isolating layer 162 is, for example, Cu, Ru, Rh, Ir, V, Cr, Nb, Mo, Ta, W, Rr, Au, Ag, Pt, Pd, Ti, Zr, Hf, and a layer including at least one element selected from the group of Hf.

The bias pinning layer 166 gives unidirectional anisotropy to the second bias magnetic layer 165 formed contacting the bias pinning layer, and thereby fixes magnetization of the first bias magnetic layer 163. Employed in the bias pinning layer 166 is, for example, an antiferromagnetic layer. Employed in the bias pinning layer 166 is, for example, at least one selected from the group configured by Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. It is also possible to employ an alloy having an additional element further added to the Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. A thickness of the bias pinning layer 166 is appropriately set to give sufficiently strong unidirectional anisotropy.

When PtMn or PdPtMn are employed as the bias pinning layer 166, the thickness of the bias pinning layer 166 is preferably not less than 8 nm and not more than 20 nm. The thickness of the bias pinning layer 166 is more preferably not less than 10 nm and not more than 15 nm. When IrMn is employed as the bias pinning layer 166, unidirectional anisotropy may be given to the first bias magnetic layer 163 by a bias pinning layer 166 which is thinner than when PtMn is employed as the bias pinning layer 166. In this case, the thickness of the bias pinning layer 166 is preferably not less than 4 nm and not more than 18 nm. The thickness of the bias pinning layer 166 is more preferably not less than 5 nm and not more than 15 nm.

A hard magnetic layer (hard ferromagnetic material) may be employed as the bias pinning layer 166. For example, a hard magnetic material (hard ferromagnetic material) of comparatively high magnetic anisotropy and coercivity such as Co—Pt, Fe—Pt, Co—Pd, Fe—Pd, and so on, may be employed. Moreover, an alloy having an additional element further added to Co—Pt, Fe—Pt, Co—Pd, and Fe—Pd may be employed. Employable as the hard magnetic layer is, for example, CoPt (where a percentage of Co is not less than 50 at. % and not more than 85 at. %), $(Co_xPt_{100-x})_{100-y}Cr_y$ (where x is not less than 50 at. % and not more than 85 at. %, and y is not less than 0 at. % and not more than 40 at. %), or FePt (where a percentage of Pt is not less than 40 at. % and not more than 60 at. %), and so on.

The bias magnetic coupling layer 164 generates antiferromagnetic coupling between the first bias magnetic layer 163 and the second bias magnetic layer 165. The bias magnetic coupling layer 164 forms a synthetic pin structure. Employed as the bias magnetic coupling layer 164 is, for example, Ru. A thickness of the bias magnetic coupling layer 164 is preferably not less than 0.8 nm and not more than 1 nm. A material other than Ru may be employed as the bias magnetic coupling layer 164, provided it is a material generating sufficient antiferromagnetic coupling between the first bias magnetic layer 163 and the second bias magnetic layer 165. The thickness of the bias magnetic coupling layer 164 may be set to a thickness of not less than 0.8 nm and not more than 1 nm corresponding to a second peak of RKKY (Ruderman-Kittel-Kasuya-Yosida) coupling. Furthermore, the thickness of the bias magnetic coupling layer 164 may be set to a thickness of not less than 0.3 nm and not more than 0.6 nm corresponding to a first peak of RKKY coupling. Employed as the bias magnetic coupling layer 164 is, for example, Ru having a thickness of 0.9 nm. As a result, highly reliable coupling can be more stably obtained.

A thickness of the first bias magnetic layer 163 is preferably not less than 1.5 nm and not more than 5 nm, for example. A thickness of the second bias magnetic layer 165 is preferably not less than 1.5 nm and not more than 5 nm, for example. As a result, for example, intensity of the unidirectional anisotropic magnetic field due to the bias pinning layer 166 can be more greatly strengthened. Magnetic film thickness (product (Bs·t) of saturation magnetization Bs and thickness t) of the first bias magnetic layer 163 is preferably substantively equal to magnetic film thickness of the second bias magnetic layer 165.

A direction of the bias magnetic field applied to the first magnetic layer 101 from the first linear response magnetic body 160G can be set to any direction with respect to the magnetization direction of the second magnetic layer 102.

Figure 14B:
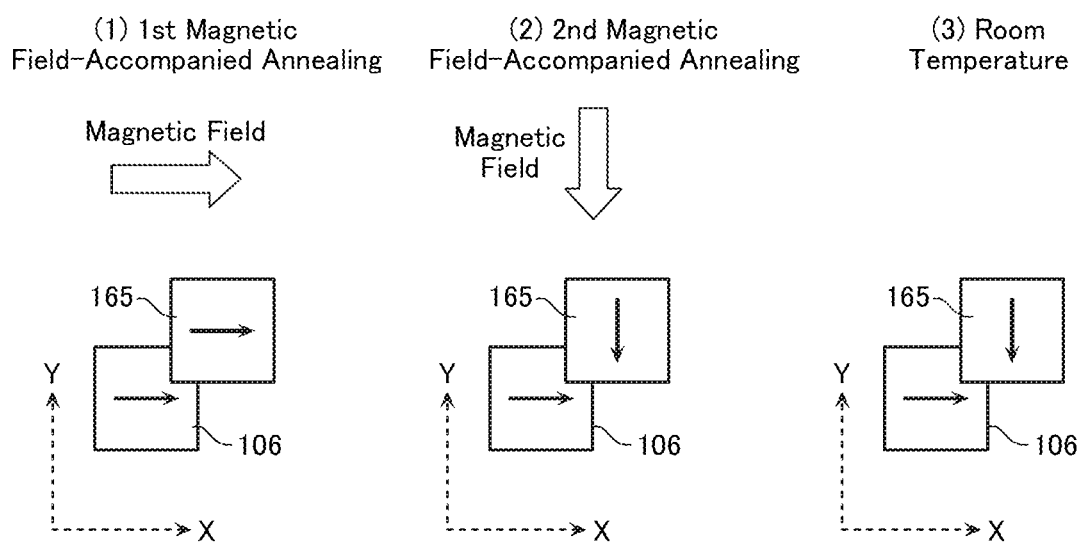

FIG. 14B is a schematic view for explaining a setting method of the magnetization direction in the first linear response magnetic body 160G. For example, it is also possible to set the direction of the bias magnetic field applied to the first magnetic layer 101 from the first linear response magnetic body 160G to 90° (or 270°) with respect to the magnetization direction of the second magnetic layer 102. Such a setting of direction of the offset magnetic field is made possible by selection of two-step magnetic field-accompanied annealing and of configuration of materials employed in the pinning layer 105 and configuration of materials employed in the bias pinning layer 166.

A temperature at which magnetization fixing occurs for an antiferromagnetic material employed in the pinning layer 105 or bias pinning layer 166 differs according to composition of the antiferromagnetic material. For example, the temperature at which magnetization fixing is performed for a material of an ordered alloy system such as PtMn is higher compared to a material that causes magnetization fixing even disordered such as IrMn. For example, it is possible to employ PtMn in the pinning layer 105 and IrMn in the bias pinning layer 166.

Next, two-step heat treatment in a magnetic field such as shown in FIG. 14B is performed. For example, as indicated in (1) of FIG. 14B, annealing is performed for 10 hours at 320° C. while applying a magnetic field in a rightward direction of FIG. 14B. As a result, the magnetization direction of the second magnetization fixed layer 106 contacting the pinning layer 105 is fixed facing right. Moreover, the magnetization direction of the second bias magnetic layer 165 contacting the bias pinning layer 166 is once fixed facing right.

Next, for example, as indicated in (2) of FIG. 14B, annealing is performed for one hour at 260° C. while applying a magnetic field in a downward direction of FIG. 14B. As a result, the magnetization direction of the second magnetization fixed layer 106 contacting the pinning layer 105 remains unchanged facing right, and the magnetization direction of the second bias magnetic layer 165 contacting the bias pinning layer 166 is fixed facing downward. As shown in the diagram on the right of FIG. 14B, this orientation of magnetization is maintained at room temperature.

Selection of the method of magnetic field-accompanied annealing and of configuration of the material of the pinning layer 105 and configuration of the material of the bias pinning layer 166 in this way makes it possible to arbitrarily set the direction of the bias magnetic field to the first magnetic layer 101 and the second magnetic layer 102. In addition, a temperature difference of magnetization fixing of the pinning layer 105 and the bias pinning layer 166 can also be set by a film thickness of the respective layers and not only by selection of respective materials. For example, it is possible to perform the alignment of magnetization directions of the kind shown in FIG. 14A by performing the magnetic field-accompanied two-step annealing shown in FIG. 14B, even when IrMn of 7 nm is employed in the pinning layer 105 and IrMn of 5 nm is employed in the bias pinning layer 166.

Now, magnetic field sensitivity ((dR/R)/2Hs) of the magnetoresistance element can be adjusted by the configuration of the in-stack bias layer. For example, the first magnetoresistance element 100 and first linear response magnetic body 160G are configured as shown in FIG. 14A, and the second magnetoresistance element 200 and second linear response magnetic body 260 are further configured similarly to these. However, in the second linear response magnetic body 260, the isolating layer 162 is made thicker compared to in the first linear response magnetic body 160G. As a result, the bias magnetic field for the first magnetoresistance element 100 weakens relatively. In addition, it is possible to change the bias magnetic field also by differentiating thicknesses of the first bias magnetic layer 163 and the second bias magnetic layer 165 between the two magnetoresistance elements. In this case, increasing the thicknesses of the first bias magnetic layer 163 and the second bias magnetic layer 165 causes the bias magnetic field applied to the first magnetic layer 101 to weaken. Therefore, saturation magnetization Hs lowers, and magnetic field sensitivity ((dR/R)/2Hs) is set high.

Figure 15A:
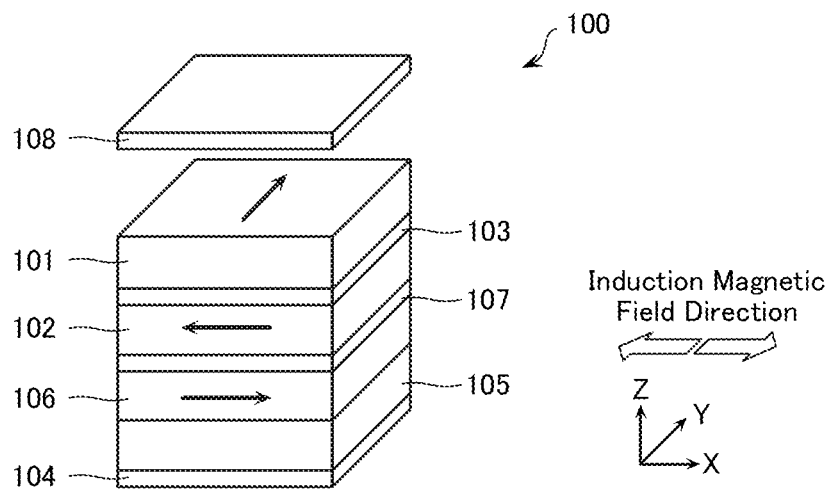
FIGS. 15A and 15B are schematic views showing another example of configuration of the current sensor according to the same embodiment.
Figure 15B:
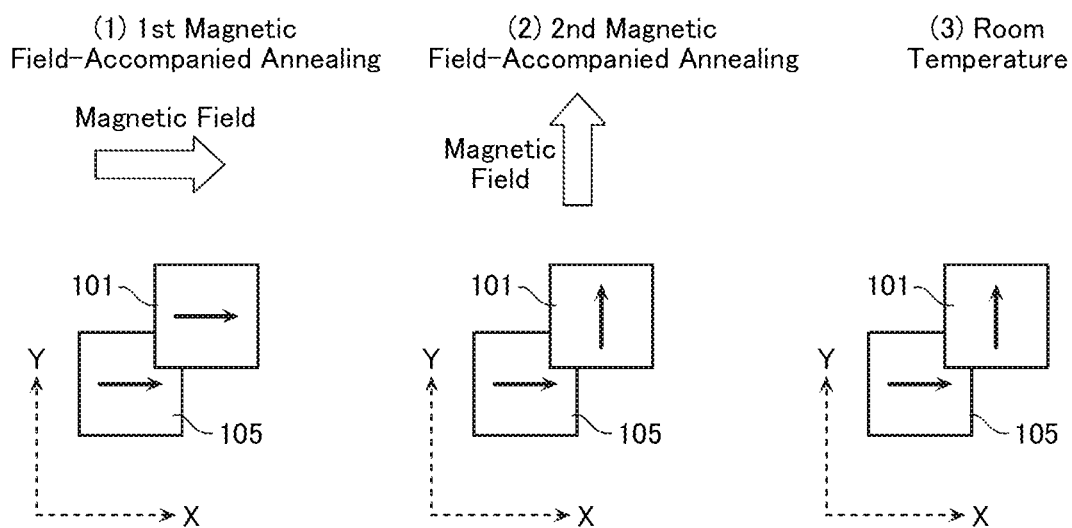

Note that the description heretofore described performing two-step magnetic field-accompanied annealing for setting the magnetization direction of the first linear response magnetic body 160G. Now, when employing such a two-step magnetic field-accompanied annealing, it is also possible to set the magnetization direction of the first magnetic layer 101. FIGS. 15A and 15B are schematic views for explaining a method for this. Such a method also enables the magnetization direction of a magnetization free layer to be orthogonalized with the magnetization direction of a magnetization fixed layer, as shown in FIG. 3B, for example, and enables linear responsiveness to positive/negative magnetic fields, as shown in FIG. 3D.

In order to set the magnetization direction of the first magnetic layer 101 and the magnetization direction of the second magnetic layer 102 to different directions, for example, a first heat treatment in a magnetic field is performed as shown in the diagram on the left of FIG. 15B. The first heat treatment in a magnetic field is performed by, for example, performing annealing for 10 hours at 320° C. while applying a magnetic field in a rightward direction of FIG. 15B. As a result, the magnetization direction of the second magnetization fixed layer 106 contacting the pinning layer 105 is fixed facing right.

Next, for example, a second heat treatment in a magnetic field is performed. The second heat treatment in a magnetic field is performed by, for example, performing annealing while applying a magnetic field in an upward direction of FIG. 15B, as shown in the diagram in the center of FIG. 15B. A temperature at this time is a temperature lower than 320° C., and is set to a temperature lower than a magnetization fixing temperature of an antiferromagnetic body employed in the bias pinning layer 166. As a result, the magnetization direction of the first magnetic layer 101 can be set facing upward, with the magnetization direction of the second magnetization fixed layer 106 unchanged set facing right. That is, a direction of induction magnetic anisotropy of the first magnetic layer 101 can be set in an up/down direction.

Now, magnetic field sensitivity ((dR/R)/2Hs) of the magnetoresistance element can be adjusted by temperature or time of the second heat treatment in a magnetic field of the two-step annealing. For example, by producing the first magnetoresistance element 100 and the second magnetoresistance element 200 and setting a time of the second heat treatment in a magnetic field during manufacturing of the first magnetoresistance element 100 to be longer than a time of the second heat treatment in a magnetic field during manufacturing of the second magnetoresistance element 200, the induction magnetic anisotropy of the first magnetic layer of the second magnetoresistance element 200 becomes higher than that of the first magnetoresistance element 100, hence Hs increases and magnetic field sensitivity ((dR/R)/2Hs) is set low.

[1-9. Manufacturing Method]

Next, a manufacturing method of the current sensor according to the present embodiment will be described. FIGS. 16A to 16J are stepwise schematic perspective views illustrating the manufacturing method of the current sensor according to the present embodiment.

Figure 16A:
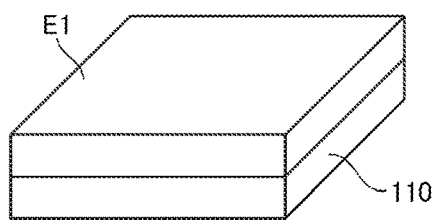
FIGS. 16A, 16B, 16C, 16D, 16E, 16F, 16G, 16H, 16I and 16J are schematic perspective views illustrating a manufacturing method of the current sensor according to the same embodiment.

As indicated in FIG. 16A, the lower electrode E1 is formed on a substrate 110. For example, Ta (5 nm)/Cu (200 nm)/Ta (35 nm) is formed. After this, surface smoothing processing such as CMP processing is performed on an outermost surface of the lower electrode E1, and a configuration formed on the lower electrode E1 may be planarized.

Figure 16F:
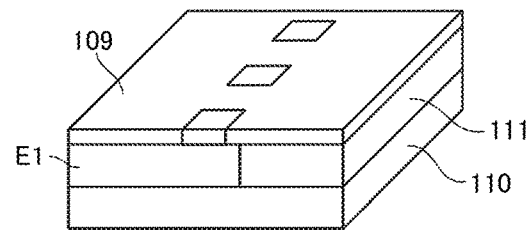
Figure 16B:
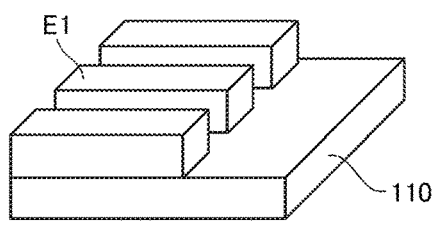

Next, as shown in FIG. 16B, a planar shape of the lower electrode E1 is patterned. In this step, resist undergoes patterning by photolithography, and then physical milling or chemical milling is performed using a resist pattern not illustrated as a mask. For example, Ar ion milling is used.

Figure 16G:
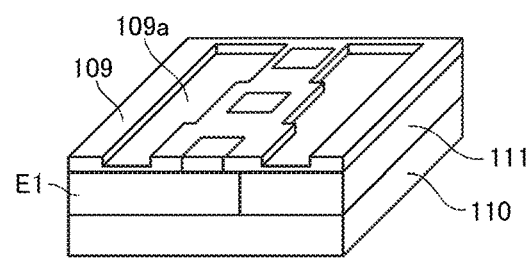
Figure 16C:
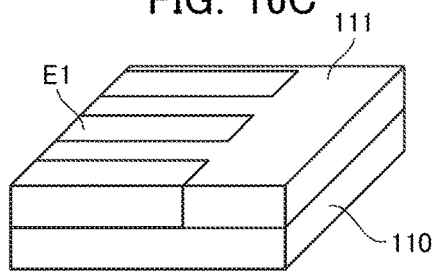

Next, as shown in FIG. 16C, film formation filling a periphery of the lower electrode E1 with an insulating layer 111 is performed. In this step, for example, a lift-off process is used. For example, the insulating layer 111 is formed on the entire surface in a state where the resist pattern formed by photolithography of FIG. 16B is left unchanged, and then the resist pattern is removed. Employable as the insulating layer 111 are, for example, $SiO_x$, $AlO_x$, $SiN_x$, $AlN_x$, and so on.

Next, the magnetoresistance element are deposited on the lower electrode E1. For example, Ta (3 nm)/Ru (2 nm) is formed as the under layer 104. IrMn (7 nm) is formed thereon as the pinning layer 105. $Co_{75}Fe_{25}$ (2.5 nm)/Ru (0.9 nm)/$Co_{40}Fe_{40}B_{20}$ (3 nm) is formed thereon as the second magnetic layer 102. MgO (2 nm) is formed thereon as the intermediate layer 103. $Co_{40}Fe_{40}B_{20}$ (2 nm)/Ta (0.4 nm)/$Ni_{80}Fe_{20}$ (6 nm) is formed thereon as the first magnetic layer 101. Cu (1 nm)/Ta (2 nm)/Ru (5 nm) is formed thereon as the cap layer 108.

Next, magnetic field-accompanied annealing that fixes the magnetization direction of the second magnetic layer 102 is performed. For example, annealing for one hour at 300° C. while applying a magnetic field of 7 kOe is performed. For example, this annealing is performed applying an external magnetic field substantially parallelly to the current-induced magnetic field application direction (X direction). Now, in such cases as when, for example, the previously mentioned linear response magnetic body (160G, FIG. 14A) provided with an in-stack bias layer is employed, two-step annealing may be performed.

Figure 16H:
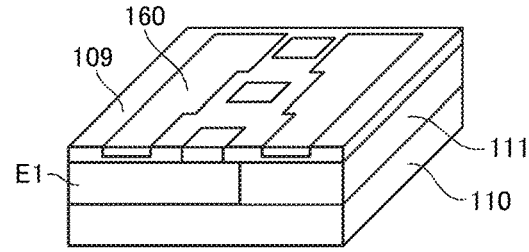
Figure 16D:
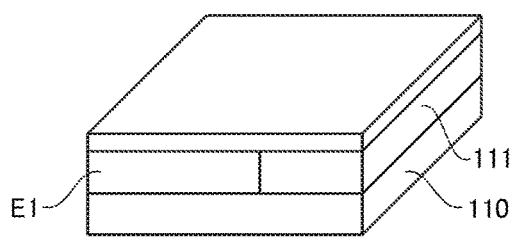
Figure 16I:
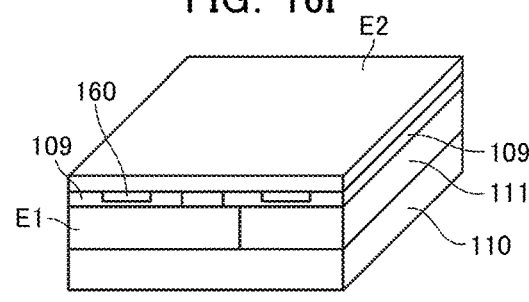
Figure 16E:
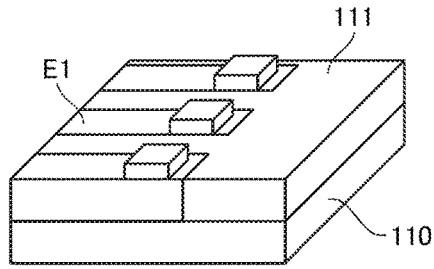

Next, as shown in FIG. 16E, a planar shape of the magnetoresistance element is patterned. In this step, resist undergoes patterning by photolithography, and then physical milling or chemical milling are performed using a resist pattern not illustrated as a mask. This step makes it possible to batch process a plurality of configurations as shown in FIG. 16E.

Next, as shown in FIG. 16F, film formation filling a periphery of the magnetoresistance element with an insulating layer 109 is performed. In this step, for example, a lift-off process is performed. For example, the insulating layer 109 is formed on the entire surface in a state where the resist pattern formed by photolithography of FIG. 16E is left unchanged, and then the resist pattern is removed. Employable as the insulating layer 109 are, for example, $SiO_x$, $AlO_x$, $SiN_x$, $AlN_x$, and so on.

Next, as shown in FIG. 16G, a hole 109a for embedding the first linear response magnetic body 160 provided adjacent to the magnetoresistance element is formed. In this step, resist undergoes patterning by photolithography, and then physical milling or chemical milling is performed using a resist pattern not illustrated as a mask. FIG. 16G takes as an example the case where a pair of first linear response magnetic bodies 160E are formed with respect to a plurality of magnetoresistance elements, but batch processing can be performed even when linear response magnetic bodies are formed individually with respect to a plurality of magnetoresistance elements. In this step, processing may be performed until the hole 109a penetrates the insulating layer 109, or may be stopped along the way. FIG. 16G illustrates the case where processing is stopped along the way. Although mentioned later, when the hole 109a is etched until it penetrates the insulating layer 109, an insulating layer not illustrated needs to be formed under the first linear response magnetic body 160 in an embedding step of the first linear response magnetic body 160 shown in FIG. 16H.

Next, as shown in FIG. 16H, the first linear response magnetic body 160E is embedded in the hole 109a formed in FIG. 16G. In this step, for example, a lift-off process is performed. For example, the first linear response magnetic body 160E is deposited on the entire surface in a state where a resist pattern formed by photolithography of FIG. 16H is left unchanged, and then the resist pattern is removed. Now, for example, Cr (5 nm) is formed as the first linear response magnetic body 160E-dedicated under layer, and, for example, $Co_{80}Pt_{20}$ (20 nm) is formed thereon as the first linear response magnetic body 160E. A cap layer not illustrated may be further formed thereon. Employable as this cap layer is the material mentioned above as a material usable in the cap layer 108 of the magnetoresistance element, or an insulating layer of the likes of $SiO_x$, $AlO_x$, $SiN_x$, and $AlN_x$. In FIG. 16H, after the first linear response magnetic body 160E has been embedded, an external magnetic field is applied at room temperature to perform setting of the magnetization direction of the hard magnetic layer (hard ferromagnetic material) included in the first linear response magnetic body 160E. For example, application of an external magnetic field in a substantially perpendicular direction to the direction of the current-induced magnetic field is performed. Setting of the magnetization direction of the first linear response magnetic body 160E by this external magnetic field, provided it is performed after embedding of the first linear response magnetic body 160E, may be performed at timings such as before removal of the resist pattern, after removal of the resist pattern, after processing of the upper electrode E2 shown in FIG. 16J, and so on.

Figure 16J:
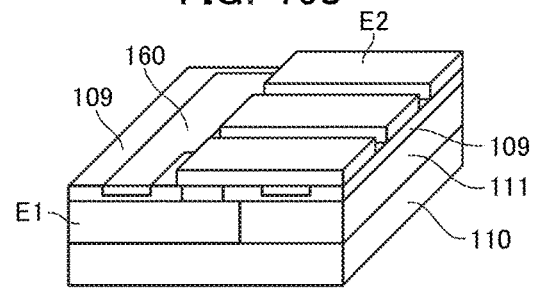

Next, as shown in FIG. 16I, the upper electrode E2 is deposited. Next, as shown in FIG. 16J, a planar shape of the upper electrode E2 is processed. In this step, resist undergoes patterning by photolithography, and then physical milling or chemical milling is performed using a resist pattern not illustrated as a mask.

The manufacturing method according to such a mode makes it possible to manufacture the current sensor according to the present embodiment without increase in the number of steps. Note that although not illustrated in FIGS. 16A to 16J, formation of a contact hole to the lower electrode E1 may be performed, or a protective film may be formed after processing of the upper electrode E2.

Next, another manufacturing method of the current sensor according to the present embodiment will be described. FIGS. 17A to 17J are stepwise schematic perspective views illustrating the other manufacturing method of the current sensor according to the present embodiment. Note that steps shown in FIGS. 17A to 17D are similar to steps shown in FIGS. 16A to 16D, hence descriptions thereof will be omitted.

Figure 17A:
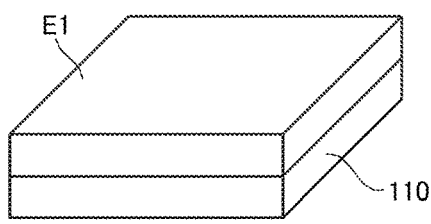
FIGS. 17A, 17B, 17C, 17D, 17E, 17F, 17G, 17H, 17I and 17J are schematic perspective views illustrating another manufacturing method of the current sensor according to the same embodiment.
Figure 17F:
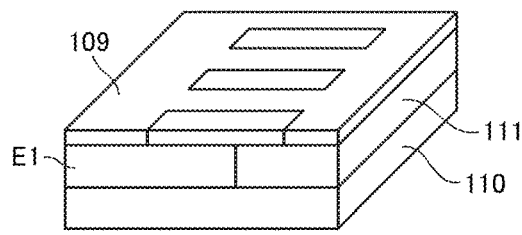
Figure 17B:
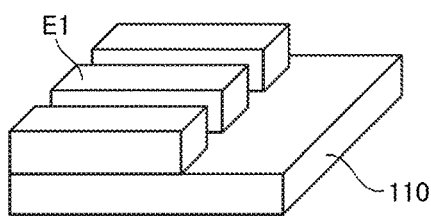
Figure 17G:
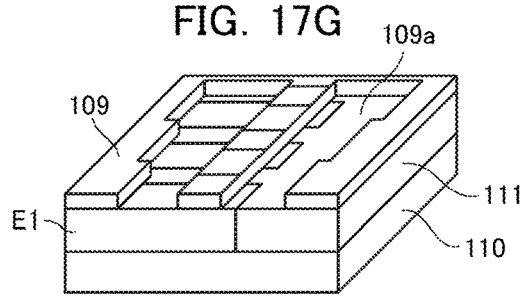
Figure 17C:
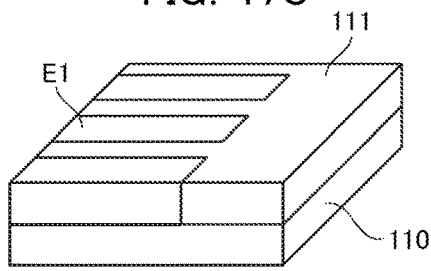
Figure 17H:
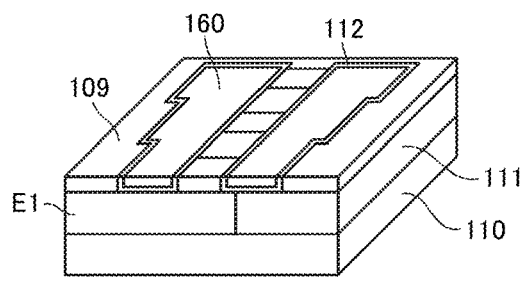
Figure 17D:
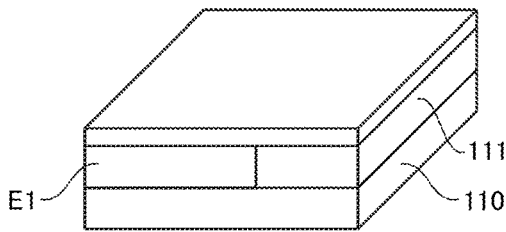
Figure 17I:
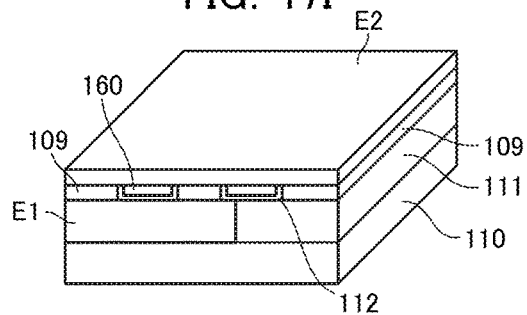
Figure 17E:
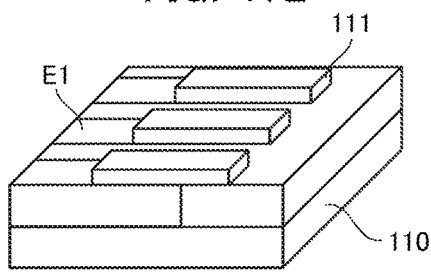

As shown in FIG. 17E, a planar shape of the magnetoresistance element is patterned. This step is performed substantially similarly to the step shown in FIG. 16E, but differs in that a dimension in the Y direction of the stacked first magnetic layer 101, and so on, is made longer than a final dimension.

Next, as shown in FIG. 17F, film formation filling a periphery of the magnetoresistance element with an insulating layer is performed. This step is performed similarly to the step shown in FIG. 16F.

Next, as shown in FIG. 17G, a hole 109a for embedding the first linear response magnetic body 160E provided adjacent to the magnetoresistance element is formed. In this step, resist undergoes patterning by photolithography, and then physical milling or chemical milling are performed using a resist pattern not illustrated as a mask. FIG. 17G takes as an example the case where a pair of first linear response magnetic bodies 160E is formed with respect to a plurality of magnetoresistance elements, but batch processing can be performed even when linear response magnetic bodies 160 are formed individually with respect to a plurality of magnetoresistance elements. FIG. 17G shows an example where etching is performed until the hole 109a penetrates the insulating layer 109. In the example shown in FIG. 17G, processing is performed such that a dimension in the Y direction of the stacked first magnetic layer 101, and so on, attains the final dimension by this etching.

Next, as shown in FIG. 17H, the first linear response magnetic body 160E is embedded in the hole 109a formed in FIG. 17G. In this step, for example, a lift-off process is performed. For example, the first linear response magnetic body 160E is deposited on the entire surface in a state where a resist pattern formed by photolithography of FIG. 17H is left unchanged, and then the resist pattern is removed. Now, the hole 109a has penetrated the insulating layer 109, hence formation of an insulating layer 112 as a first layer of the embedding step of the first linear response magnetic body 160E is performed. The insulating layer 112 is formed by, for example, depositing a 10 nm film of $SiO_x$. Now, the formed insulating layer 112 is deposited also on a sidewall of the hole 109a. Therefore, the insulating layer 112 deposited on the sidewall enables the magnetoresistance element and the first linear response magnetic body 160E to be insulated and furthermore enables a distance between these to be adjusted in a preferred manner. Then, the first linear response magnetic body 160E is embedded by a similar step to the step shown in FIG. 16H, for example. In FIG. 17H, after the first linear response magnetic body 160E has been embedded, an external magnetic field is applied at room temperature to perform setting of the magnetization direction of the hard ferromagnetic material included in the first linear response magnetic body 160E. For example, application of an external magnetic field in a substantially perpendicular direction to the direction of the current-induced magnetic field is performed. Setting of the magnetization direction of the first linear response magnetic body 160E by this external magnetic field, provided it is performed after embedding of the first linear response magnetic body 160E, may be performed at timings such as before removal of the resist pattern, after removal of the resist pattern, after processing of the upper electrode E2 shown in FIG. 17J, and so on.

Figure 17J:
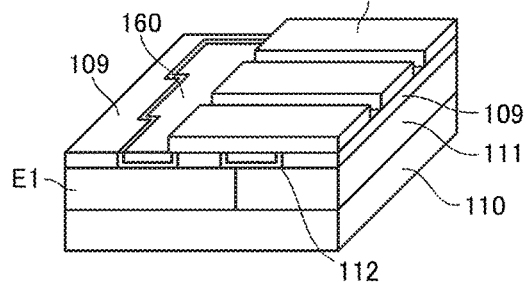

Next, as shown in FIG. 17I, the upper electrode E2 is formed. Next, as shown in FIG. 17J, a planar shape of the upper electrode E2 is patterned. This step is performed similarly to the step described using FIG. 16J.

The manufacturing method according to such a mode also makes it possible to manufacture the current sensor according to the present embodiment without increase in the number of steps. Note that although not illustrated in FIGS. 17A to 17J, formation of a contact hole to the lower electrode E1 may be performed, or a protective film may be formed after processing of the upper electrode E2.

2. Second Embodiment

[2-1. Configuration]

Figure 18:
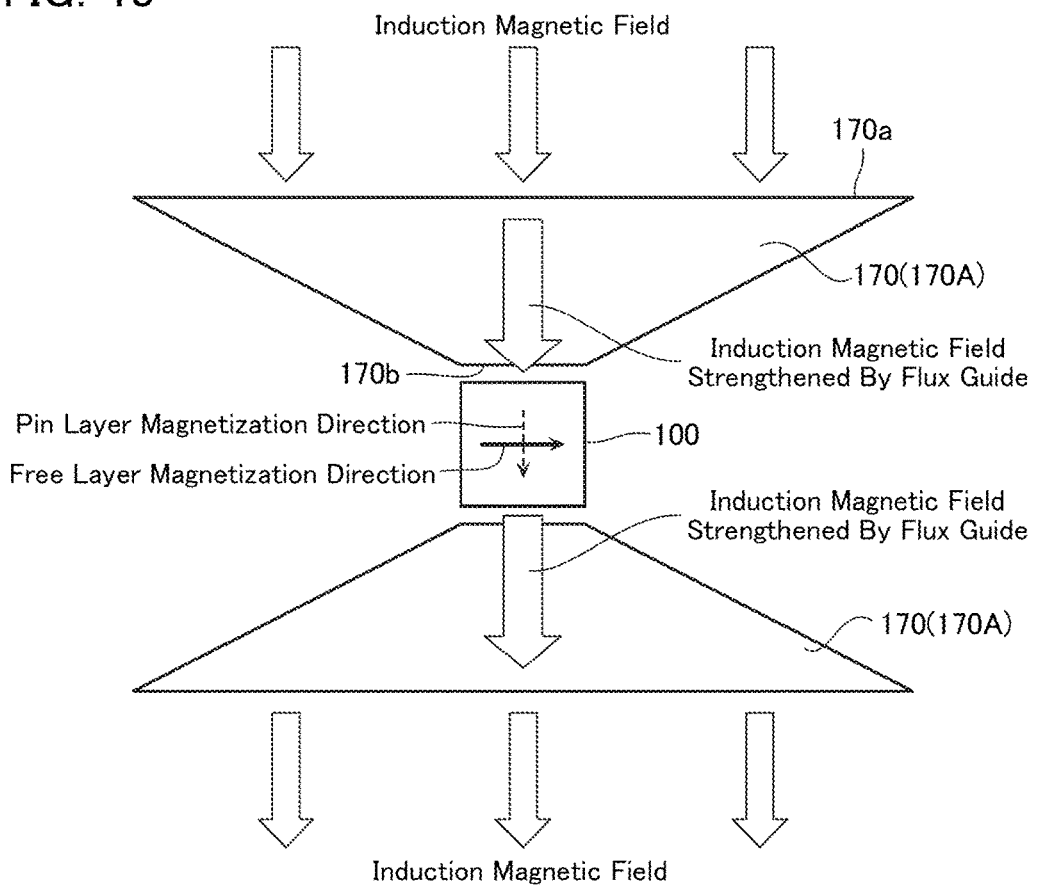
FIG. 18 is a schematic view showing a configuration of a current sensor according to a second embodiment.
Figure 19:
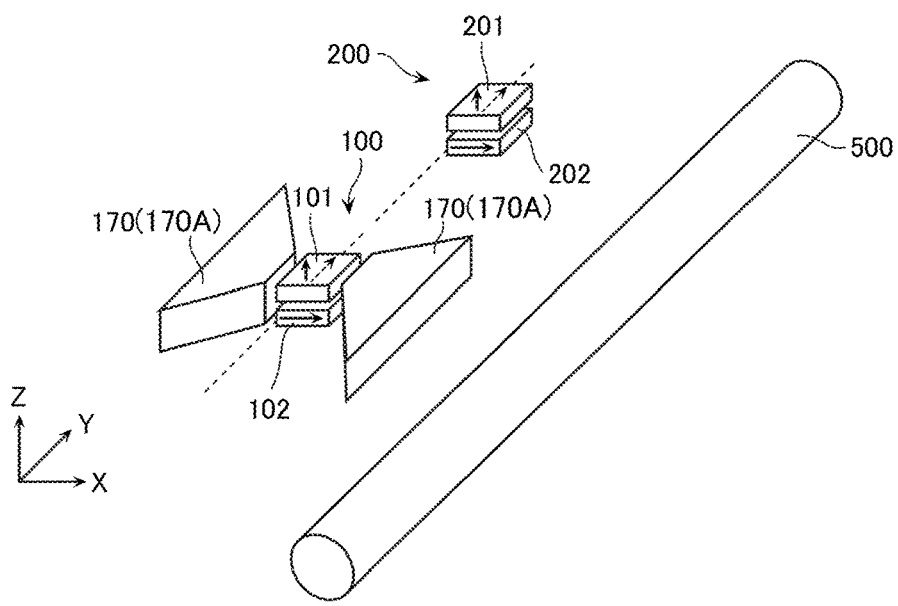
FIG. 19 is a schematic view showing an example of configuration of the same current sensor.

Next, a current sensor according to a second embodiment will be described with reference to FIGS. 18 and 19. FIG. 18 is a plan view showing a schematic configuration of part of the current sensor according to the present embodiment, and FIG. 19 is a schematic view showing an example of configuration of the same current sensor. As shown in FIG. 19, the current sensor according to the present embodiment, similarly to the current sensor according to the first embodiment, includes a first magnetoresistance element 100 and a second magnetoresistance element 200 that are disposed close to a wiring line 500 and that have a resistance value of that changes by application of an current-induced magnetic field from a measurement current flowing in this wiring line 500. Moreover, the first magnetoresistance element 100 and the second magnetoresistance element 200 according to the present embodiment have different magnetic field sensitivities, similarly to in the first embodiment. However, the magnetoresistance element according to the present embodiment differs from that of the first embodiment in performing adjustment of magnetic field sensitivity using a magnetic flux guide (for example, 170A in FIGS. 18 and 19), not a linear response magnetic body.

The magnetic flux guide 170 works by an identical principle to a magnetic core employed in a conventional inductance type, and is configured from a magnetic body of high magnetic permeability disposed in a periphery of the magnetoresistance element. When a magnetic body of high magnetic permeability is disposed, magnetic flux is attracted to this magnetic body as long as the magnetic flux passing through this magnetic body is not more than a saturation magnetic flux of the magnetic body. Therefore, using the above-described magnetic flux guide makes it possible to concentrate magnetic flux on the magnetoresistance element. Therefore, presence/absence of the magnetic flux guide or differences in configuration, and so on, make it possible to provide a difference in magnetic flux density (that is, a magnetic field) entering the magnetoresistance element, and provide a difference in magnetic field sensitivity.

As shown in FIGS. 18 and 19, in the current sensor according to the present embodiment, a first magnetic flux guide 170A is disposed in a periphery of the first magnetoresistance element 100. The first magnetic flux guide 170A is one mode of the magnetic flux guide. Moreover, a magnetic flux guide is not disposed in a periphery of the second magnetoresistance element 200.

The magnetic flux guide 170 is disposed at a side surface of the first magnetoresistance element 100 in a direction that the current-induced magnetic field from the current-to-be-measured is applied. Moreover, the magnetic flux guide 170 is formed in a trapezoidal shape, and is formed such that a surface 170a far from the first magnetoresistance element 100 is larger than a surface facing the first magnetoresistance element 100. Furthermore, a width of a surface 170b of the magnetic flux guide 170 facing the first magnetoresistance element 100 is slightly larger than a width of the first magnetoresistance element 100.

The current-induced magnetic field from the current-to-be-measured enters perpendicularly to the magnetization direction of the first magnetic layer 101 and parallelly to the magnetization direction of the second magnetic layer 102. Now, since the magnetic flux guide 170 is formed from a magnetic body of high magnetic permeability, the current-induced magnetic field converges toward the surface 170a of the magnetic flux guide 170 and enters the magnetic flux guide 170. Moreover, area of the surface 170b where magnetic flux exits is smaller compared to area of the surface 170a where magnetic flux enters. Therefore, the magnetic flux entering the magnetic flux guide 170 further converges to enter the first magnetoresistance element 100. Therefore, the magnetic field applied to the first magnetoresistance element 100 is larger compared to when the magnetic flux guide 170 is not provided.

The magnetic flux guide 170 may be formed from a variety of soft magnetic bodies of high magnetic permeability (single bodies or alloys of Fe, Co, Ni), but it is possible to apply to the magnetic flux guide 170 a soft magnetic material, for example, ferronickel, cobalt-zirconium-niobium, iron-aluminum-silicon, iron-cobalt-nickel and a soft magnetic amorphous alloy, and so on.

Figure 20A:
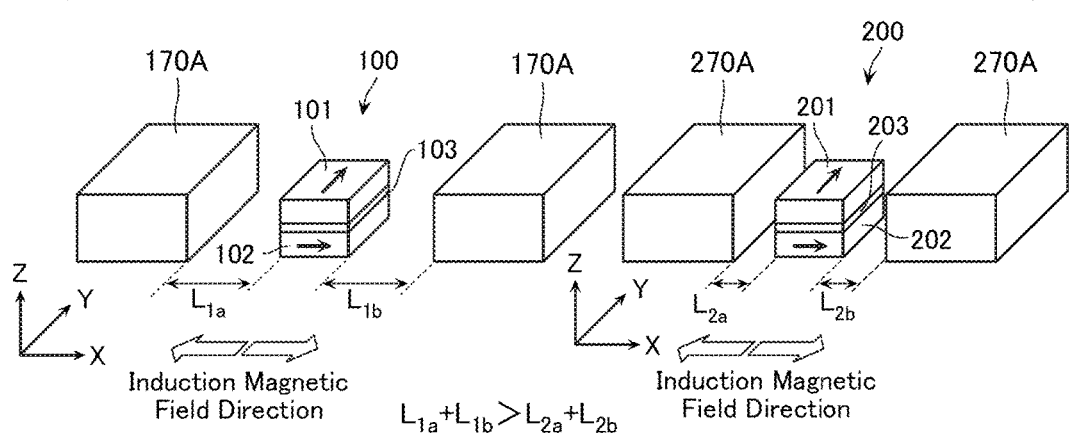
FIGS. 20A and 20B are schematic views showing examples of configuration of the current sensor according to the same embodiment.
Figure 20B:
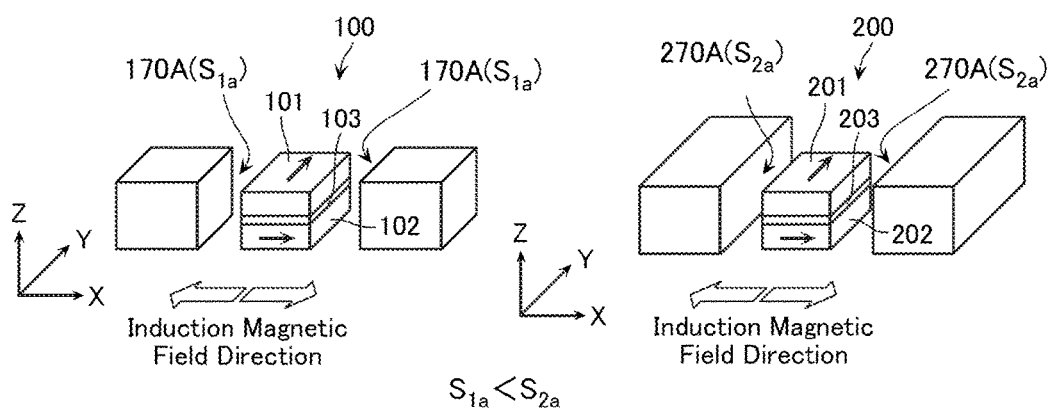

Now, FIG. 19 described an example where a difference is provided in magnetic field sensitivity ((dR/R)/2Hs) by presence/absence of the magnetic flux guide 170. However, magnetic field sensitivity ((dR/R)/2Hs) of the magnetoresistance element can also be adjusted by configurations of the magnetic flux guide 170, and so on. FIGS. 20A and 20B show examples where a difference in configurations of the first magnetic flux guide 170A and a second magnetic flux guide 270A is provided to obtain different magnetic field sensitivities for the first magnetoresistance element 100 and the second magnetoresistance element 200. The second magnetic flux guide 270A is one mode of the magnetic flux guide. Note that FIGS. 20A and 20B describe examples where the current sensor comprises two magnetoresistance elements, but the current sensor may of course comprise three or more magnetoresistance elements. In addition, FIGS. 19, 20A and 20B are described taking as an example the case where the first or second magnetic flux guides 170A and 270A are provided adjacently to the side of the magnetoresistance element, but similarly, different magnetic field sensitivities can be obtained even when the first or second magnetic flux guides 170A and 270A are provided diagonally to the side of the magnetoresistance element. Moreover, for simplification, FIGS. 20A and 20B illustrate only protruding parts of the first or second magnetic flux guides 170A and 270A.

As shown in FIG. 20A, it is possible to change magnetic field sensitivity by changing a distance between the magnetoresistance element and the first and second magnetic flux guides 170A and 270A. The sum $L_{1a}+L_{1b}$ of the distances between the first magnetoresistance element 100 and each of the pair of magnetic flux guides 170A shown in FIG. 20A is set larger than the sum $L_{2a}+L_{2b}$ of the distances between the second magnetoresistance element 200 and each of the pair of magnetic flux guides 270A shown in FIG. 20A. In this case, the larger the distance from the first or second magnetic flux guides 170A and 270A, the smaller becomes the current-induced magnetic field applied to the first or second magnetoresistance elements 100 and 200. Therefore, magnetic field sensitivity ((dR/R)/2Hs) of the first magnetoresistance element 100 is set lower compared to that of the second magnetoresistance element 200.

As shown in FIG. 20B, it is possible to change magnetic field sensitivity by changing area of the surface of the first magnetic flux guide 170A facing the first magnetoresistance element 100 and area of the surface of the second magnetic flux guide 270A facing the second magnetoresistance element 200. Areas $S_{1a}$ of the protruding parts of the pair of first magnetic flux guides 170A shown in FIG. 20B are set to the same degree as area of the side surface of the first magnetoresistance element 100. In contrast, areas $S_{2a}$ of the protruding parts of the pair of second magnetic flux guides 270A shown in FIG. 20B are set larger than area of the side surface of the second magnetoresistance element 200. In this case, the larger the area of the first or second magnetic flux guides 170A and 270A, the smaller becomes magnetic flux density of the magnetic field applied to the magnetoresistance elements 100 and 200. Therefore, magnetic field sensitivity ((dR/R)/2Hs) of the first magnetoresistance element 100 is set higher compared to that of the second magnetoresistance element 200.

FIGS. 20A and 20B described the case where magnetic field sensitivity is changed by changing arrangement or area of the first and second magnetic flux guides 170A and 270A, but magnetic field sensitivity can be changed also by changing a kind of magnetic material employed in the first and second magnetic flux guides 170A and 270A. For example, it is also possible to change magnetic field sensitivity of the first and second magnetoresistance elements 100 and 200 by employing magnetic materials having a different magnetic permeability in each of the first magnetic flux guide 170A and the second magnetic flux guide 270A.

Figure 21:
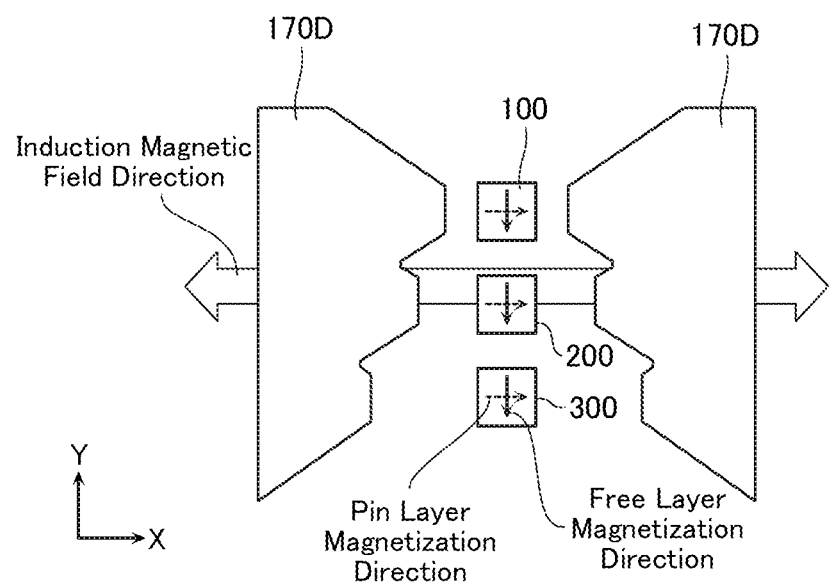
FIG. 21 is a schematic view showing another example of configuration of the current sensor according to the same embodiment.
Figure 22A:
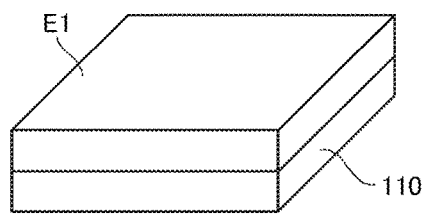
FIGS. 22A, 22B, 22C, 22D, 22E, 22F, 22G, 22H, 22I and 22J are schematic perspective views illustrating a manufacturing method of the current sensor according to the same embodiment.
Figure 22B:
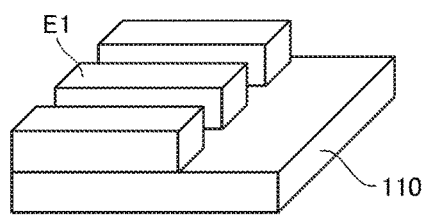
Figure 22C:
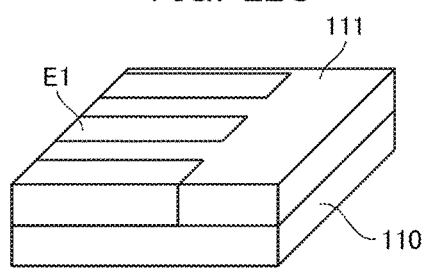
Figure 22D:
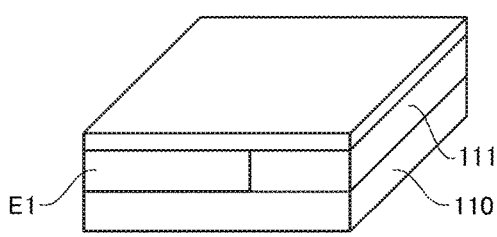
Figure 22E:
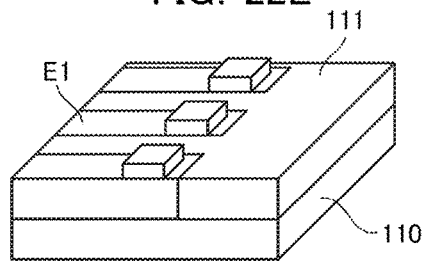
Figure 22F:
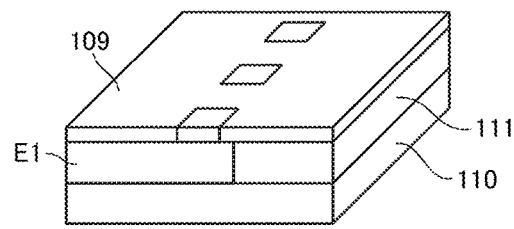
Figure 22G:
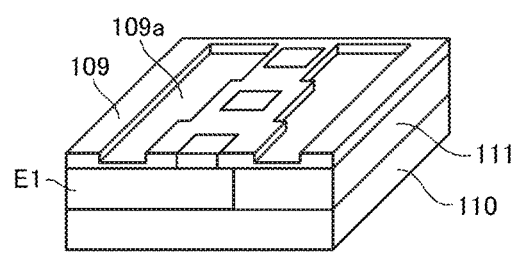
Figure 22H:
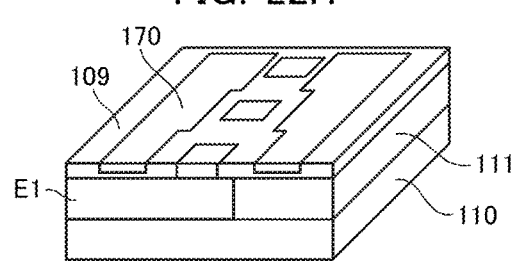
Figure 22I:
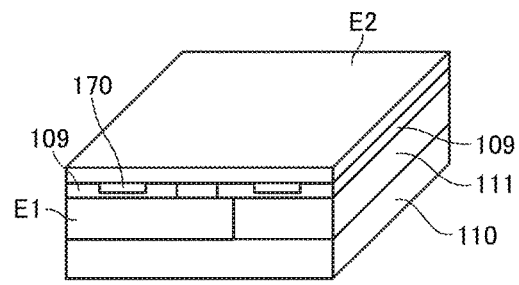
Figure 22J:
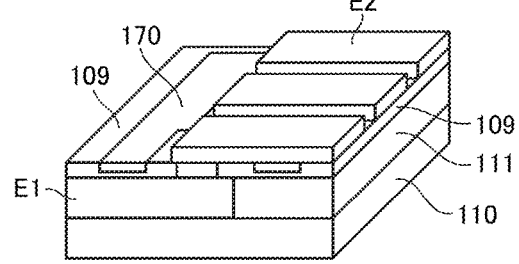
Figure 23A:
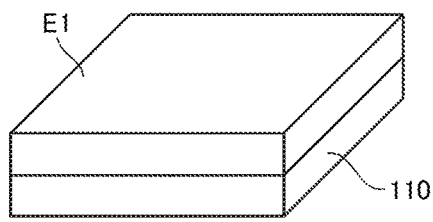
FIGS. 23A, 23B, 23C, 23D, 23E, 23F, 23G, 23H, 23I and 23J are schematic perspective views illustrating another manufacturing method of the current sensor according to the same embodiment.
Figure 23B:
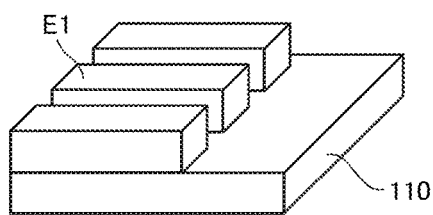
Figure 23C:
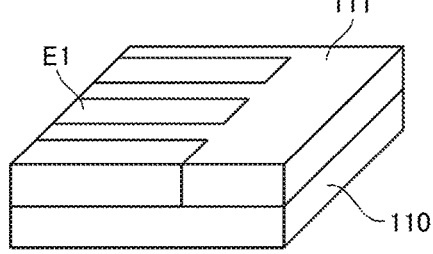
Figure 23D:
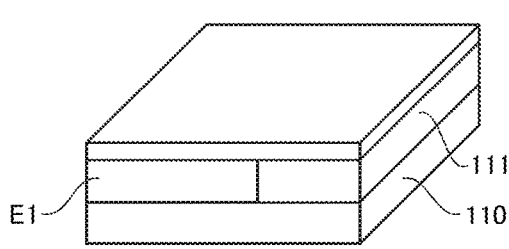
Figure 23E:
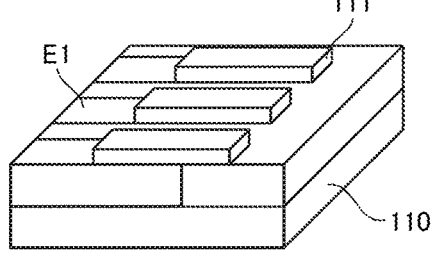
Figure 23F:
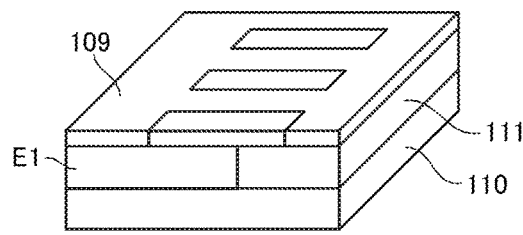
Figure 23G:
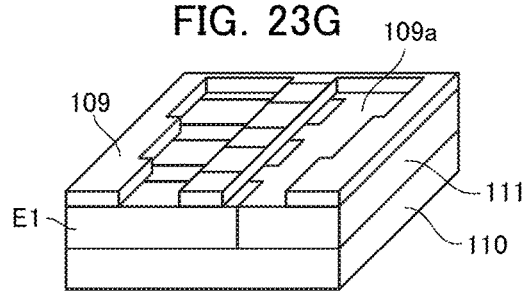
Figure 23H:
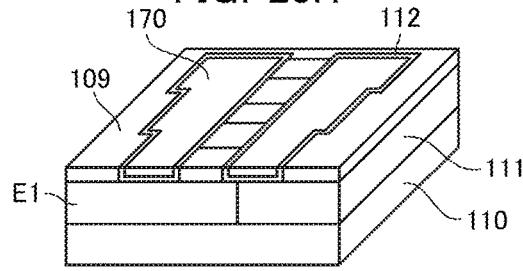
Figure 23I:
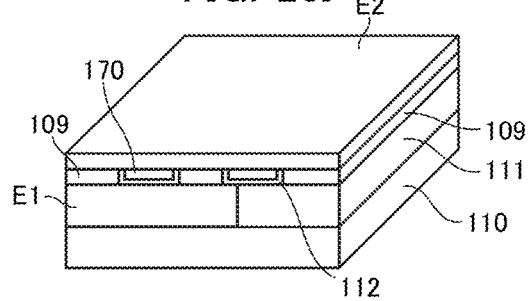
Figure 23J:
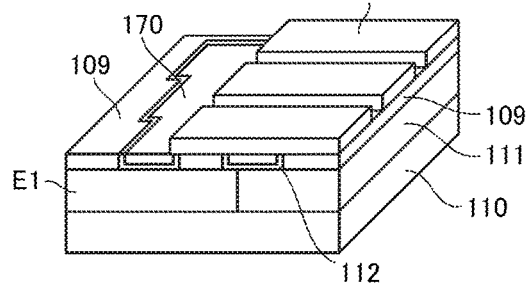

FIG. 21 is a schematic view for explaining the case where a magnetic field is applied to a plurality of magnetoresistance elements from a pair of magnetic flux guides 170D. A first magnetic flux guide 170D is another mode of the first magnetic flux guide 170. Such a configuration also enables magnetic field sensitivity of each of the magnetoresistance elements to be changed. Note that FIG. 21 describes an example where the current sensor comprises a third magnetoresistance element 300 in addition to the first magnetoresistance element 100 and the second magnetoresistance element 200. However, the number of magnetoresistance elements may be two, or may be four or more.

As shown in FIG. 21, it is possible to change magnetic field sensitivity of each of the magnetoresistance elements even by employing the pair of first magnetic flux guides 170D on the plurality of magnetoresistance elements. In FIG. 21, widths in the magnetization direction (X direction) of the first magnetic flux guides 170D are different with respect to each of the magnetoresistance elements, and distances between each of the plurality of magnetoresistance elements and the pair of first magnetic flux guides 170D are different. In the case of employing the first magnetic flux guide 170D of such a shape, the effective distances between the first magnetic flux guide 170D at its closest position to each of the magnetoresistance elements and each of the magnetoresistance elements and the effective areas of the first magnetic flux guide 170D at said positions are different, hence it becomes possible to change magnetic field sensitivity of each of the magnetoresistance elements.

[2-2. Manufacturing Method]

Next, a manufacturing method of the current sensor according to the present embodiment will be described. FIGS. 22A to 22J and FIGS. 23A to 23J are each stepwise schematic perspective views illustrating the manufacturing method of the current sensor according to the present embodiment. The manufacturing method of the current sensor according to the present embodiment is substantially similar to the manufacturing method of the current sensor according to the first embodiment, but differs in manufacturing the first magnetic flux guide 170 in the step of manufacturing the first linear response magnetic body 160. Note that the above-mentioned magnetic body of high magnetic permeability may be applied as a material of the first magnetic flux guide 170.

3. Third Embodiment

Figure 24:
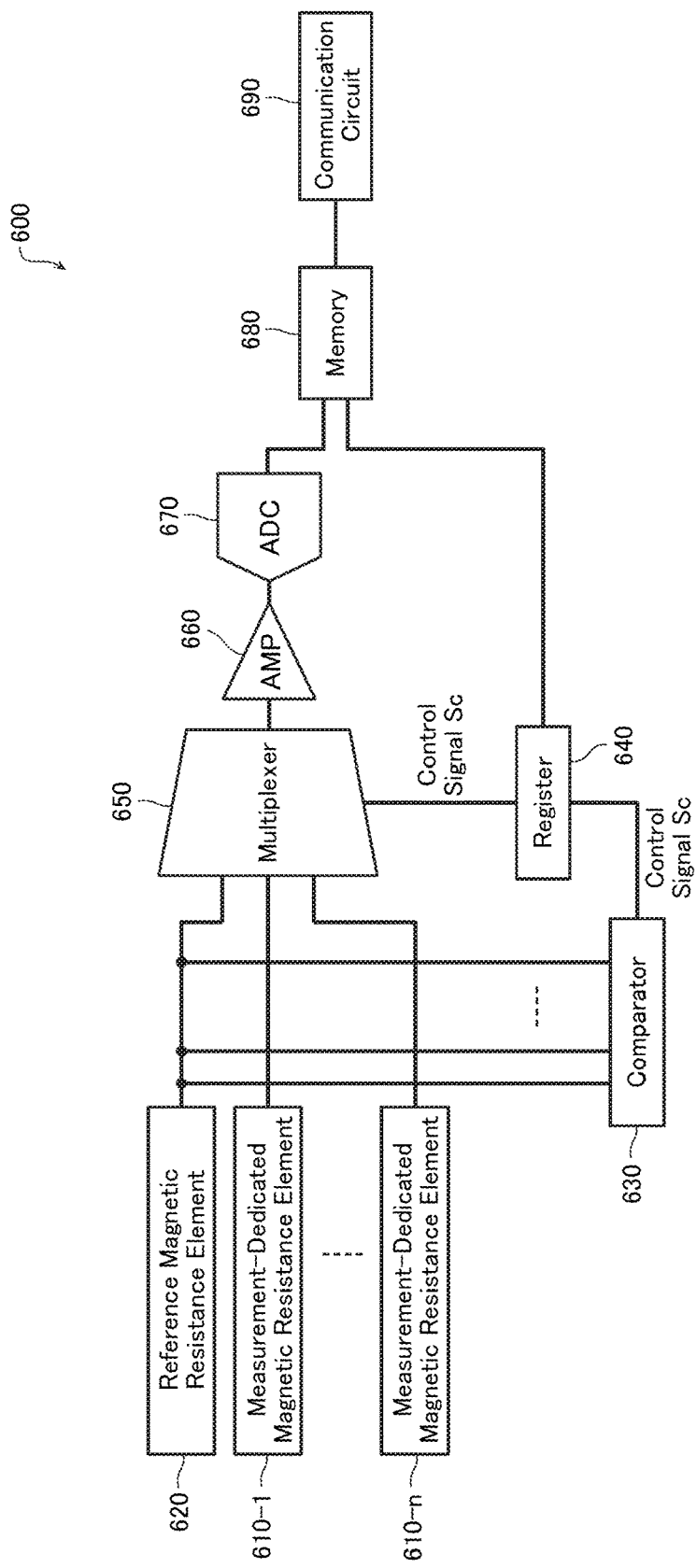
FIG. 24 is a circuit block diagram showing a configuration of a current sensor according to a third embodiment.

Next, a current sensor 600 according to a third embodiment will be described with reference to FIG. 24. FIG. 24 is a circuit block diagram showing a configuration of the current sensor 600 according to the present embodiment.

The current sensors according to the above-described embodiments select an optimal magnetoresistance element from a plurality of magnetoresistance elements having different magnetic field sensitivities, based on magnitude of the current-induced magnetic field, and calculate a selection output signal from an output voltage of the optimal magnetoresistance element. However, the plurality of magnetoresistance elements each have a different magnetic field sensitivity, hence even supposing they were driven by an identical output voltage, a value of the measured current-induced magnetic field is different. Therefore, unless it can be specified from which magnetoresistance element it is appropriate that the output voltage is outputted, the value of the current-induced magnetic field from the current-to-be-measured cannot be measured.

Accordingly, in the current sensor 600 according to the present embodiment, the output signals of n disposed measurement-dedicated magnetoresistance elements 610-1 to 610-n and the output signal of one reference magnetoresistance element 620 are all inputted to a multiplexer 650, and an optimal output signal is selected based on a certain control signal Sc. Note that the control signal Sc is generated based on the output signal of the reference magnetoresistance element 620. Moreover, the current sensor 600 according to the present embodiment measures a direct current.

As shown in FIG. 24, the current sensor 600 according to the present embodiment comprises: the n measurement-dedicated magnetoresistance elements 610-1 to 610-n; the reference magnetoresistance element 620; a comparator 630; a register 640; the multiplexer 650; an amplifier 660; an A/D converter circuit 670; a memory 680; and a communication circuit 690.

The n measurement-dedicated magnetoresistance elements 610-1 to 610-n and the reference magnetoresistance element 620 have n+1 types of different magnetic field sensitivities. The magnetoresistance elements, and so on, according to any of the first and second embodiments can be applied as the measurement-dedicated magnetoresistance elements 610-1 to 610-*n* and the reference magnetoresistance element 620. Moreover, it is also possible for a linear response magnetic body 160 or magnetic flux guide 170, and so on, to be provided close to the measurement-dedicated magnetoresistance elements 610-1 to 610-*n*.

The reference magnetoresistance element 620 is a magnetoresistance element that measures a rough magnitude of the current-induced magnetic field, and the output signal of the reference magnetoresistance element 620 is employed in generation of the control signal Sc by the comparator 630. Therefore, the reference magnetoresistance element 620 has sensitivity in a broader magnetic field range compared to the n measurement-dedicated magnetoresistance elements 610-1 to 610-*n*. Moreover, it is also possible for the magnetoresistance elements according to any of the first and second embodiments to be adopted as the reference magnetoresistance element 620. In addition, it is also possible for a linear response magnetic body 160 or magnetic flux guide 170, and so on, to be provided close to the reference magnetoresistance element 620.

Figure 25:
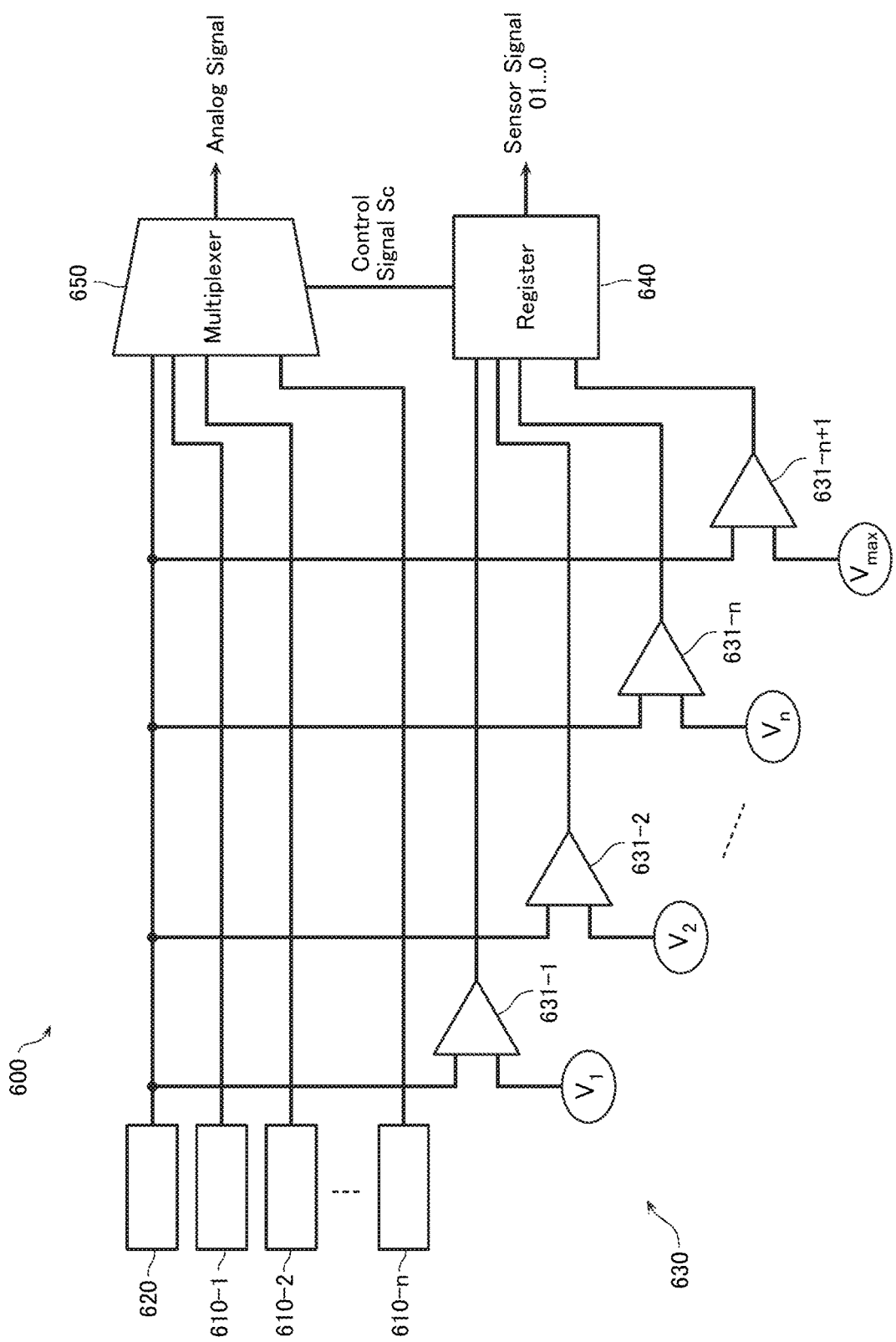
FIG. 25 is a circuit diagram showing a configuration of a comparator 630 of the current sensor according to the same embodiment.

The comparator 630 generates the control signal Sc indicating the rough magnitude of the current-induced magnetic field, based on the output signal of the reference magnetoresistance element 620. FIG. 25 is a circuit diagram showing a configuration of the comparator 630. The comparator 630 comprises n+1 comparators 631-1 to 631-*n*+1. The comparators 631-1 to 631-*n*+1 compare the output signal of the reference magnetoresistance element 620 with reference voltages $V_1 \ldots V_n$, and $V_{max}$ (an output voltage in a state where magnetization vectors of a free layer (first magnetic layer 101, and so on) and a pin layer (second magnetic layer 102, and so on) of the magnetoresistance element according to the present embodiment are directed in a 180° direction), and output a result of the comparison. Therefore, the comparators 631-1 to 631-*n*+1 have one of their input terminals each connected to the reference magnetoresistance element 620. Moreover, the other of their input terminals are respectively applied with the different reference voltages $V_1 \ldots V_n$, and $V_{max}$. Furthermore, these plurality of comparators 631 have their output terminal connected to the register 640. Note that the control signal Sc is an n+1 bit data column configured from output signals of the comparators 631-1 to 631-*n*+1.

Description will continue returning to FIG. 24. The register 640 stores an output signal of the comparator 630 as the control signal Sc. The multiplexer 650 selects one output signal from the output signals of the measurement-dedicated magnetoresistance elements 610-1 to 610-*n* and the reference magnetoresistance element 620, based on this control signal Sc. In other words, the multiplexer 650 selects the measurement-dedicated magnetoresistance elements 610-1 to 610-*n* or the reference magnetoresistance element 620, based on an output voltage of the reference magnetoresistance element 620. The amplifier 660 amplifies an output signal of the multiplexer 650, and the A/D converter circuit 670 converts an output signal of the amplifier 660 to a digital output value. The memory 680 stores an output signal of the A/D converter circuit 670 and the output signal of the register 640, and the communication circuit 690 outputs the signals stored in the memory 680 to external.

Figures 26, 27:
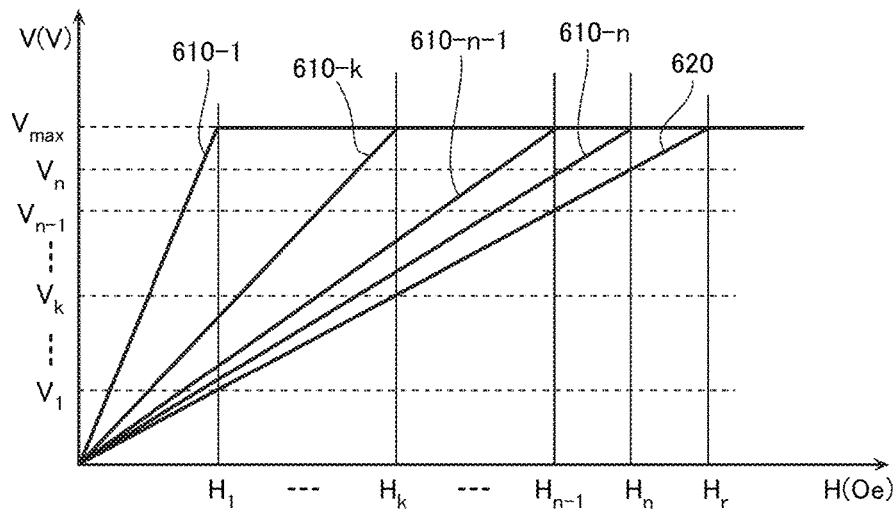
FIG. 26 is a graph showing characteristics of a plurality of measurement-dedicated magnetoresistance elements 610-1 to 610-$n$ and a reference magnetoresistance element 620 of the current sensor according to the same embodiment.
FIG. 27 is a truth table of control signals of the current sensor according to the same embodiment.

FIG. 26 is a graph showing characteristics of the plurality of measurement-dedicated magnetoresistance elements 610-1 to 610-*n* and the reference magnetoresistance element 620. The horizontal axis indicates magnitude of the current-induced magnetic field, and the vertical axis indicates output voltages of the measurement-dedicated magnetoresistance elements 610-1 to 610-*n* and the reference magnetoresistance element 620.

As shown in FIG. 26, the plurality of measurement-dedicated magnetoresistance elements 610-1 to 610-*n* each have different magnetic field sensitivities and different saturation magnetic fields $H_1$ to $H_n$. That is, when k is assumed to be an integer of not less than 1 and not more than n, the measurement-dedicated magnetoresistance element 610-*k* has a k-th highest magnetic field sensitivity and a k-th smallest saturation magnetic field $H_k$. Moreover, the reference magnetoresistance element 620 has a magnetic field sensitivity which is lower than that of the measurement-dedicated magnetoresistance element 610-*n*, and a saturation magnetic field $H_r$ which is larger than that of the measurement-dedicated magnetoresistance element 610-*n*.

A resistance value of the measurement-dedicated magnetoresistance element 610-1 having a high magnetic field sensitivity changes steeply with respect to magnetic field change, and its magnetization state saturates at a time point when a comparatively small magnetic field $H_1$ is applied thereto. Therefore, the measurement-dedicated magnetoresistance element 610-1 is capable of measuring a minute magnetic field with high precision. On the other hand, a resistance value of the reference magnetoresistance element 620 having a low magnetic field sensitivity changes gently with respect to magnetic field change, and its magnetization state does not saturate until a comparatively large magnetic field $H_r$ is applied thereto. Therefore, the reference magnetoresistance element 620 is capable of measuring a magnetic field in a comparatively broad dynamic range.

Setting of magnetic field sensitivities of the measurement-dedicated magnetoresistance elements 610-1 to 610-*n* is conceivably performed as follows, for example. First, magnetic field sensitivity of the measurement-dedicated magnetoresistance element 610-1 having the highest magnetic field sensitivity is set according to a required resolution. Next, magnetic field sensitivity of the reference magnetoresistance element 620 having the lowest magnetic field sensitivity, that is, whose change in resistance value with respect to magnetic field change is least is set according to a required dynamic range. In addition, magnetic field sensitivities of the measurement-dedicated magnetoresistance elements 610-2 to 610-*n* are set.

$V_1$ to $V_n$ and $V_{max}$ in FIG. 26 are the above-described reference voltages that are compared with the output voltage of the reference magnetoresistance element 620. In the present embodiment, the reference voltages $V_1$ to $V_n$ are set one each for all of the measurement-dedicated magnetoresistance elements 610-1 to 610-*n*. The reference voltage $V_k$ (where k=1 to n) corresponding to the measurement-dedicated magnetoresistance element 610-*k* is the output voltage of the reference magnetoresistance element 620 at the saturation magnetic field $H_k$ of the measurement-dedicated magnetoresistance element 610-*k*.

However, in reality, when the current-induced magnetic field approaches the saturation magnetic field, linearity between the current-induced magnetic field and the resistance value of the magnetoresistance element deteriorates. Therefore, the reference voltage $V_k$ corresponding to the measurement-dedicated magnetoresistance element 610-*k* may be assumed to be the output voltage of the reference magnetoresistance element 620 at a magnetic field lower than the saturation magnetic field $H_k$ of the measurement-dedicated magnetoresistance element 610-*k*. Similarly, it may also be assumed that $V_{max}$ is the output voltage of the magnetoresistance element in a state before magnetization vectors of the first magnetic layer and the second magnetic layer are fully directed in a 180° direction.

FIG. 27 is a table showing a relationship between magnitude of the current-induced magnetic field, a value of the control signal Sc, and the measurement-dedicated magnetoresistance elements 610-1 to 610-$n$ or the reference magnetoresistance element 620 selected by the multiplexer 650. Magnitude of the current-induced magnetic field is shown in the left column of FIG. 27, the control signal Sc is shown in the middle column of FIG. 27, and the selected magnetoresistance element is shown in the right column of FIG. 27. Note that the control signal Sc is configured from the output signals of the n+1 comparators 631-1 to 631-$n$+1 (FIG. 25), hence FIG. 27 describes data of each of the output signals of the comparators 631-1 to 631-$n$+1.

When magnitude H of the current-induced magnetic field is $H_{k-1} \leq H < H_k$, the output voltage of the reference magnetoresistance element 620 is not less than $V_{k-1}$, and is smaller than $V_k$. Therefore, the output signals of the comparators 631-1 to 631-$k$−1 are 1 (High), and the output signals of the comparators 631-$k$ to 631-$n$ are 0 (Low). The comparator 630 receives the control signal Sc configured from these output signals to select and output the output signal of the measurement-dedicated magnetoresistance element 610-$k$.

Figure 28:
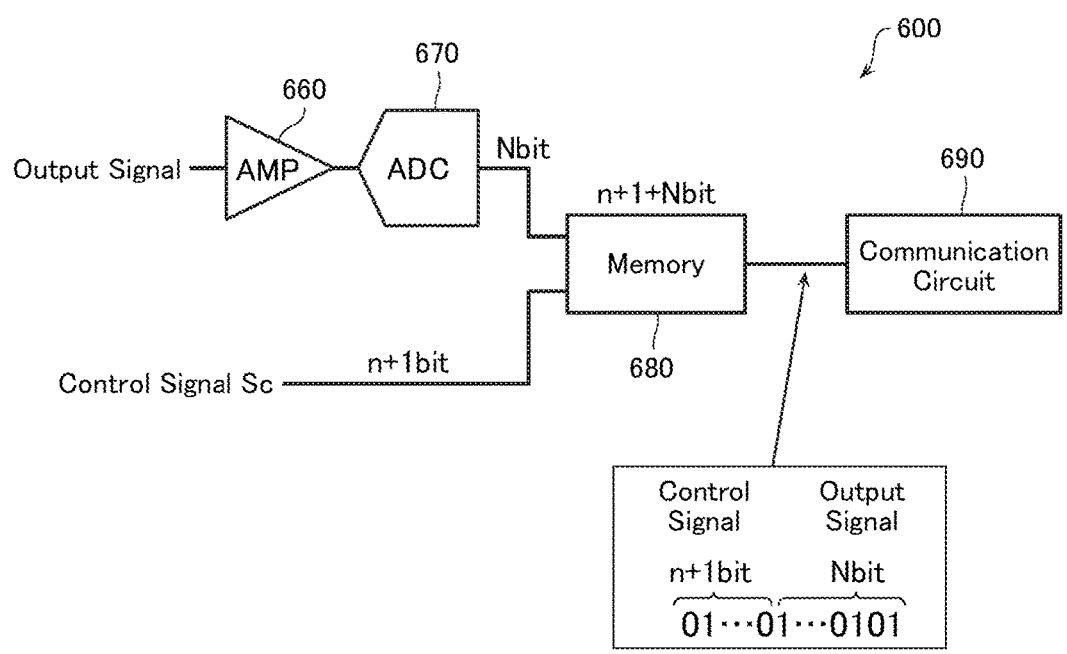
FIG. 28 is a circuit block diagram for explaining operation of a memory 680 of the current sensor according to the same embodiment.

Next, operation of the memory 680 will be described. FIG. 28 is a circuit block diagram for explaining operation of the memory 680. The output signal outputted from the multiplexer 650 is converted to N bit digital data by the A/D converter circuit 670. Moreover, the control signal Sc is n+1 bit digital data. The current sensor 600 according to the present embodiment specifies the measurement-dedicated magnetoresistance element 610 selected by the control signal Sc. Therefore, the memory 680 stores N+n+1 bit digital data as one unit.

4. Fourth Embodiment

Next, a current sensor 601 according to a fourth embodiment will be described. Whereas the current sensor 600 according to the third embodiment measured a direct current, the current sensor 601 according to the fourth embodiment measures an alternating current. The current sensor 601 according to the present embodiment is basically configured similarly to the current sensor 600 according to the third embodiment, but differs from the third embodiment in a configuration of a comparator 639. Descriptions of portions similar to those of the third embodiment will be omitted below.

Figure 29:
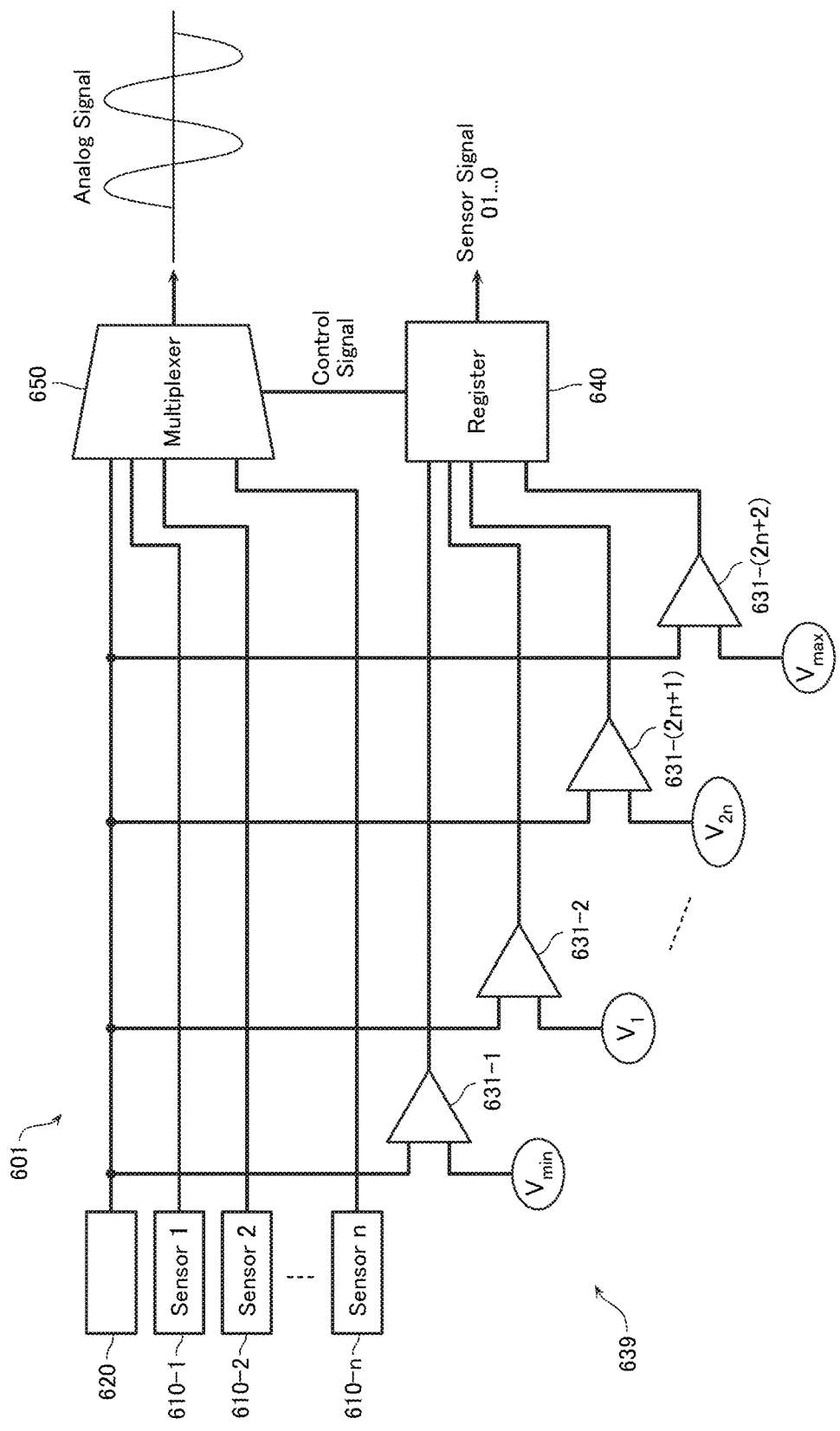
FIG. 29 is a circuit diagram showing a configuration of a comparator 639 according to a fourth embodiment.

FIG. 29 is a circuit diagram showing the configuration of the comparator 639 according to the present embodiment. The current sensor 601 according to the present embodiment measures an alternating current, hence the current-induced magnetic field can attain not only a positive value, but also a negative value. Therefore, the comparator 639 according to the present embodiment comprises 2n+2 comparators 631-1 to 631-(2n+2). The comparators 631-1 to 631-(2n+2) compare the output signal of the reference magnetoresistance element 620 with reference voltages $V_{min}$ (an output voltage in a state where magnetization vectors of the free layer (first magnetic layer 101, and so on) and the pin layer (second magnetic layer 102, and so on) of the magnetoresistance element according to the present embodiment are directed in a 0° direction), $V_1 \ldots V_{2n}$, and $V_{max}$, and output a result of the comparison. Therefore, the comparators 631-1 to 631-(2n+2) have one of their input terminals each connected to the reference magnetoresistance element 620. Moreover, the other of their input terminals are respectively applied with different reference voltages $V_{min}$, $V_1 \ldots V_{2n}$, and $V_{max}$. Furthermore, these plurality of comparators 631-1 to 631-(2n+2) have their output terminal connected to the register 640. Note that in the present embodiment, the control signal Sc is a 2n+2 bit data column configured from output signals of the comparators 631-1 to 631-(2n+2).

Figure 30:
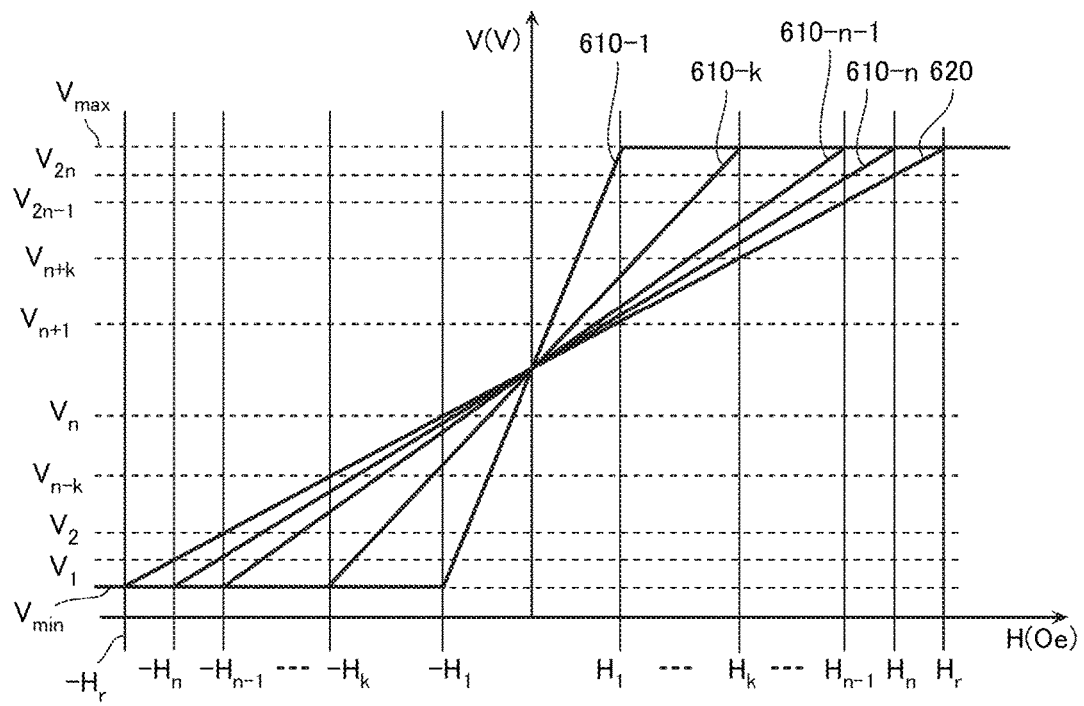
FIG. 30 is a graph showing characteristics of a plurality of measurement-dedicated magnetoresistance elements 610-1 to 610-n and a reference magnetoresistance element 620 of the current sensor according to the same embodiment.

FIG. 30 is a graph showing characteristics of the plurality of measurement-dedicated magnetoresistance elements 610-1 to 610-$n$ and the reference magnetoresistance element 620. The horizontal axis indicates magnitude of the current-induced magnetic field, and the vertical axis indicates output voltages of the measurement-dedicated magnetoresistance elements 610-1 to 610-$n$ and the reference magnetoresistance element 620.

$V_{min}$, $V_1 \ldots V_{2n}$, and $V_{max}$ in FIG. 30 are the above-described reference voltages that are compared with the output voltage of the reference magnetoresistance element 620. In the present embodiment, the reference voltages $V_1$ to $V_{2n}$ are set two each for all of the measurement-dedicated magnetoresistance elements 610-1 to 610-$n$. The reference voltages $V_{n+k}$ and $V_{n-k+1}$ (where k=1 to n) corresponding to the measurement-dedicated magnetoresistance element 610-$k$ are the respective output voltages of the reference magnetoresistance element 620 at the saturation magnetic fields $H_k$ and $-H_k$ of the measurement-dedicated magnetoresistance element 610-$k$.

FIG. 31 is a table showing a relationship between magnitude of the current-induced magnetic field, a value of the control signal Sc, and the measurement-dedicated magnetoresistance elements 610-1 to 610-$n$ or the reference magnetoresistance element 620 selected by the multiplexer 650. Magnitude of the current-induced magnetic field is shown in the left column of FIG. 31, the control signal Sc is shown in the middle column of FIG. 31, and the selected magnetoresistance element is shown in the right column of FIG. 31. Note that the control signal Sc is configured from the output signals of the 2n+2 comparators 631-1 to 631-(2n+2) (FIG. 29), hence FIG. 31 describes data of each of the output signals of the comparators 631-1 to 631-(2n+2).

When magnitude H of the current-induced magnetic field is a negative value and is $-H_k \leq H \leq -H_{k-1}$, the output voltage of the reference magnetoresistance element 620 is not less than $V_{n-k+1}$, and is smaller than $V_{n-k+2}$. Therefore, the output signals of the comparators 631-1 to 631-($n-k$+2) are 1 (High), and the output signals of the comparators 631-($n-k$+3) to 631-2$n$ are 0 (Low). On the other hand, when magnitude H of the current-induced magnetic field is a positive value and is $H_{k-1} \leq H < H_k$, the output voltage of the reference magnetoresistance element 620 is not less than $V_{n+k-1}$, and is smaller than $V_{n+k}$. Therefore, the output signals of the comparators 631-1 to 631-($n+k$) are 1 (High), and the output signals of the comparators 631-($n+k$+1) to 631-(2n+2) are 0 (Low). The comparator 639 receives the control signal Sc configured from these output signals to select and output the output signal of the measurement-dedicated magnetoresistance element 610-$k$.

Figure 32:
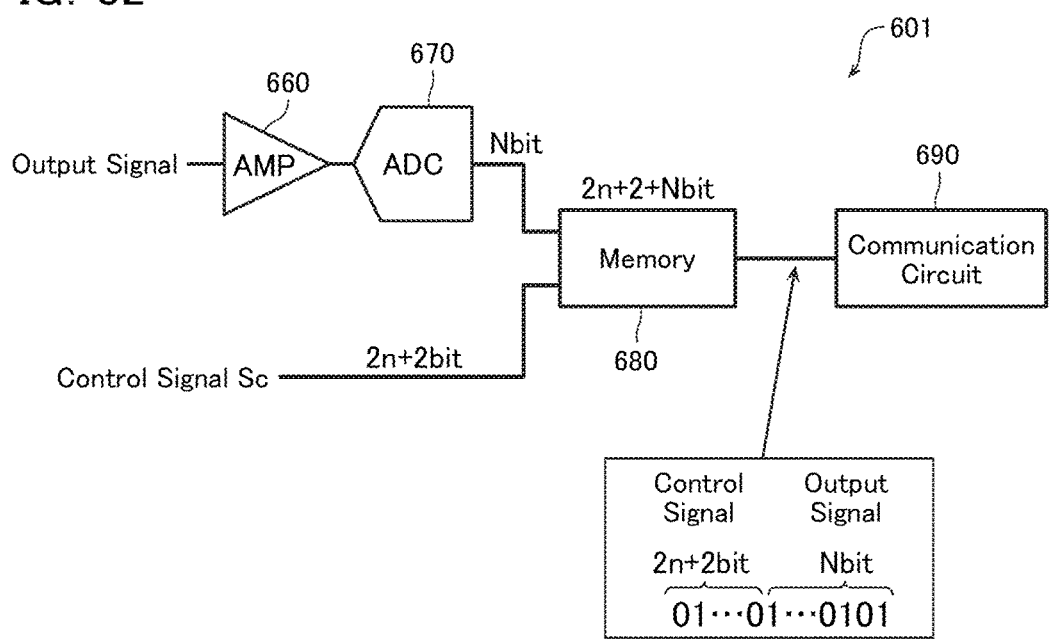
FIG. 32 is a circuit block diagram for explaining operation of a memory 680 of the current sensor according to the same embodiment.

Next, operation of the memory 680 will be described. FIG. 32 is a circuit block diagram for explaining operation of the memory 680. The output signal outputted from the multiplexer 650 is converted to N bit digital data by the A/D converter circuit 670. Moreover, the control signal Sc is 2n+2 bit digital data. The current sensor 601 according to the present embodiment specifies the measurement-dedicated magnetoresistance element 610 selected by the control signal Sc. Therefore, the memory 680 stores N+2n+2 bit digital data as one unit.

Note that a plurality of the first magnetoresistance elements 100 or second magnetoresistance elements 200 connected in series or parallel may also be employed as the above-described measurement-dedicated magnetoresistance elements 610-1 to 610-n and the reference magnetoresistance element 620. FIGS. 33A, 33B, 33C and 33D are schematic views illustrating current sensors according to such an embodiment.

Figure 33A:
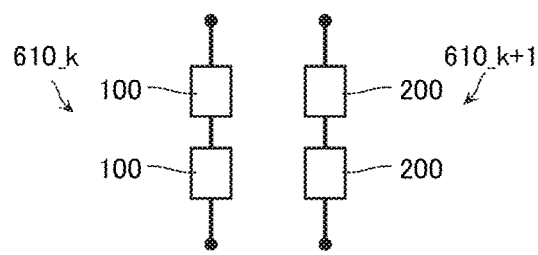
FIGS. 33A, 33B, 33C and 33D are circuit diagrams showing examples of configuration of the measurement-dedicated magnetoresistance element.

As indicated in FIG. 33A, it is possible, for example, to electrically connect the plurality of first magnetoresistance elements 100 in series to configure the measurement-dedicated magnetoresistance element 610_k (where k=1 to n−1), and electrically connect the plurality of second magnetoresistance elements 200 in series to configure the measurement-dedicated magnetoresistance element 610_k+1. When the number of magnetoresistance elements connected in series is assumed to be N, an obtained electrical signal is N times the case where the number of magnetoresistance elements is 1. On the other hand, heat noise and Schottky noise are $N^{1/2}$ times. That is, SNR (signal-noise ratio) is $N^{1/2}$ times. Increasing the number N of magnetoresistance elements connected in series enables SNR to be improved.

A bias voltage applied to one magnetoresistance element is, for example, not less than 50 mV and not more than 150 mV. When N magnetoresistance elements are connected in series, the bias voltage becomes not less than 50 mV×N and not more than 150 mV×N. For example, when the number N of magnetoresistance elements connected in series is 25, the bias voltage becomes not less than 1 V and not more than 3.75 V.

When a value of the bias voltage is 1 V or more, design of electrical circuits handling the electrical signal obtained from the magnetoresistance elements is made easy, which is preferable practically.

When the bias voltage (inter-terminal voltage) exceeds 10 V, it is undesirable for electrical circuits handling the electrical signal obtained from the magnetoresistance elements. In the embodiment, the number N of magnetoresistance elements connected in series and the bias voltage are set to obtain a suitable voltage range.

For example, the voltage when a plurality of magnetoresistance elements are electrically connected in series is preferably not less than 1 V and not more than 10 V. For example, the voltage applied between terminals (between a terminal at one end and a terminal at the other end) of the plurality of magnetoresistance elements electrically connected in series is not less than 1 V and not more than 10 V.

Figure 33B:
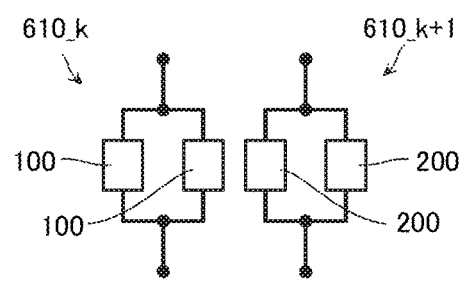

As indicated in FIG. 33B, in a current sensor according to another embodiment, it is possible, for example, to electrically connect the plurality of first magnetoresistance elements 100 in parallel to configure the measurement-dedicated magnetoresistance element 610-k (where k=1 to n), and electrically connect the plurality of second magnetoresistance elements 200 in parallel to configure the measurement-dedicated magnetoresistance element 610-k+1.

Figure 33C:
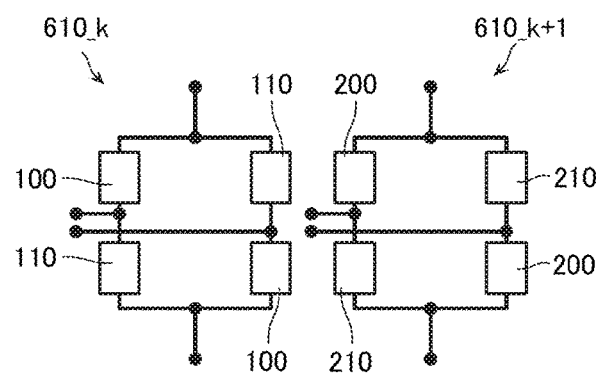

As indicated in FIG. 33C, in a current sensor according to another embodiment, it is possible, for example, to connect a plurality of first magnetoresistance elements 100 and magnetoresistance elements 110 having identical resistance values and showing reverse polarity to the first magnetoresistance elements so as to form a Wheatstone bridge circuit and thereby configure the measurement-dedicated magnetoresistance element 610-k (where k=1 to n), and to connect a plurality of second magnetoresistance elements 200 and magnetoresistance elements 210 having identical resistance values and showing reverse polarity to the second magnetoresistance elements so as to form a Wheatstone bridge circuit and thereby configure the measurement-dedicated magnetoresistance element 610-k+1. This makes it possible to perform temperature compensation of detection characteristics, for example.

Moreover, it is possible to adopt a fixed resistance having a resistance value identical to that of the first magnetoresistance element 100 in place of the previously mentioned magnetoresistance element 110, and to adopt a fixed resistance having a resistance value identical to that of the second magnetoresistance element 200 in place of the previously mentioned magnetoresistance element 210 (half Wheatstone bridge circuit).

Figure 33D:
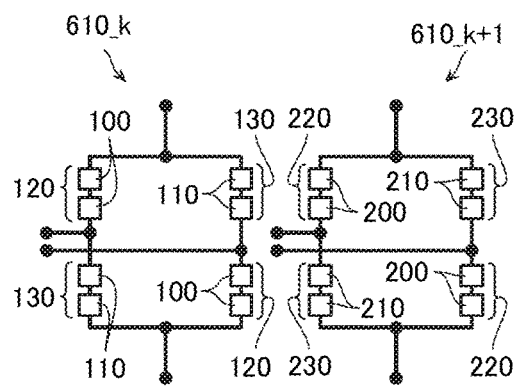

As indicated in FIG. 33D, in a current sensor according to another embodiment, it is possible, for example, to form a Wheatstone bridge circuit by a magnetoresistance element 120 having a plurality of the first magnetoresistance elements 100 connected in series therein and a magnetoresistance element 130 having the previously mentioned magnetoresistance elements 110 connected in series therein, and adopt this Wheatstone bridge circuit as the measurement-dedicated magnetoresistance element 610-k (where k=1 to n). In addition, it is possible to form a Wheatstone bridge circuit by a magnetoresistance element 220 having a plurality of the second magnetoresistance elements 200 connected in series therein and a magnetoresistance element 230 having the previously mentioned magnetoresistance elements 210 connected in series therein, and adopt this Wheatstone bridge circuit as the measurement-dedicated magnetoresistance element 610-k+1.

Moreover, it is possible to adopt a fixed resistance having a resistance value identical to that of the magnetoresistance element 120 in place of the previously mentioned magnetoresistance element 130, and to adopt a fixed resistance having a resistance value identical to that of the magnetoresistance element 220 in place of the previously mentioned magnetoresistance element 230 (half Wheatstone bridge circuit).

5. Fifth Embodiment

Next, a fifth embodiment will be described. In the present embodiment, the current sensors according to the above-described first through fourth embodiments are installed in a smart meter. A smart meter measures voltage and current. Now, voltage can be measured in a conventional semiconductor element. Therefore, the smart meter can be configured by adding this semiconductor element to the current sensor according to any of the above-described embodiments. Described below is an example where the current sensor 601 according to the fourth embodiment is applied to the smart meter, but a current sensor according to another embodiment may also be applied.

Figure 34A:
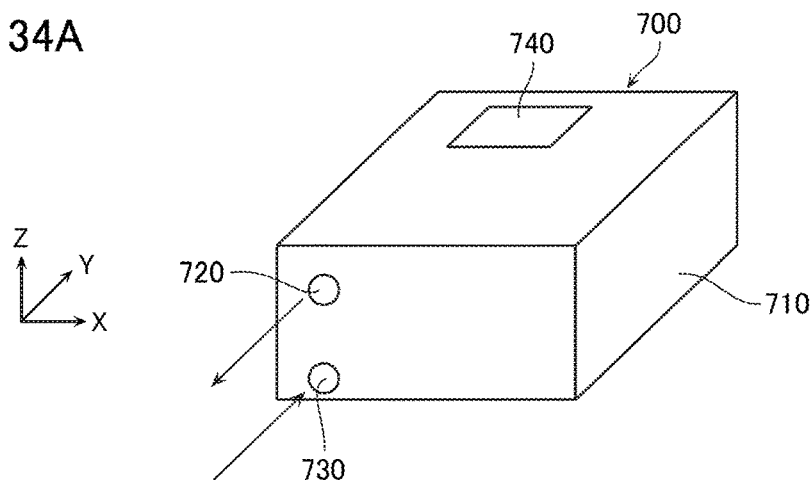
FIGS. 34A, 34B and 34C are schematic views showing a smart meter 700 according to a fifth embodiment.
Figure 34B:
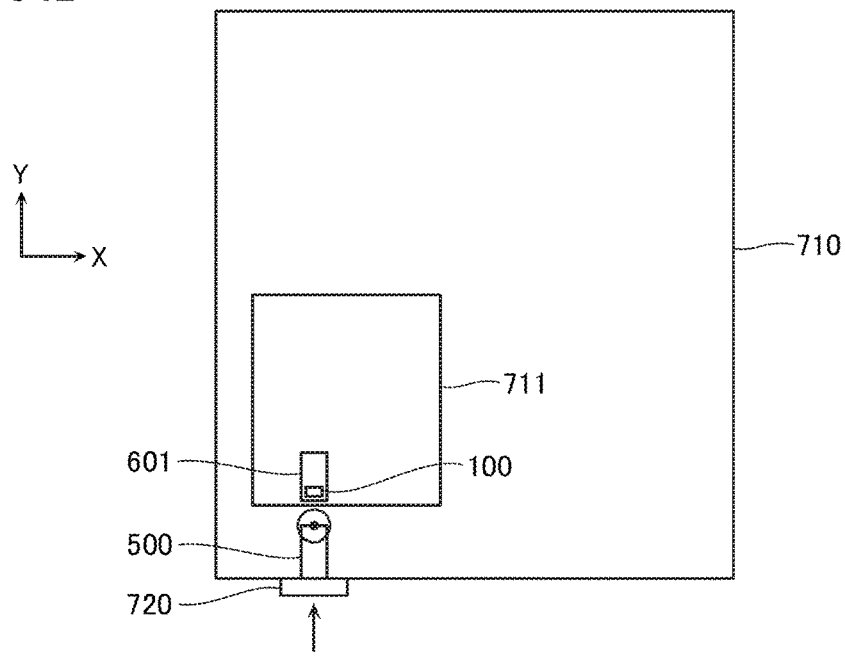
Figure 34C:
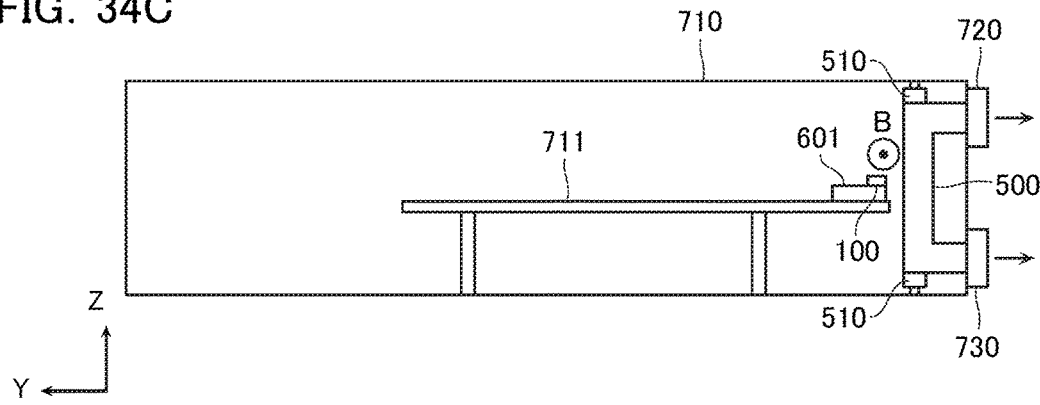

FIG. 34A is a schematic perspective view showing outer appearance of a smart meter 700 according to the present embodiment, FIG. 34B is a schematic plan view of the same smart meter 700, and FIG. 34C is a schematic side view of the same smart meter 700.

As shown in FIGS. 34A to 34C, the smart meter 700 comprises: a housing 710 for housing a sensor unit; and a first terminal unit 720, a second terminal unit 730, and a display unit 740 externally displaying electrical energy, that are provided in the housing 710. The housing 710 houses each of configurations of the smart meter 700 according to the present embodiment. The first terminal unit 720 and the second terminal unit 730 electrically connect each of configurations of the smart meter 700 and a measurement target via a probe not illustrated. The display unit 740 displays a result of measurement by the smart meter 700, and so on. Note that the various configurations of the smart meter housed in the housing 710 are called a current measuring module.

The smart meter 700 according to the present embodiment can be configured capable of measuring an alternating current and an alternating voltage of about 50 to 60 Hz, for example, but may be configured capable of measuring only a direct current and a direct voltage, for example. Moreover, FIGS. 34A, 34B and 34C shows an example where the smart meter 700 according to the present embodiment is capable of measuring a single-phase alternating current and voltage of about 100 to 200 V, but it may be configured capable of measuring a three-phase alternating current and voltage, for example. In this case, three pairs of the above-described terminal units 720 and 730 are provided.

As shown in FIG. 34B, the smart meter 700 houses the wiring line 500, an electronic substrate module 711, and the current sensor 601, in the housing 710. The wiring line 500 has one end connected to the first terminal unit 720 and the other end connected to the second terminal unit 730. Moreover, the wiring line 500 is disposed to allow the current-to-be-measured to flow in an up-down direction of the housing 710 (referred to below as Z direction), and is fixed to the housing 710 via an insulated current line fixing support portion 510 (FIG. 37C). The electronic substrate module 711 is fixed parallel to the bottom of the housing 710, in the housing 710. The current sensor 601 is fixed parallel to the bottom of the housing 710, on the electronic substrate module 711. Therefore, in the smart meter 700 according to the present embodiment, a positional relationship of the wiring line 500 and the current sensor 601 is fixed, hence the current-induced magnetic field from the current-to-be-measured can be suitably measured.

Figure 35A:
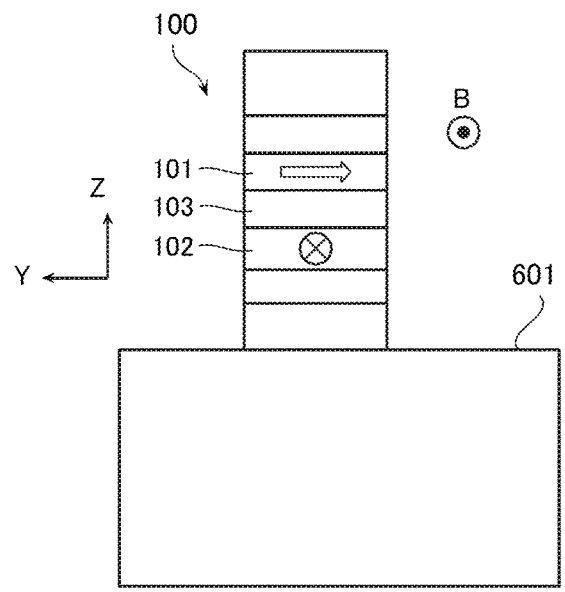
FIGS. 35A and 35B are schematic views showing a schematic configuration of part of the same smart meter.
Figure 35B:
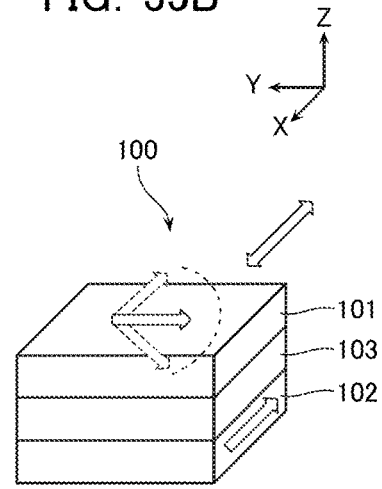

FIGS. 35A and 35B are schematic views for explaining a configuration of part of the same smart meter 700. As shown in FIGS. 35A and 35B, in the present embodiment, the direction of the current-induced magnetic field from the current-to-be-measured is a left-right direction of the housing 710 (referred to below as X direction). Moreover, the current sensor 601 comprises a first magnetoresistance element 100. The first magnetoresistance element 100 is configured similarly to the first magnetoresistance element 100 according to the first embodiment, for example, and comprises the first magnetic layer 101, the second magnetic layer 102, and the intermediate layer 103. An initial magnetization direction (magnetization direction when a current is not flowing in the wiring line 500) of the first magnetic layer 101 is a direction from the current sensor 601 toward the wiring line 500 or a reverse direction to that direction (referred to below as Y direction). This makes it possible to detect any polarity of current of an alternating current with good linearity.

The structure shown in FIGS. 35A and 35B makes it possible for magnetization alignment to be suitably performed and effects of external noise to be suitably reduced. That is, when an external magnetic field is applied from a surface of the current sensor 601 where external magnetic field noise is most easily applied, a magnetic field is applied in a direction (z direction) orthogonal to that surface (xy planar surface). However, the magnetization direction of the current sensor 601 (magnetization direction of the first magnetic layer 101) is parallel to that surface (xy planar surface), hence almost no noise is generated, even if a magnetic field in a direction (z direction) orthogonal to that surface is applied. This magnetization alignment makes it possible to reduce effects of an external magnetic field without adding unnecessary structure. Note that a magnetic shield may be provided in a cross-sectional direction of the current sensor 601. This magnetic shield has a smallest cross-sectional area in the current measuring module. Therefore, an increase in cost accompanying addition of the magnetic shield can also be suppressed to a minimum. Moreover, a substrate of the current sensor 601 can be attached to the electronic substrate module 711 as is, hence effects due to error in arrangement, and so on, can be reduced, and manufacturing costs required for maintaining accuracy of arrangement at a high level can be suppressed. Hence, the configuration of the kind shown in FIGS. 34A to 34C, 35A and 35B makes it possible for magnetization alignment of the current sensor 601 with the current-induced magnetic field due to the wiring line 500 to be suitably performed.

Furthermore, arranging as in FIGS. 34A and 34B makes it possible for a plurality of current sensors to be disposed on an identical substrate. Therefore, a reduction in manufacturing costs can be achieved.

Figure 36:
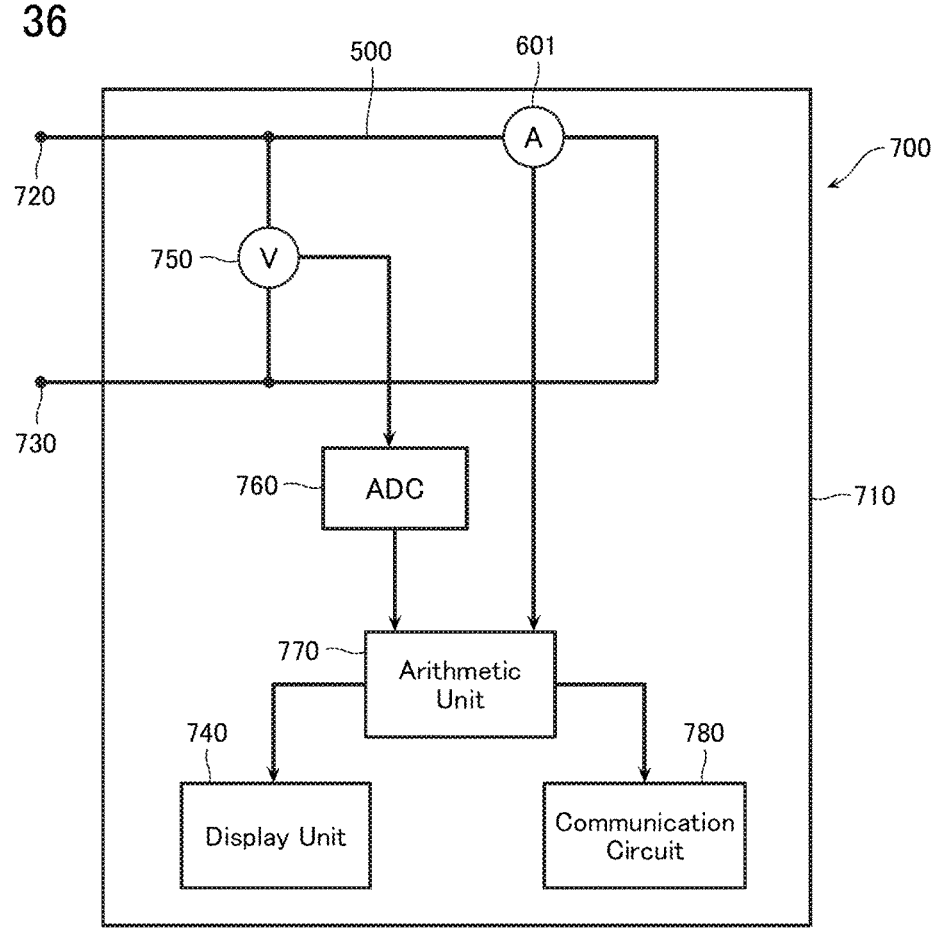
FIG. 36 is a functional block diagram showing a schematic configuration of the same smart meter 700.

FIG. 36 is a functional block diagram showing a schematic configuration of the smart meter 700. As shown in FIG. 36, in addition to the above-described wiring line 500 and current sensor 601, the smart meter 700 further comprises: a voltmeter 750; an A/D converter circuit 760; an arithmetic unit 770; and a communication circuit 780. Note that the voltmeter 750, the A/D converter circuit 760, the arithmetic unit 770, and the communication circuit 780 may also be fabricated on the electronic substrate module 711 as semiconductor elements.

The current sensor 601 is the current sensor 601 according to the fourth embodiment. However, the memory 680 or communication circuit 690 may be omitted. The current sensor 601 is disposed close to the wiring line 500 and measures a current flowing in the wiring line 500.

A variety of voltmeters may be applied as the voltmeter 750. The voltmeter 750 measures a voltage between the first terminal unit 720 and the second terminal unit 730. The A/D converter circuit 760 converts a voltage value measured by the voltmeter 750 into a digital signal.

The arithmetic unit 770 acquires a current value from the current sensor 601 and the voltage value from the A/D converter circuit 760, and performs a calculation of electric power, and so on. The display unit 740 acquires the current value, the voltage value, a magnitude of electric power, and so on, from the arithmetic unit 770, and displays these. The communication circuit 780 similarly acquires the current value, the voltage value, the magnitude of electric power, and so on, from the arithmetic unit 770, and outputs these to outside of the smart meter 700.

6. Sixth Embodiment

Figure 37A:
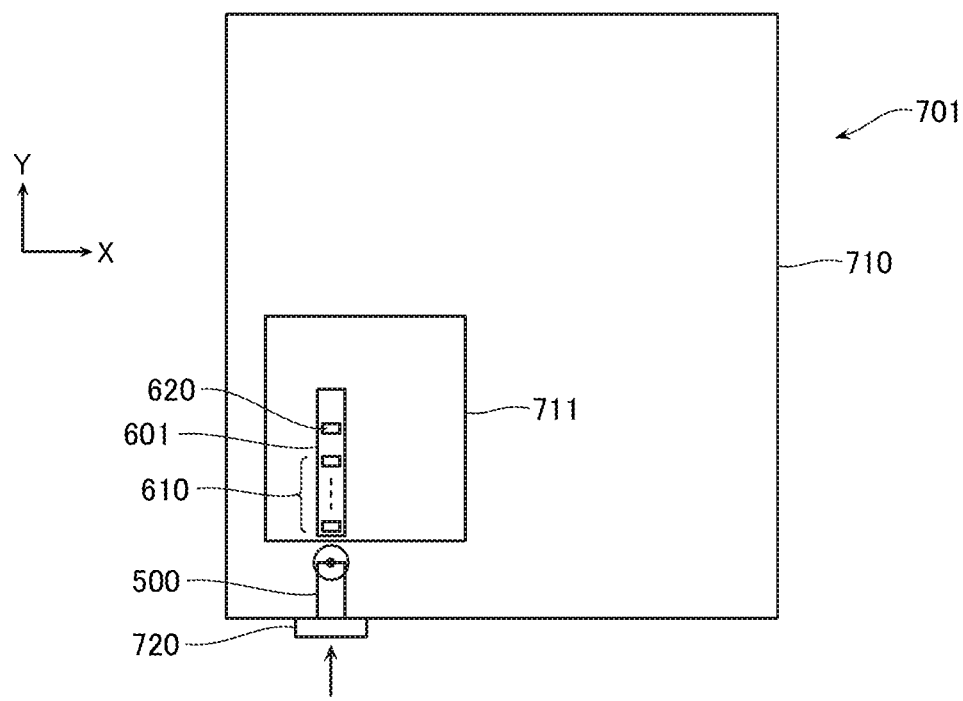
FIGS. 37A and 37B are schematic views showing a smart meter 701 according to a sixth embodiment.
Figure 37B:
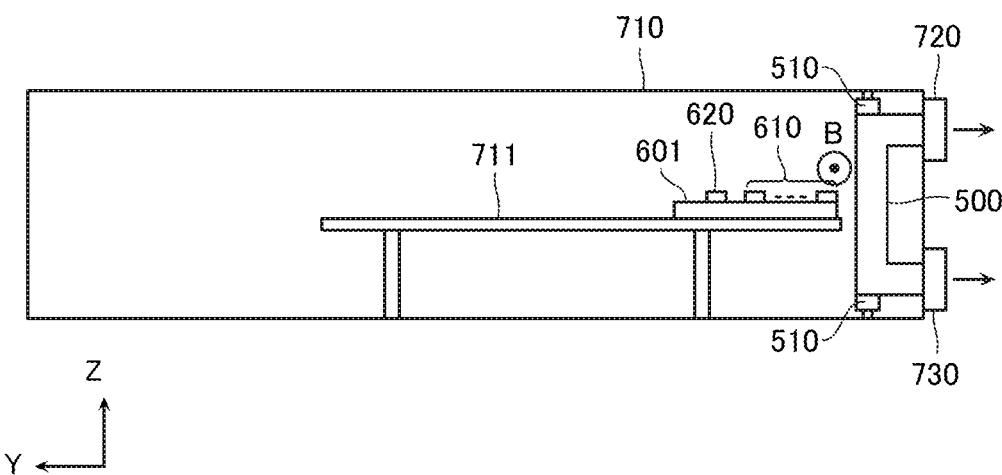

Next, a smart meter 701 according to a sixth embodiment will be described. FIG. 37A is a schematic plan view of the smart meter 701 according to the present embodiment, and FIG. 37B is a schematic side view of the same smart meter 701.

The smart meter 701 according to the present embodiment is basically configured similarly to the smart meter 700 according to the fifth embodiment, but differs from the fifth embodiment in arrangement of the magnetoresistance elements. That is, as shown in FIGS. 37A and 37B, in the present embodiment, the plurality of measurement-dedicated magnetoresistance elements 610 are disposed having different distances from the wiring line 500. Moreover, the reference magnetoresistance element 620 is disposed at a position even further from the wiring line 500 than the plurality of measurement-dedicated magnetoresistance elements 610.

In the smart meter 701 according to the present embodiment, magnitudes of the current-induced magnetic fields applied to the plurality of measurement-dedicated magnetoresistance elements 610 are all different, and the smaller the distance from the wiring line 500, the stronger the magnetic field applied. The smart meter 701 according to the present embodiment adjusts magnetic field sensitivity of the measurement-dedicated magnetoresistance elements 610 by such a method.

7. Seventh Embodiment

Figure 38:
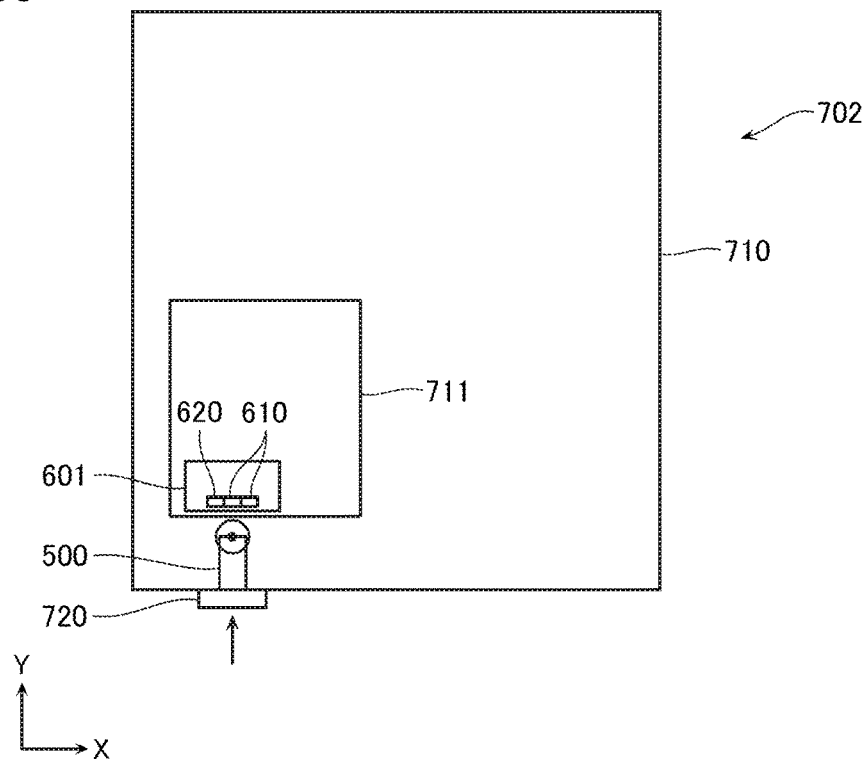
FIG. 38 is a schematic view showing a smart meter 702 according to a seventh embodiment.

Next, a smart meter 702 according to a seventh embodiment will be described. FIG. 38 is a schematic plan view of the smart meter 702 according to the present embodiment.

The smart meter 702 according to the present embodiment is basically configured similarly to the smart meter 700 according to the fifth embodiment, but differs from the fifth embodiment in arrangement of the magnetoresistance elements. That is, as shown in FIG. 38, in the present embodiment, the plurality of measurement-dedicated magnetoresistance elements 610 and the reference magnetoresistance element 620 are disposed at positions of substantially the same extent from the wiring line 500. Moreover, in the present embodiment, the magnetoresistance elements of the current sensor according to the first embodiment are adopted as the plurality of measurement-dedicated magnetoresistance elements 610 and the reference magnetoresistance element 620, and magnetic field sensitivities thereof are adjusted by the variety of linear response magnetic bodies described in the first embodiment.

Figure 39:
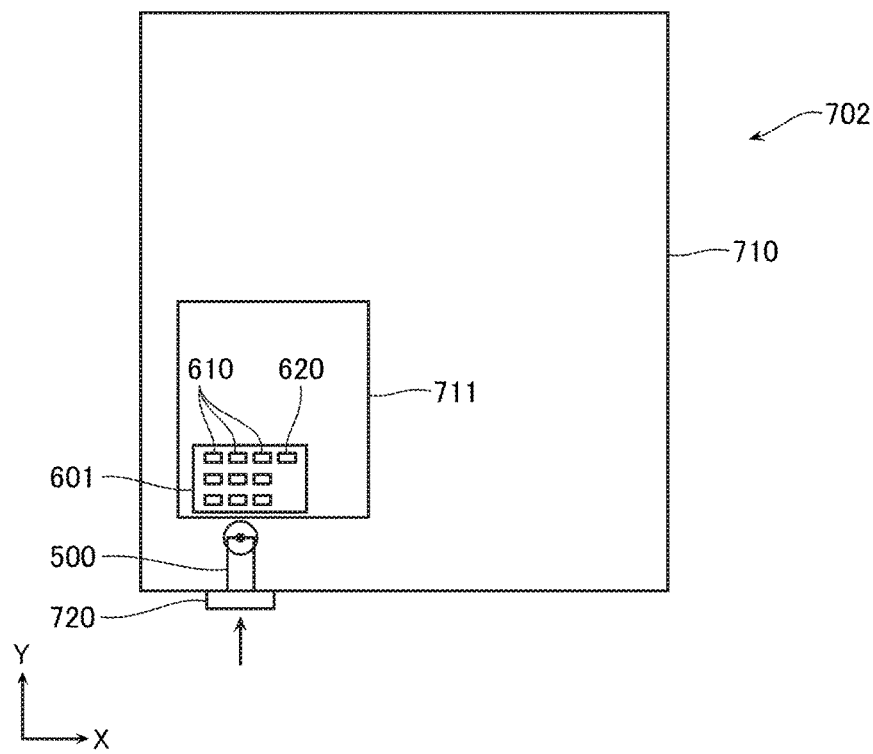
FIG. 39 is a schematic view showing another example of configuration of the same smart meter.

Note that, as shown in FIG. 39, the plurality of measurement-dedicated magnetoresistance elements 610 and the reference magnetoresistance element 620 can also be disposed in a matrix on the electronic substrate module 711. When the magnetoresistance elements are disposed in this way, adjustment of magnetic field sensitivity by a difference in distance from the wiring line 500 can be performed in addition to adjustment of magnetic field sensitivity by the linear response magnetic bodies, and so on, and it is made possible to measure an current-induced magnetic field of even wider range.

8. Eighth Embodiment

Figure 40A:
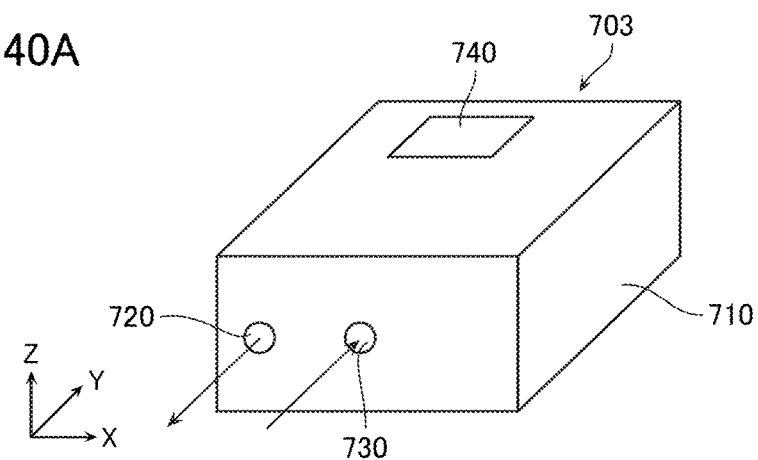
FIGS. 40A, 40B and 40C are schematic views showing a smart meter 703 according to an eighth embodiment.
Figure 40B:
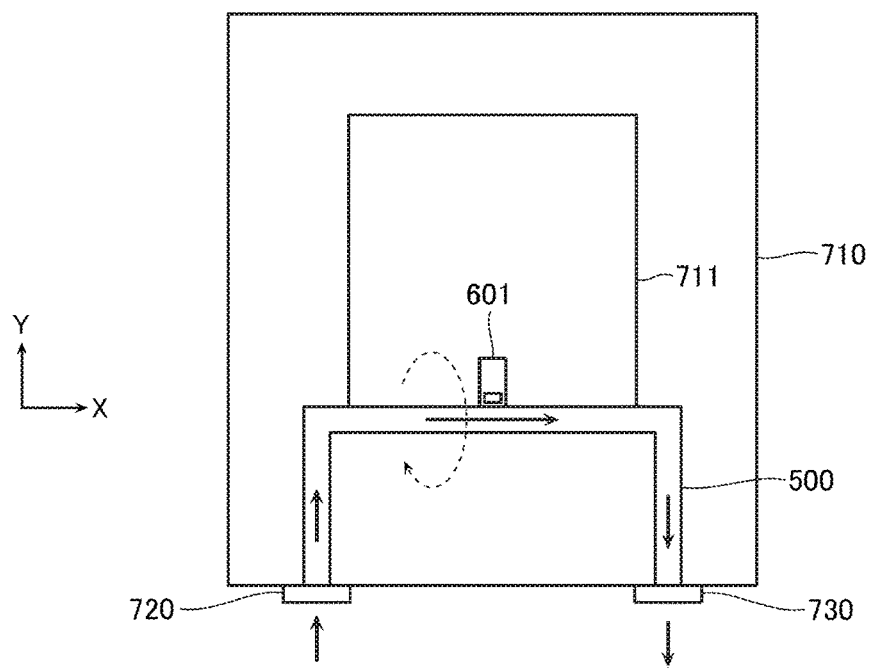
Figure 40C:
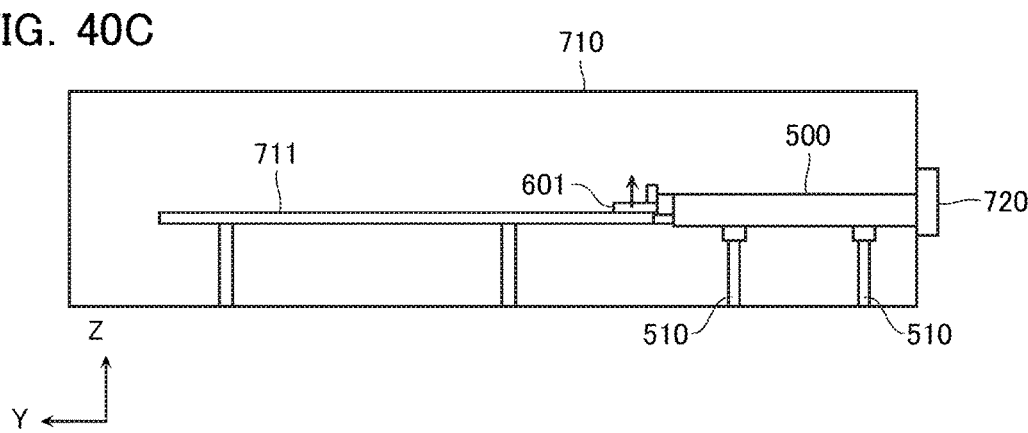
Figure 41A:
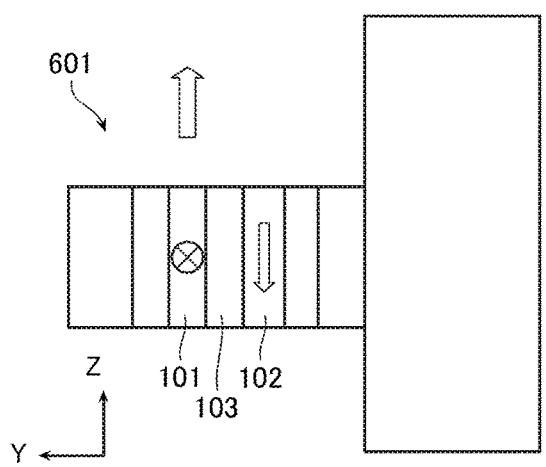
FIGS. 41A and 41B are schematic views showing a schematic configuration of part of the same smart meter 703.
Figure 41B:
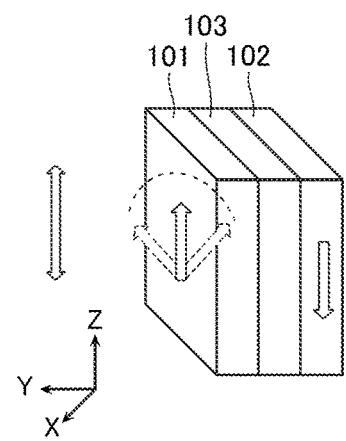

Next, a smart meter 703 according to an eighth embodiment will be described. FIG. 40A is a schematic perspective view showing outer appearance of the smart meter 703 according to the present embodiment, FIG. 40B is a schematic plan view of the same smart meter 703, and FIG. 40C is a schematic side view of the same smart meter 703. Moreover, FIGS. 41A and 41B are schematic views for explaining a configuration of part of the same smart meter 703.

The smart meter 703 according to the present embodiment is basically configured similarly to the smart meter 700 according to the fifth embodiment, but differs from the smart meter 700 according to the fifth embodiment in the following points.

That is, as shown in FIG. 40A, in the smart meter 703 according to the present embodiment, the first terminal unit 720 and the second terminal unit 730 are arranged in the X direction. Moreover, since the first terminal unit 720 and the second terminal unit 730 are arranged in the X direction, then, as shown in FIGS. 40B and 40C, the wiring line 500 is disposed to allow the current-to-be-measured to flow in the X direction of the housing 710. Furthermore, in this case, the direction of the current-induced magnetic field due to the current-to-be-measured is the Y direction of the housing 710. Therefore, as shown in FIGS. 41A and 41B, the current sensor 601 is fixed perpendicularly to the bottom of the housing 710, on the electronic substrate module 711.

9. Ninth Embodiment

Figure 42A:
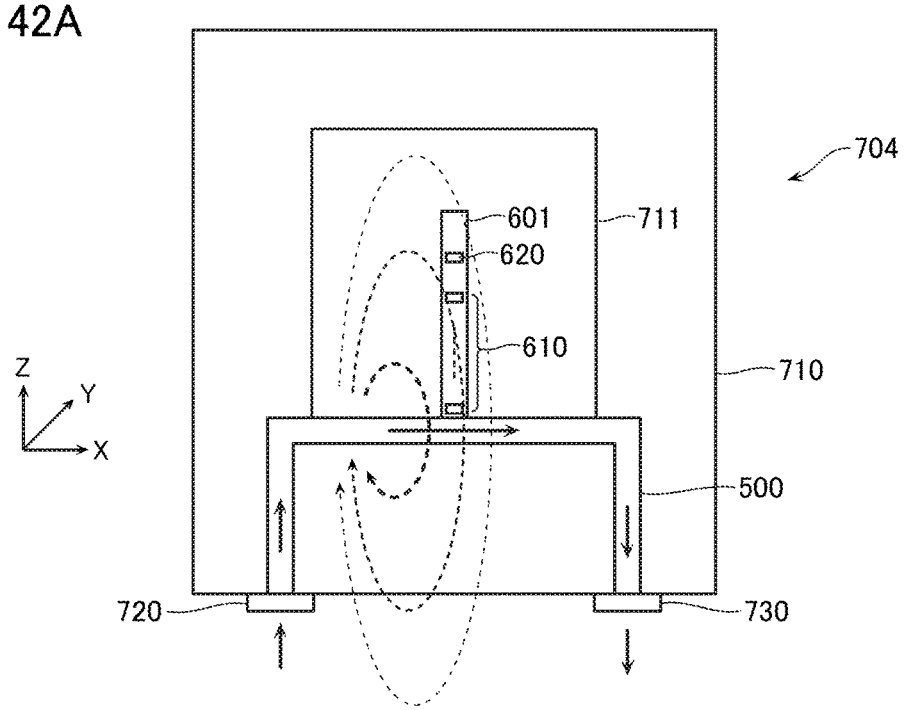
FIGS. 42A and 42B are schematic views showing a smart meter 704 according to a ninth embodiment.
Figure 42B:
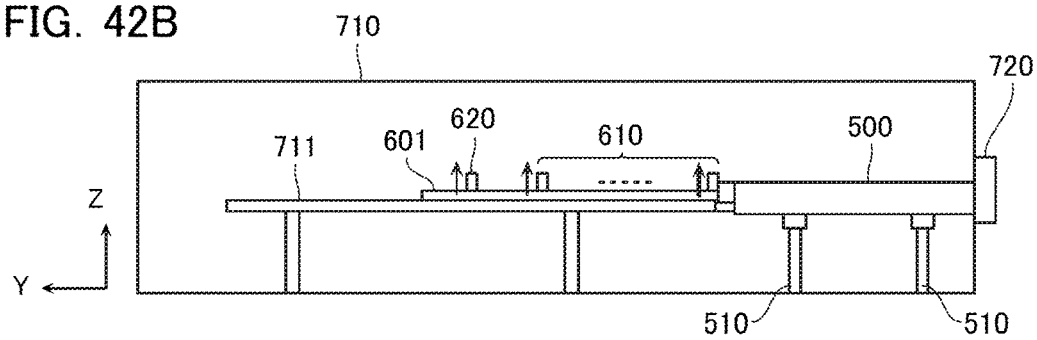

Next, a smart meter 704 according to a ninth embodiment will be described. FIG. 42A is a schematic plan view of the smart meter 704 according to the present embodiment, and FIG. 42B is a schematic side view of the same smart meter 704.

The smart meter 704 according to the present embodiment is basically configured similarly to the smart meter 703 according to the eighth embodiment, but differs from the eighth embodiment in arrangement of the magnetoresistance elements. That is, as shown in FIGS. 42A and 42B, in the present embodiment, the plurality of measurement-dedicated magnetoresistance elements 610 are disposed having different distances from the wiring line 500. Moreover, the reference magnetoresistance element 620 is disposed at a position even further from the wiring line 500 than the plurality of measurement-dedicated magnetoresistance elements 610.

In the smart meter 704 according to the present embodiment, magnitudes of the current-induced magnetic fields applied to the plurality of measurement-dedicated magnetoresistance elements 610 are all different, and the smaller the distance from the wiring line 500, the stronger the magnetic field applied. The smart meter 704 according to the present embodiment adjusts magnetic field sensitivity of the measurement-dedicated magnetoresistance elements 610 by such a method.

10. Tenth Embodiment

Figure 43:
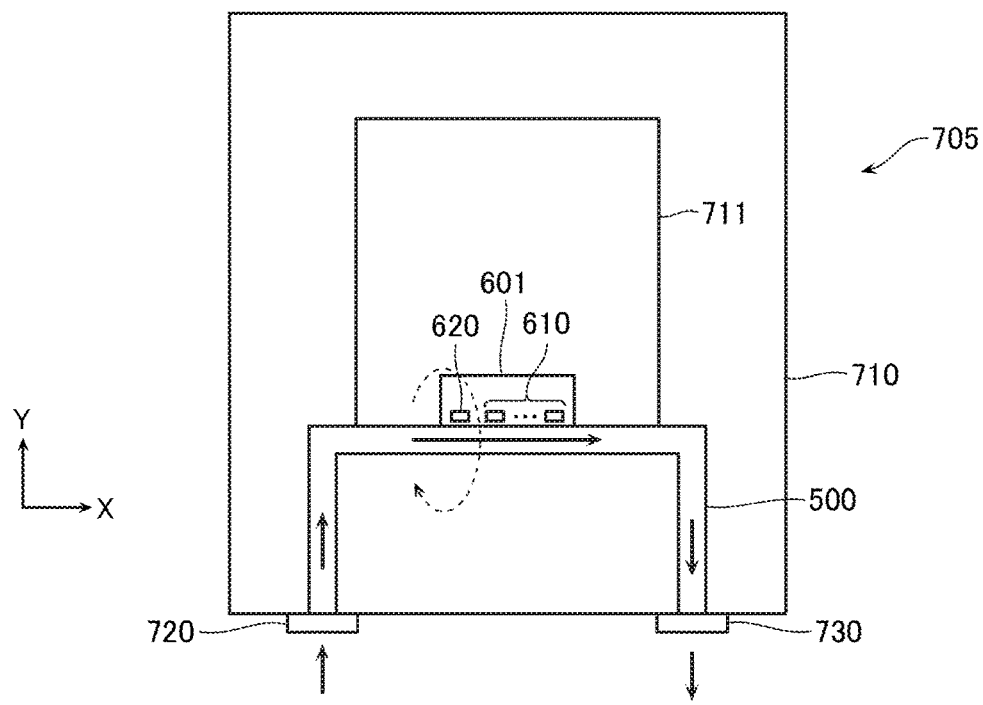
FIG. 43 is a schematic view showing a smart meter 705 according to a tenth embodiment.

Next, a smart meter 705 according to a tenth embodiment will be described. FIG. 43 is a schematic plan view of the smart meter 705 according to the present embodiment.

The smart meter 705 according to the present embodiment is basically configured similarly to the smart meter 703 according to the eighth embodiment, but differs from the eighth embodiment in arrangement of the magnetoresistance elements. That is, as shown in FIG. 43, in the present embodiment, the plurality of measurement-dedicated magnetoresistance elements 610 and the reference magnetoresistance element 620 are disposed at positions of substantially the same extent from the wiring line 500. Moreover, in the present embodiment, the magnetoresistance elements of the current sensor according to the first embodiment are adopted as the plurality of measurement-dedicated magnetoresistance elements 610 and the reference magnetoresistance element 620, and magnetic field sensitivities thereof are adjusted by the variety of linear response magnetic bodies described in the first embodiment.

Figure 44:
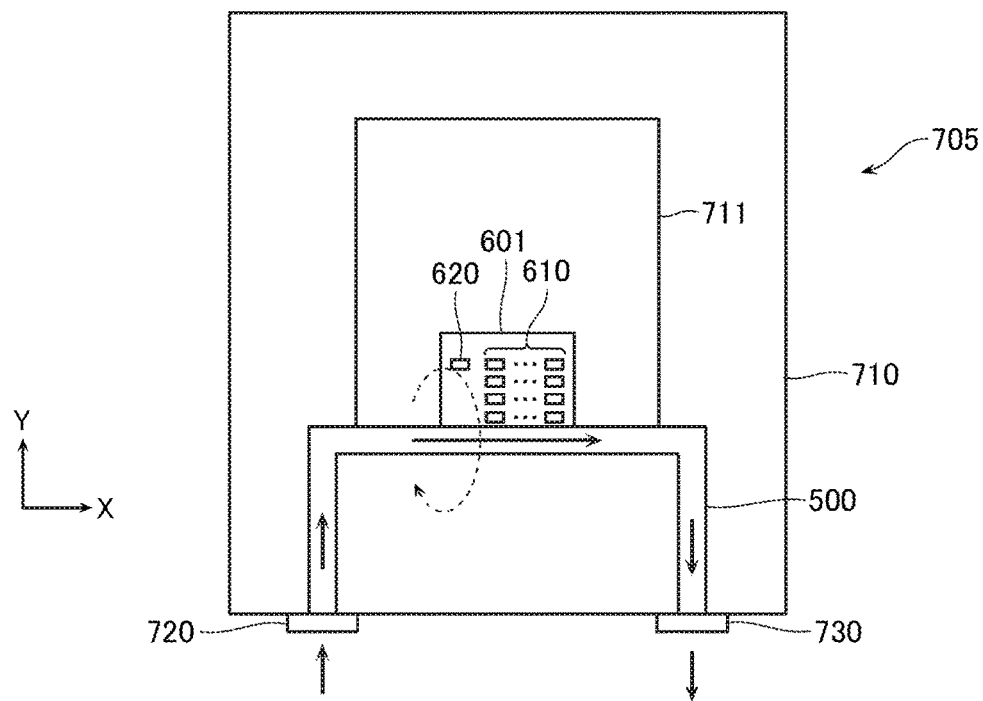
FIG. 44 is a schematic view showing another example of configuration of the same smart meter.

Note that, as shown in FIG. 44, the plurality of measurement-dedicated magnetoresistance elements 610 and the reference magnetoresistance element 620 can also be disposed in a matrix on the electronic substrate module 711. When the magnetoresistance elements are disposed in this way, adjustment of magnetic field sensitivity by a difference in distance from the wiring line 500 can be performed in addition to adjustment of magnetic field sensitivity by the linear response magnetic bodies, and so on, and it is made possible to measure an current-induced magnetic field of even wider range.

11. Eleventh Embodiment

Figure 45:
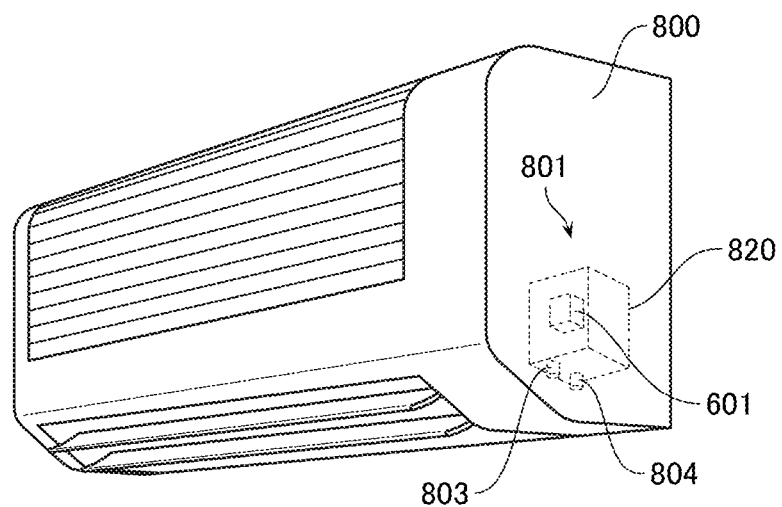
FIG. 45 is a schematic view showing appearance of a household electrical appliance according to an eleventh embodiment.

Next, an eleventh embodiment will be described. A current sensor according to the eleventh embodiment is installed in a household electrical appliance. This makes it possible also for a HEMS (Home Energy Management System) to be achieved. FIG. 45 is a schematic view showing appearance of the household electrical appliance according to the present embodiment. The current sensor can be installed in a variety of household electrical appliances, but FIG. 45 shows appearance when installed in an air conditioner 800.

The air conditioner 800 according to the present embodiment comprises a current measuring mechanism 801. The current measuring mechanism 801 houses the current sensor 601 according to the fourth embodiment, for example, in a housing 802. First and second terminal units 803 and 804 are provided on a side surface of the housing 802, and the current sensor 601 is connected to other components via these first and second terminal units.

12. Other Embodiments

Embodiments of the present invention are described above, but the present invention may be implemented also by the following kinds of modes.

[Mode 1]

A current sensor, comprising:

a plurality of magnetoresistance elements each of whose resistance value changes by application of an current-induced magnetic field from a current-to-be-measured; and a selection circuit that selects one magnetoresistance element from these plurality of magnetoresistance elements and outputs a signal (the resistance value) of the selected magnetoresistance element, in the plurality of magnetoresistance elements, relationships between a magnitude of the applied current-induced magnetic field and the resistance value being different from each other.

[Mode 2]

The current sensor according to mode 1, wherein the plurality of magnetoresistance elements includes magnetoresistance elements that differ from each other in an amount of increase or an amount of decrease of the resistance value with respect to a certain amount of increase of the current-induced magnetic field.

[Mode 3]

The current sensor according to mode 2, wherein the plurality of magnetoresistance elements includes magnetoresistance elements having saturation magnetic fields that differ from each other.

[Mode 4]

The current sensor according to mode 3, wherein the plurality of magnetoresistance elements each include a pair of hard magnetic bias films for applying a fixed bias magnetic field, and the plurality of magnetoresistance elements include magnetoresistance elements that differ from each other in a thickness of the hard magnetic bias film or a distance between the hard magnetic bias films.

[Mode 5]

The current sensor according to any of modes 1 to 4, wherein the plurality of magnetoresistance elements each comprise a magnetization free layer and a pin layer, and a magnetization direction of the pin layer of the plurality of magnetoresistance elements is parallel to a direction of the current-induced magnetic field from the current-to-be-measured.

[Mode 6]

The current sensor according to any of modes 1 to 5, wherein a magnetic flux guide having a trapezoidal shape is disposed at a portion adjacent to the plurality of magnetoresistance elements in the direction of the current-induced magnetic field due to the current-to-be-measured.

13. Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A sensor, comprising:

a first magnetoresistance element;

a second magnetoresistance element;

a third magnetoresistance element;

a first information output circuit connected to the third magnetoresistance element, outputting a first information in case that a magnitude of an output signal of the third magnetoresistance element is in a first range, and, outputting a second information in case that the magnitude of the output signal of the third magnetoresistance element is not in the first range;

a second information output circuit connected to the third magnetoresistance element, outputting a third information in case that the magnitude of the output signal of the third magnetoresistance element is in a second range, and, outputting a fourth information in case that the magnitude of the output signal of the third magnetoresistance element is not in the second range; and a signal output circuit connected to the first magnetoresistance element, the second magnetoresistance element and the third magnetoresistance element, and, outputting an output signal of the first magnetoresistance element in case that the first information and the third information are outputted, outputting an output signal of the second magnetoresistance element in case that the second information and the third information are outputted, and, outputting the output signal of the third magnetoresistance element in case that the second information and the fourth information are outputted.

2. The sensor according to claim 1, the first information output circuit outputting the first information in case that the magnitude of the output signal of the third magnetoresistance element is less than a first threshold value, and, outputting the second information in case that the magnitude of the output signal of the third magnetoresistance element is larger than the first threshold value, and the second information output circuit outputting the third information in case that the magnitude of the output signal of the third magnetoresistance element is less than a second threshold value, and, outputting the fourth information in case that the magnitude of the output signal of the third magnetoresistance element is larger than the second threshold value.

3. The sensor according to claim 1,
the first information output circuit outputting the first information in case that the magnitude of the output signal of the third magnetoresistance element is larger than a third threshold value, and, outputting the second information in case that the magnitude of the output signal of the third magnetoresistance element is less than the third threshold value, and
the second information output circuit outputting the third information in case that the magnitude of the output signal of the third magnetoresistance element is larger than a fourth threshold value, and, outputting the fourth information in case that the magnitude of the output signal of the third magnetoresistance element is less than the fourth threshold value.

4. The sensor according to claim 1,
the first information output circuit outputting the first information in case that the magnitude of the output signal of the third magnetoresistance element is less than a first threshold value and larger than a third threshold value, outputting the second information in case that the magnitude of the output signal of the third magnetoresistance element is larger than the first threshold value, and, outputting the second information in case that the magnitude of the output signal of the third magnetoresistance element is less than the third threshold value, and
the second information output circuit outputting the third information in case that the magnitude of the output signal of the third magnetoresistance element is less than a second threshold value and larger than a fourth threshold value, outputting the fourth information in case that the magnitude of the output signal of the third magnetoresistance element is larger than the second threshold value, and, outputting the second information in case that the magnitude of the output signal of the third magnetoresistance element is less than the fourth threshold value.

5. The sensor according to claim 1,
the first magnetoresistance element having a first measurement range,
the second magnetoresistance element having a second measurement range broader than the first measurement range, and
the third magnetoresistance element having a third measurement range broader than the second measurement range.

6. The sensor according to claim 5,
the second measurement range including the first measurement range, and
the third measurement range including the second measurement range.

7. A current measuring module, comprising:
an electronic substrate module on which a wiring line, a first magnetoresistance element, a second magnetoresistance element and a third magnetoresistance element are disposed;
a first information output circuit connected to the third magnetoresistance element, outputting a first information in case that a magnitude of an output signal of the third magnetoresistance element is in a first range, and, outputting a second information in case that the mag-
nitude of the output signal of the third magnetoresistance element is not in the first range;
a second information output circuit connected to the third magnetoresistance element, outputting a third information in case that the magnitude of the output signal of the third magnetoresistance element is in a second range, and, outputting a fourth information in case that the magnitude of the output signal of the third magnetoresistance element is not in the second range; and
a signal output circuit connected to the first magnetoresistance element, the second magnetoresistance element and the third magnetoresistance element, and, outputting an output signal of the first magnetoresistance element in case that the first information and the third information are outputted, outputting an output signal of the second magnetoresistance element in case that the second information and the third information are outputted, and, outputting the output signal of the third magnetoresistance element in case that the second information and the fourth information are outputted.

8. The current measuring module according to claim 7,
the first information output circuit outputting the first information in case that the magnitude of the output signal of the third magnetoresistance element is less than a first threshold value, and, outputting the second information in case that the magnitude of the output signal of the third magnetoresistance element is larger than the first threshold value, and
the second information output circuit outputting the third information in case that the magnitude of the output signal of the third magnetoresistance element is less than a second threshold value, and, outputting the fourth information in case that the magnitude of the output signal of the third magnetoresistance element is larger than the second threshold value.

9. The current measuring module according to claim 7,
the first information output circuit outputting the first information in case that the magnitude of the output signal of the third magnetoresistance element is larger than a third threshold value, and, outputting the second information in case that the magnitude of the output signal of the third magnetoresistance element is less than the third threshold value, and
the second information output circuit outputting the third information in case that the magnitude of the output signal of the third magnetoresistance element is larger than a fourth threshold value, and, outputting the fourth information in case that the magnitude of the output signal of the third magnetoresistance element is less than the fourth threshold value.

10. The current measuring module according to claim 7,
the first information output circuit outputting the first information in case that the magnitude of the output signal of the third magnetoresistance element is less than a first threshold value and larger than a third threshold value, outputting the second information in case that the magnitude of the output signal of the third magnetoresistance element is larger than the first threshold value, and, outputting the second information in case that the magnitude of the output signal of the third magnetoresistance element is less than the third threshold value, and
the second information output circuit outputting the third information in case that the magnitude of the output signal of the third magnetoresistance element is less than a second threshold value and larger than a fourth threshold value, outputting the fourth information in case that the magnitude of the output signal of the third magnetoresistance element is larger than the second threshold value, and, outputting the second information in case that the magnitude of the output signal of the third magnetoresistance element is less than the fourth threshold value.

11. The current measuring module according to claim 7, the first magnetoresistance element having a first measurement range, the second magnetoresistance element having a second measurement range broader than the first measurement range, and the third magnetoresistance element having a third measurement range broader than the second measurement range.

12. The current measuring module according to claim 11, the second measurement range including the first measurement range, and the third measurement range including the second measurement range.

* * * * *